(12) United States Patent  (10) Patent No.: US 8,143,653 B2
Cho et al.  (45) Date of Patent: Mar. 27, 2012

(54) VARIABLE RESISTANCE MEMORY DEVICE AND SYSTEM THEREOF

(75) Inventors: Woo-Yeong Cho, Suwon-si (KR);
Jong-Soo Seo, Hwaseong-si (KR);
Young-Kug Moon, Suwon-si (KR);
Jun-Soo Bae, Hwaseong-si (KR);
Kwang-Jin Lee, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 86 days.

(21) Appl. No.: 12/619,016

(22) Filed: Nov. 16, 2009

(65) Prior Publication Data

US 2010/0118593 A1     May 13, 2010

Related U.S. Application Data

(63) Continuation-in-part of application No. 11/317,292, filed on Dec. 27, 2005, now Pat. No. 7,633,100.

(30) Foreign Application Priority Data

Aug. 10, 2005  (KR) .................. 10-2005-0073414

(51) Int. Cl.
*H01L 29/66* (2006.01)
(52) U.S. Cl. ..... 257/260; 365/148; 365/163; 365/210.1; 365/230.03; 365/211
(58) Field of Classification Search .................. 257/260; 365/148, 163, 210.1, 230.03, 211
See application file for complete search history.

(56) References Cited

U.S. PATENT DOCUMENTS

| | | | |
|---|---|---|---|
| 4,404,660 | A | 9/1983 | Menachem |
| 5,751,012 | A | 5/1998 | Wolstenholme et al. |
| 6,982,913 | B2 | 1/2006 | Oh et al. |
| 7,123,535 | B2 | 10/2006 | Kurotsuchi et al. |
| 7,215,592 | B2 | 5/2007 | Cho et al. |
| 7,242,605 | B2 | 7/2007 | Choi et al. |
| 7,315,469 | B2 | 1/2008 | Choi et al. |
| 7,489,552 | B2 | 2/2009 | Kurotsuchi et al. |

(Continued)

FOREIGN PATENT DOCUMENTS

CN  1624803 A  6/2005

(Continued)

OTHER PUBLICATIONS

F. Bedeschi et al., "Set and Reset Pulse Characterization in BJT-Selected Phase-Change Memories", IEEE, Aug. 2005, pp. 1270-1273.

(Continued)

*Primary Examiner* — Bradley K Smith
*Assistant Examiner* — Jami M Valentine
(74) *Attorney, Agent, or Firm* — Volentine & Whitt, PLLC

(57) ABSTRACT

A phase-change random access memory device is provided. The phase-change random access memory device includes a global bit line connected to a write circuit and a read circuit, multiple local bit lines, each being connected to multiple phase-change memory cells, and multiple column select transistors selectively connecting the global bit line with each of the multiple local bit lines, each column select transistor having a resistance that varies depending on its distance from the write circuit and the read circuit.

8 Claims, 47 Drawing Sheets

U.S. PATENT DOCUMENTS

| | | | |
|---|---|---|---|
| 2003/0117120 A1* | 6/2003 | Amazeen | 323/313 |
| 2003/0223292 A1 | 12/2003 | Nejad et al. | |
| 2004/0062074 A1* | 4/2004 | Ooishi | 365/158 |
| 2004/0188714 A1 | 9/2004 | Scheuerlein et al. | |
| 2004/0246808 A1 | 12/2004 | Cho et al. | |
| 2005/0117397 A1 | 6/2005 | Morimoto | |
| 2007/0236987 A1 | 10/2007 | Cho et al. | |
| 2008/0123389 A1 | 5/2008 | Cho et al. | |
| 2008/0168304 A1 | 7/2008 | Flynn et al. | |
| 2008/0256183 A1 | 10/2008 | Flynn et al. | |
| 2008/0256292 A1 | 10/2008 | Flynn et al. | |
| 2010/0027326 A1 | 2/2010 | Kim et al. | |

FOREIGN PATENT DOCUMENTS

| | | |
|---|---|---|
| EP | 1326258 A2 | 7/2003 |
| EP | 1548744 A1 | 6/2005 |
| JP | 9213077 | 8/1997 |
| JP | 2001160289 | 6/2001 |

OTHER PUBLICATIONS

Office Action, Corresponding Chinese Patent Application No. 200610132286.4 (May 17, 2010).

\* cited by examiner

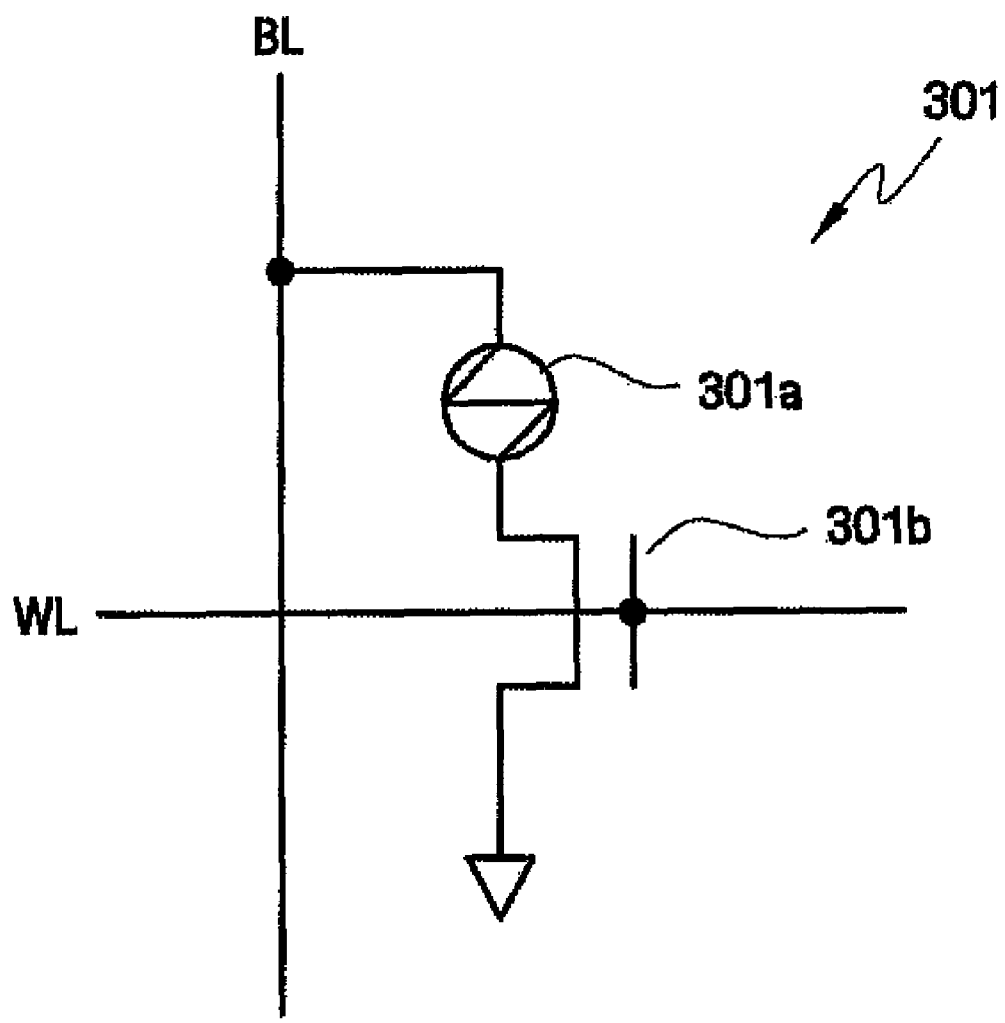

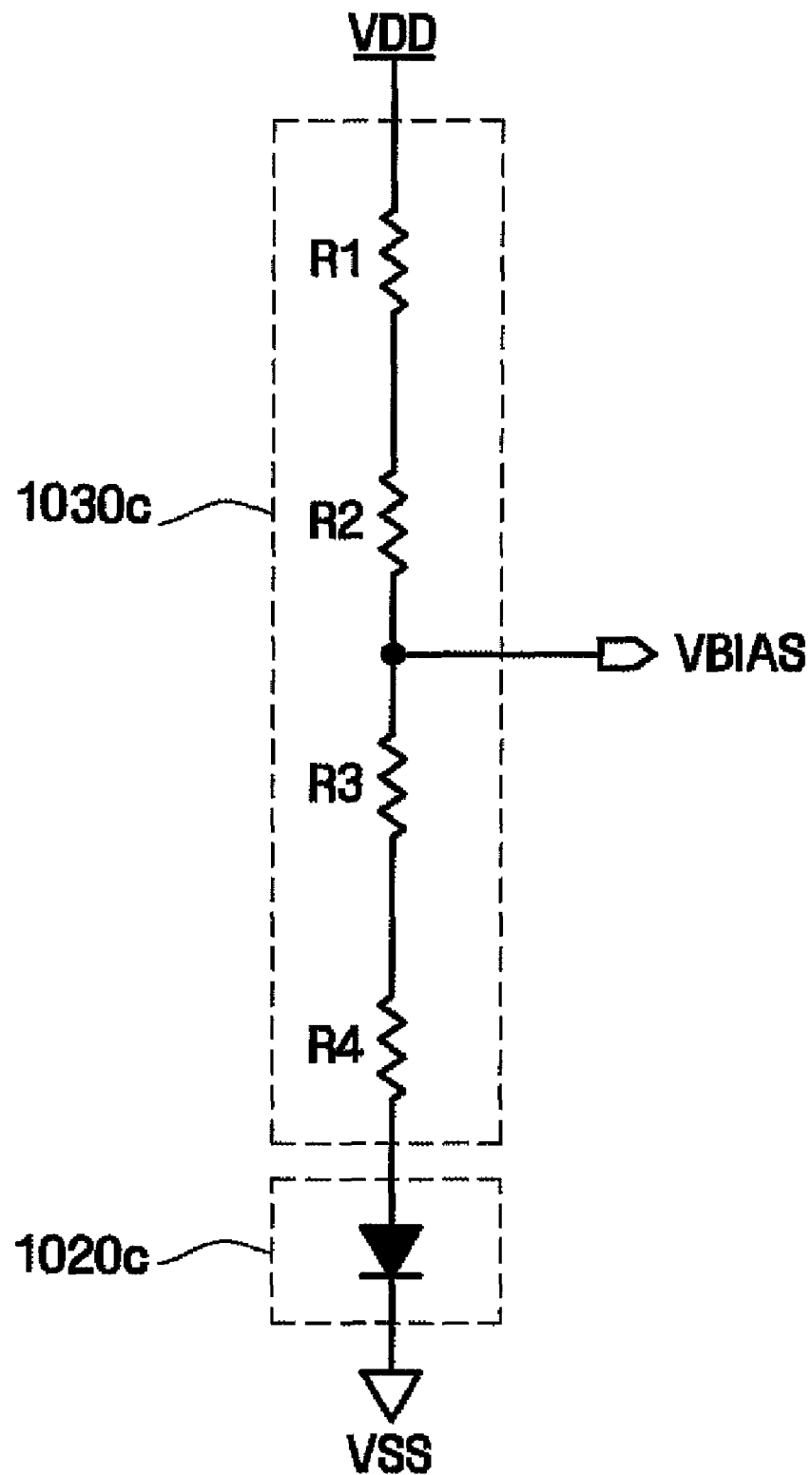

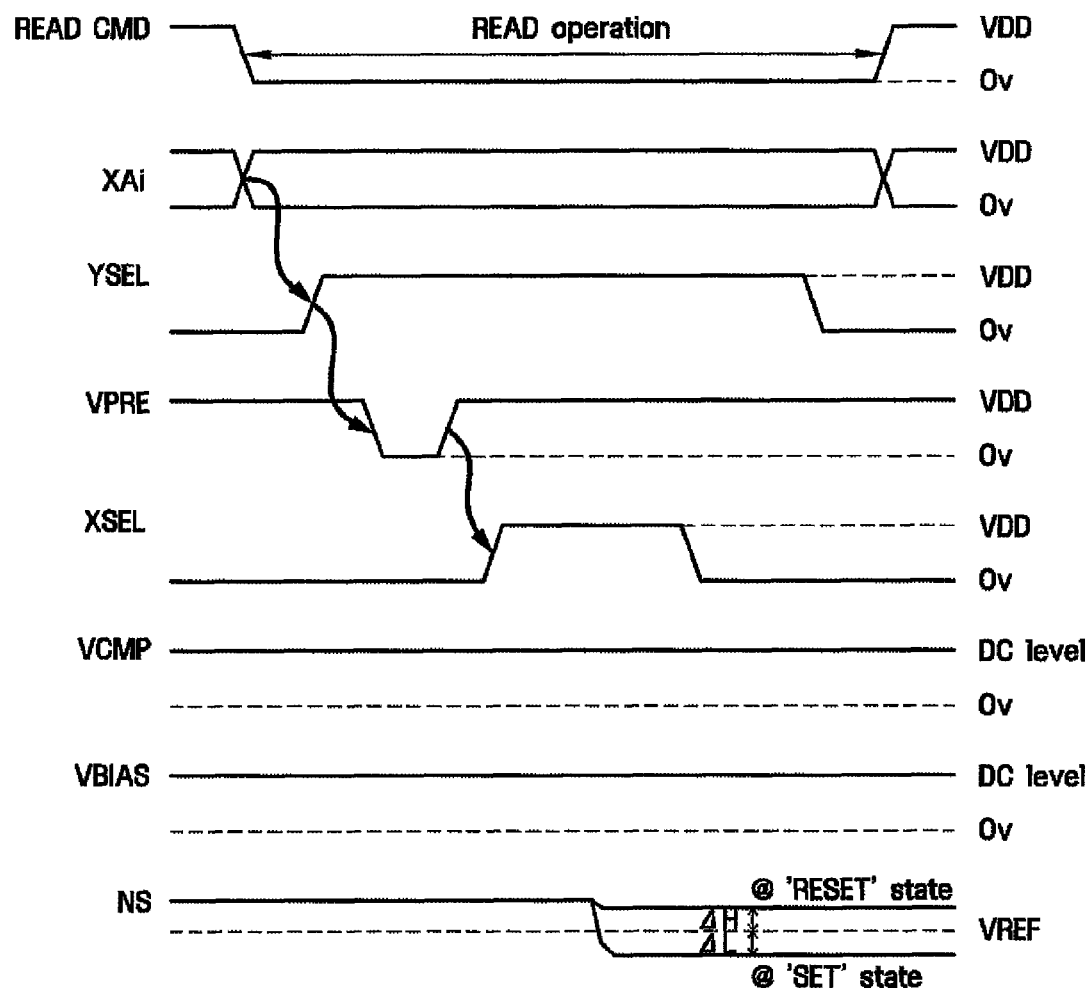

VARIABLE RESISTANCE MEMORY DEVICE AND SYSTEM THEREOF

PRIORITY STATEMENT

This application is a continuation-in-part application of U.S. application Ser. No. 11/317,292, filed Dec. 27, 2005 now U.S. Pat. No. 7,633,100, which claims priority from Korean Patent Application No. 10-2005-0073414, filed Aug. 10, 2005, in the Korean Intellectual Property Office, the disclosures of which are hereby incorporated by reference in their entirety.

BACKGROUND

Phase change random access memories (PRAMS) are nonvolatile memory devices that store data using a phase change material, e.g., Ge—Sb—Te (GST). The phase change material, which exhibits different resistive values depending on the crystalline or amorphous phase thereof, is programmed by thermal treatment to set the phase of the material.

The phase-change material of the PRAM exhibits a relatively low resistance in its crystalline state, and a relatively high resistance in its amorphous state. In conventional nomenclature, the low-resistance crystalline state is referred to as a 'set' state and is designated logic "0", while the high-resistance amorphous state is referred to as a 'reset' state and is designated logic "1".

The terms "crystalline" and "amorphous" are relative terms in the context of phase-change materials. That is, when a phase-change memory cell is said to be in its crystalline state, one skilled in the art will understand that the phase-change material of the cell has a more well-ordered crystalline structure when compared to its amorphous state. A phase-change memory cell in its crystalline state need not be fully crystalline, and a phase-change memory cell in its amorphous state need not be fully amorphous.

Generally, the phase-change material of a PRAM is reset to an amorphous state by joule heating of the material in excess of its melting point temperature for a relatively short period of time. On the other hand, the phase-change material is set to a crystalline state by heating the material below its melting point temperature for a longer period of time. In each case, the material is allowed to cool to its original temperature after the heat treatment. Generally, however, the cooling occurs much more rapidly when the phase-change material is reset to its amorphous state.

In a read operation, a given read current is provided to a selected memory cell, and the "1" or "0" resistive state of the memory cell is discriminated using a sense amplifier based on a voltage of the cell.

In order to increase the capacity and integration density of phase change memory devices, the phase-change memory devices may be implemented as a hierarchical bit line structure having a global bit line and a plurality of local bit lines. In this case, there is a difference in physical length between phase-change memory cells coupled to local bit lines located farther away from a write circuit and/or a read circuit and phase-change memory cells coupled to local bit lines located near the write circuit and/or read circuit. Thus, noting that a parasitic resistance is present in a global bit line, the resistance of a path extending from a write circuit and/or a read circuit to a selected memory cell varies depending on the position of the selected phase-change memory cell.

Thus, due to the resistance variations, a smaller amount of write or read current is applied to a phase-change memory cell coupled to a local bit line located farther from a write and/or read circuit than a phase-change memory cell coupled to a local bit line located closer to the write and/or read circuit. These variations in read and/or write currents can result in read and/or write failures.

SUMMARY

According to an aspect of the present invention, there is provided a phase-change random access memory device including a global bit line connected to a write circuit and a read circuit; a plurality of local bit lines, each local bit line being connected to a plurality of phase-change memory cells; and a plurality of column select transistors selectively connecting the global bit line with each of the plurality of local bit lines, each column select transistor having a resistance that varies depending on distance from the write circuit and the read circuit.

According to another aspect of the present invention, there is provided a phase-change random access memory device including a plurality of memory blocks, each memory block having multiple phase-change memory cells; a global bit line connected to a write circuit and a read circuit, and extending in one direction such that the global bit line is shared by the plurality of memory blocks; a plurality of local bit lines, each of which extends in the one direction and is connected to a plurality of phase-change memory cells; and a plurality of column select transistors selectively coupling the global bit line with each of the plurality of local bit lines, each column select transistor corresponding to a memory block having a resistance that varies depending on a distance between the write circuit and the read circuit, and the memory block.

According to still another aspect of the present invention, there is provided a phase-change random access memory device including a plurality of memory blocks clustered into at least two groups, each memory block having multiple phase-change memory cells; a global bit line connected to a write circuit and a read circuit, and extending in one direction such that the global bit line is shared by the plurality of memory blocks; a plurality of local bit lines, each of which extends in the one direction and is connected to a plurality of phase-change memory cells; and a plurality of column select transistors selectively coupling the global bit line with each of the plurality of local bit lines, each column select transistor corresponding to a memory group having a resistance that varies depending on a distance between the write circuit and the read circuit, and the memory group.

BRIEF DESCRIPTION OF THE DRAWINGS

The above and other features and advantages of the present invention will become readily apparent from the following description of the embodiments with reference to the accompanying drawings, in which:

FIG. 8B is a circuit diagram of a phase-change memory cell in the phase-change random access memory device according to the fourth embodiment of the present invention.

FIG. 9A through 9K is diagrams of the phase-change random access memory device according to the embodiments of the present invention.

DETAILED DESCRIPTION OF EMBODIMENTS

Figure 1:
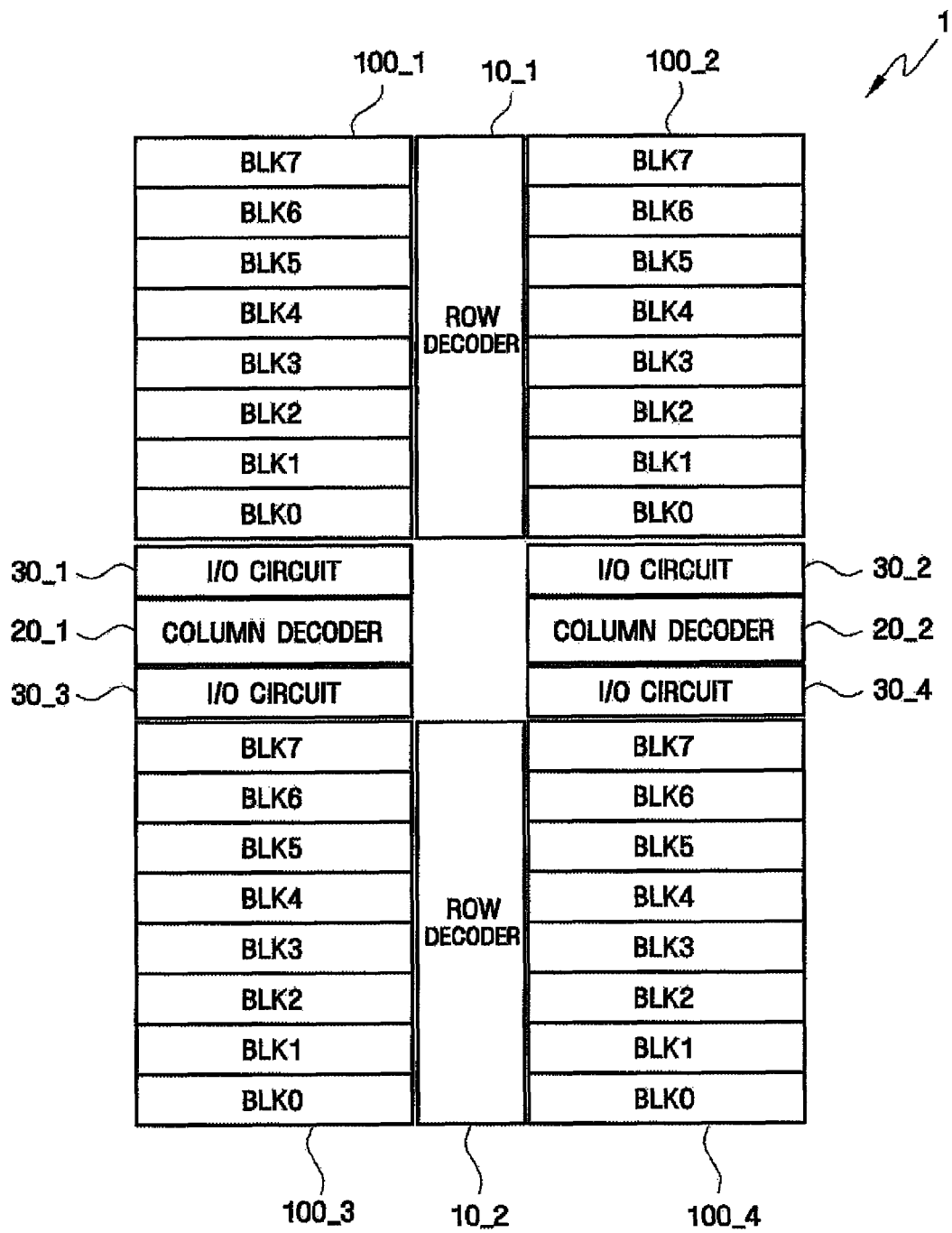
FIGS. 1 and 2 are a block diagram and a circuit diagram of a phase-change random access memory device according to a first embodiment of the present invention.

Advantages and features of the present invention and methods of accomplishing the same may be understood more readily by reference to the following detailed description of embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art. Like reference numerals refer to like elements throughout the specification.

In the following description, the terms "and/or" comprises each and at least one combination of referenced items.

The present invention will now be described more fully with reference to the accompanying drawings, in which various embodiments of the invention are shown.

Figure 2:
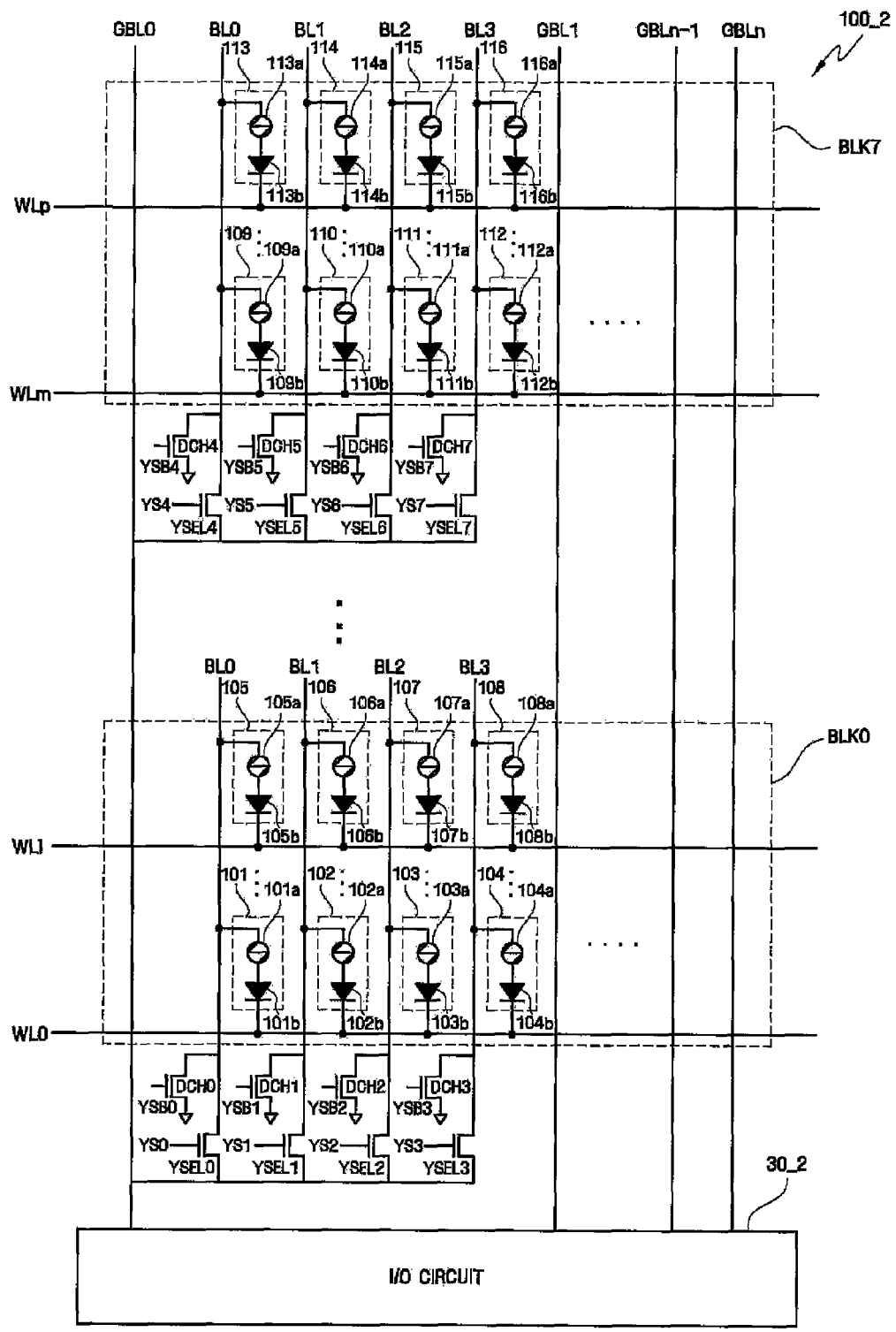

FIGS. 1 and 2 are a block diagram and a circuit diagram of a phase-change random access memory device according to a first embodiment of the present invention. In various embodiments of the present invention, a phase-change random access memory device having 4 memory banks is described by way of example, but the invention is not limited thereto.

Referring to FIG. 1, a phase-change random access memory device 1 includes first through fourth memory banks 100_1 through 100_4, row decoders 10_1 and 10_2, column decoders 20_1 and 20_2, and input/output (I/O) circuits 30_1 through 30_4.

Each of the first through fourth memory banks 100_1 through 100_4 include a plurality of phase-change memory cells arranged in a matrix form and a plurality of memory blocks BLKi (i is 0 through 7). Although in the above description each of the memory banks 100_1 through 100_4 includes 8 memory blocks BLKi, it may contain a different number of memory blocks.

The row decoders 10_1 and 10_2 are respectively arranged corresponding to two memory banks 100_1 and 100_2, and 100_3 and 100_4, to designate row addresses in the first through fourth memory banks 100_1 through 100_4. For example, the row decoder 10_1 may select row addresses in the first and second memory banks 100_1 and 100_2.

The column decoders 20_1 and 20_2 are respectively arranged corresponding to two memory banks 100_1 and 100_3, and 100_2 and 100_4, to designate column addresses in the first through fourth memory banks 100_1 through 100_4. For example, the column decoder 20_1 can select column addresses in the first and third memory banks 100_1 and 100_3.

The I/O circuits 30_1 through 30_4 are arranged corresponding to the respective memory banks 100_1 through 100_4 and write and/or read data to and/or from the appropriate memory banks 30_1 through 30_4. Although not shown in FIG. 1, each of the I/O circuits 30_1 through 30_4 may include a write circuit and/or a read circuit. The configuration of the I/O circuit 30_1 through 30_4 will be described in detail later with reference to FIGS. 3 and 5.

Referring to FIG. 2, the memory bank 100_2 includes a plurality of memory blocks BLKi (i is 0 through 7), a plurality of global bit lines GBLj (j is 0 through n) and a plurality of local bit lines BL0 through BL3, column select transistors YSELk (k is 0 through 7), and discharge transistors DCHk (k is 0 through 7).

The plurality of memory blocks BLKi include a plurality of phase-change memory cells 101 through 116 disposed at positions where a plurality of word lines WL0, WL1, WLm, and WLp and a plurality of bit lines intersect. In particular, the bit lines are arranged to form a hierarchical structure containing the plurality of global bit lines GBLj and the plurality of local bit lines BL0 through BL3. In more detail, the plurality of global bit lines GBLj are connected to the I/O circuit 30_2 and extend in one direction to be shared by the plurality of memory blocks BLKi. The plurality of local bit lines BL0 through BL3 are selectively connected to each of the global bit lines GBLj through the column select transistors YSELk while being coupled to the plurality of phase-change memory cells 101 through 116.

For example, when 8M memory bank 100_2 includes eight 1M memory blocks BLKi, a number 8K of word lines extend perpendicular to one direction while 256 global bit lines GBLj extend in the one direction so that they are shared by the plurality of memory blocks BLKi. Four local bit lines BL0 through BL3 are connected to each of the 256 global bit lines GBLj for each memory block BLKi, and 1K phase-change memory cells are coupled to each of the four local bit lines BL0 through BL3.

The plurality of memory cells 101 through 116 respectively include variable resistors 101a through 116a including a phase-change material having different first and second resistances depending on its state (amorphous or crystalline) and control elements 101b through 116b controlling current flowing through the variable resistors 101a through 116a. Each of the variable resistors 101a through 116a is connected between each of the local bit lines BL0 through BL3 and corresponding one of the control elements 101b through 116b. Each of the control elements 101b through 116b includes a diode having an anode coupled to a corresponding one of the variable resistors 101a through 116a and a cathode coupled to one of the word lines WL0, WLI, WLm, and WLp. The positions of the variable resistors 101a through 116a and the control elements 101b through 116b may be changed depending on the type of application. The phase-change material may be a binary (two-element) compound such as GaSb, InSb, InSe, $Sb_2Te_3$, or GeTe, a ternary (three-element) compound such as GeSbTe, GaSeTe, InSbTe, $SnSb_2Te_4$, or InSbGe, or a quaternary (four-element) compound such as AgInSbTe, (GeSn)SbTe, GeSb(SeTe), or $Te_{81}Ge_{15}Sb_{2}S_{2}$ $Te_{81}Ge_{15}Sb_2S_2$. The most commonly used phase-change material is GeSbTe.

The column select transistors YSELk(k is 0 through 7) selectively connect each of the global bit lines GBLj with the local bit lines BL0 through BL3 in response to column select signals YSi (i is 0 through 7). The column select signal YSi is turned on by a decoded signal of a corresponding column address and block information.

In particular, the resistance of each of the column select transistors YSELk (k is 0 through 7) varies depending on its distance from the I/O circuit 30_2. The resistance of column select transistors YSELk (k=4~7) located farther from the I/O circuit 30_2 is less than that of column select transistors YSELk (k=0~3) located closer to the I/O circuit 30_2. For example, the resistance of the plurality of column select transistors YSELk (k=0~3) corresponding to the first memory block BLK0 is greater than that of the plurality of column select transistors YSELk (k=4~7) corresponding to the eighth memory block BLK7. By adjusting the amount of resistance in this way, the amount of write current and read current passing through the column select transistors YSELk (k=4~7) located farther from the I/O circuit 30_2 can be made substantially equal to the amount of write current and read current flowing through the column select transistors YSELk (k=0~3) located closer to the I/O circuit 30_2. This will later be described in detail with reference to FIGS. 3 through 6.

Various methods may be used to decrease the resistance of the column select transistors YSELk (k=4~7) located farther from the I/O circuit 30_2. For example, the column select transistors YSELk (k=4~7) located farther from the I/O circuit 30_2 may be made larger than those located closer thereto. This is achieved by increasing the W/L ratio (width (W) to length (L)) of channel regions of the column select transistors YSELk (k=4~7), which is possible by increasing the width of the channel regions or reducing the length thereof. However, because the channel region formed by a photo process mostly has a minimum length, increasing the W/L can mainly be achieved by increasing the width of the channel region. Another approach to decreasing the resistance of the column select transistors YSELk (k=0~7) is to reduce a threshold voltage by increasing the concentration of impurities doped into a channel region thereof. For example, the concentration of impurities doped into channel regions of the column select transistors YSELk (k=4~0.7) located farther from the I/O circuit 30_2 is made higher than that of impurities doped into channel regions of the column select transistors YSELk (k=0~3) located closer thereto.

Each of the discharge transistors DCHi (0~7) are disposed between each of the plurality of local bit lines BL0 through BL3 and a ground voltage, and each discharges a voltage applied to the appropriate local bit line in response to a corresponding one of complementary column select signals YSBi (i=0~7) both before and after write or read operation. Thus, the discharge transistors DCHi (i=0.7) are turned on when the column select transistors YSELk (k=0~7) are turned off.

Figure 3:
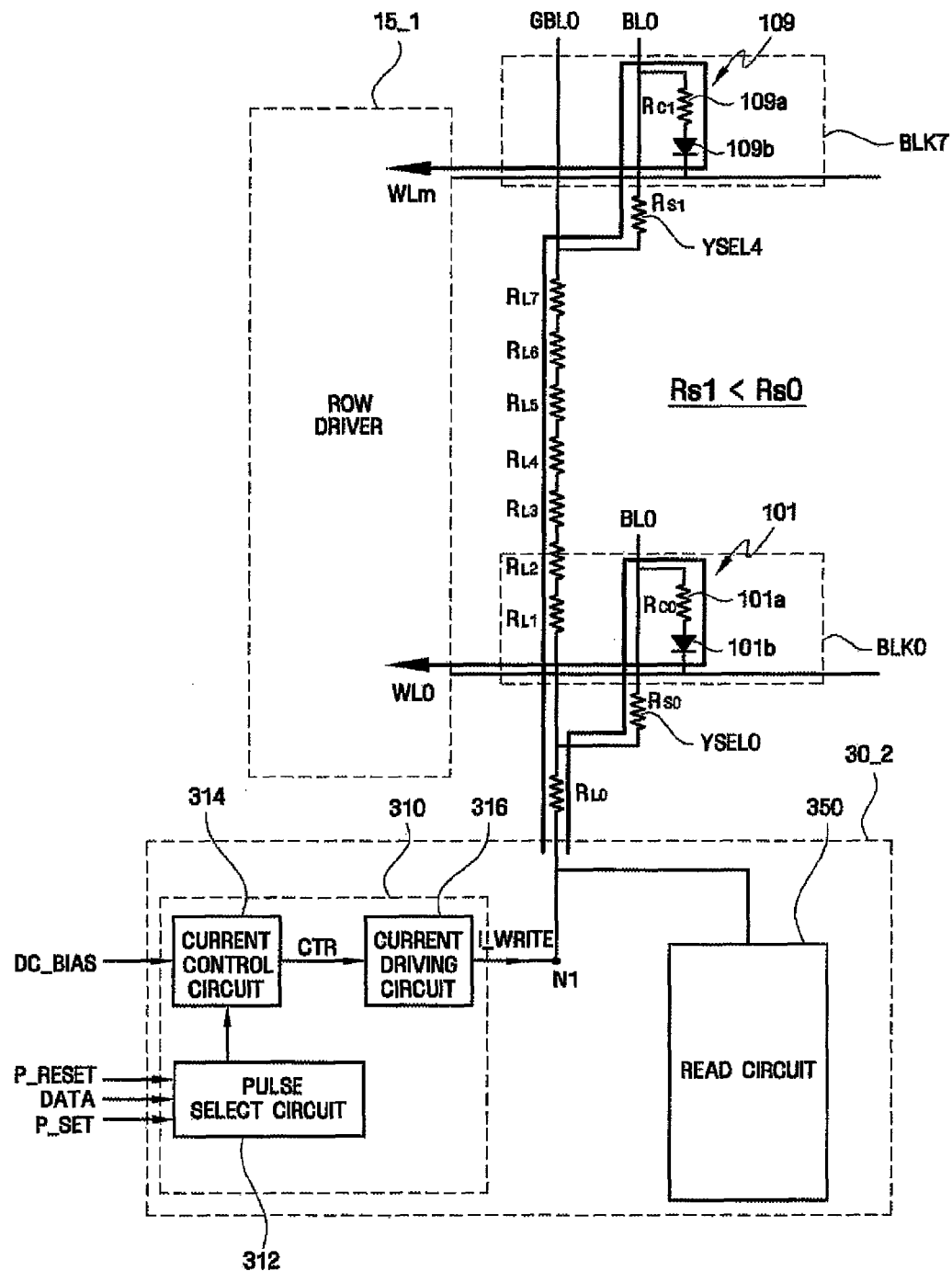
FIG. 3 is a circuit diagram for explaining a write operation of a phase-change random access memory device according to an embodiment of the present invention.
Figure 4:
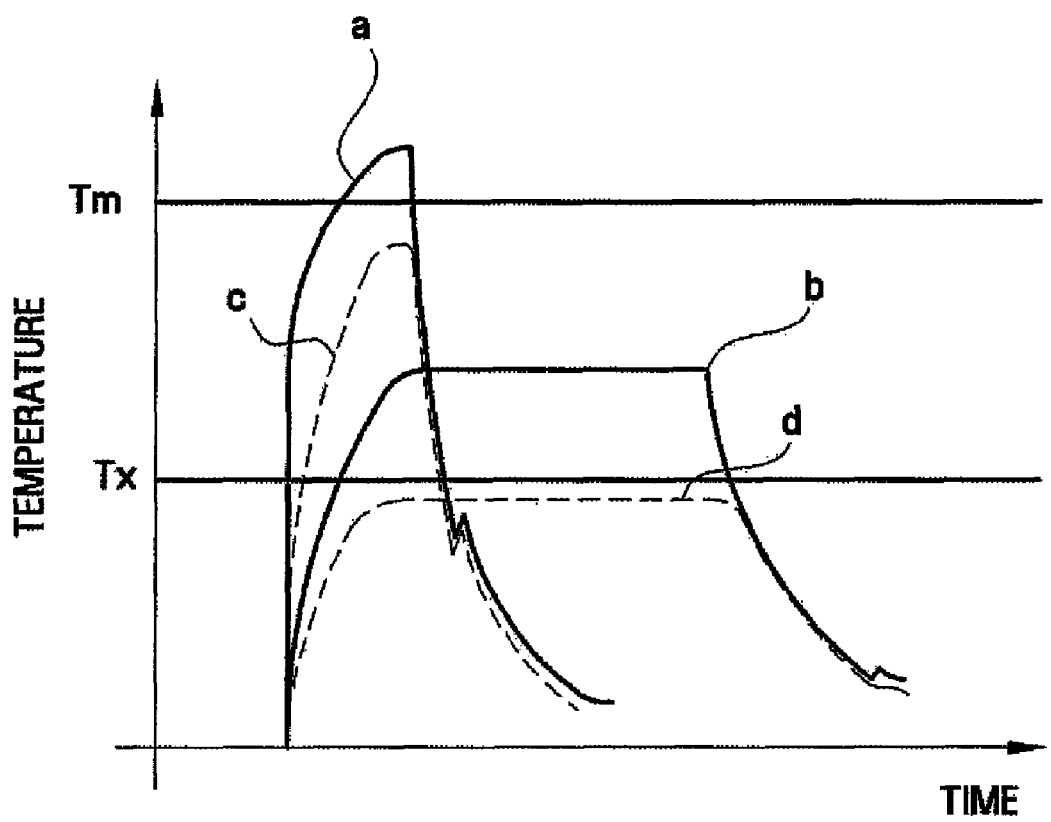
FIG. 4 is a diagram for explaining a condition for inducing a phase transition of a phase-change material of a phase-change memory cell.

FIG. 3 is a circuit diagram for explaining a write operation of a phase-change random access memory device according to an embodiment of the present invention, and FIG. 4 is a diagram for explaining a condition for inducing a phase transition of a phase-change material of a phase-change memory cell. For convenience of explanation, FIG. 3 shows only phase-change memory cells 101 and 109 in the first and eighth memory blocks BLK0 and BLK7, respectively, among the phase-change memory cells in the first through eighth memory blocks BLK0 through BLK7. The parasitic resistance of a global bit line GBL0 is indicated on the global bit line GBL0 ($R_{L1}$~$R_{L7}$), and column select transistor YSEL0 and YSEL4 and variable resistors 101a and 109a are indicated by predetermined resistances ($R_{S0}$, $R_{S1}$ and $R_{C0}$, $R_{C1}$, respectively).

Referring to FIGS. 3 and 4, a word line WL0 or WLm is selected by a row driver 15_1 and a local bit line BL0 is selected by a column decoder (not shown) to select a phase-change memory cell 101 or 109 to be written to. In particular, when a diode is used as the control element 101b or 109b, the selected word line WL0 or WLm is driven low, causing the diode to turn on.

Data are written to the phase memory cells 101 and 109 using Joule heat generated by providing write current I_WRITE to the variable resistors 101a and 109a containing phase-change materials. More specifically, a phase-change material is heated above its melting temperature Tm by a current flowing through the phase-change material and then rapidly cooled, so that it goes into the amorphous state, i.e., logic level "1" (See curve a in FIG. 4). The phase-change material is then heated to a temperature between crystallization temperature Tx and melting temperature Tm for a predetermined period of time and cooled, so that the phase-change material goes into the crystalline state, i.e., logical level "0" (See curve b in FIG. 4). Thus, it is important to provide a considerably precise amount of write current I_WRITE for a predetermined period of time in order to induce a phase transition of the phase-change material. For example, write current I_WRITE of about 1 mA and of about 0.6 to 0.7 mA may be provided for reset operation and set operation, respectively.

The write current I_WRITE may be provided through a write circuit 310. In the following description, the write circuit 310 is more fully described in, for example, Korean Patent Application No. 2004/0246808, which is hereby incorporated by reference as if fully set forth herein.

Referring to FIG. 3, the write circuit 310 includes a pulse select circuit 312, a current control circuit 314, and a current driving circuit 316. The pulse select circuit 312 selectively sends reset pulse P_RESET or set pulse P_SET to the current control circuit 314 for writing logical level 1 or 0 to a selected phase-change memory cell 101 or 109. More specifically, the pulse select circuit 312 delivers a reset pulse P_RESET or set pulse P_SET input to the current control circuit 314 according to the logic level of data DATA, and then delivers data DATA whose transmission was delayed to the current control circuit 314. Here, the reset pulse P_RESET or set pulse P_SET is a current pulse, and the reset pulse P_RESET has an enable interval shorter than the set pulse P_SET.

The current control circuit 314 controls the amount of current to be supplied to the current driving circuit 316 during an enable interval of the reset pulse P_RESET or set pulse P_SET. More specifically, a bias voltage DC_BIAS having a predetermined voltage level is applied to the current control circuit 314 to ensure stable operation of the current control circuit 314. When the logic level of data DATA provided by the pulse select circuit 312 is at a first level, a control signal CTR having a second level is output during an enable interval of the reset pulse P_RESET. On the other hand, when the logic level of data DATA is at a second level, a control signal CTR having a first level is output during an enable interval of the set pulse P_SET. The current driving circuit 316 outputs write current I_WRITE to a selected phase-change memory cell through an output node N1 in response to the control signal CTR during the enable interval of the reset pulse P_RESET or set pulse P_SET. The current driving circuit 316 also discharges the output node N1 during a disable interval of reset pulse P_RESET or set pulse P_SET.

However, even if the write circuit 310 provides a predetermined amount of write current I_WRITE through this process, data DATA may be stored incorrectly as the distance between a selected phase-change memory cell 101 or 109 and the write circuit 310 increases, because of differences in physical length between the phase-change memory cell 101 within the first memory block BLK0 located closer to the write circuit 310 and the phase change memory cell 109 within the eighth memory block BLK7 located farther from the write circuit 310.

More specifically, because parasitic resistance is present in the global bit line GBL0, the resistance of a path extending from the write circuit 310 to the selected memory cell 101 or 109 varies depending on the position of the selected phase-change memory cell 101 or 109. That is, the phase-change memory cells 101 and 109 have a resistance difference corresponding to the difference in physical distance from the write circuit 310. The resistance of a path between the write circuit 310 and the phase-change memory cell 101 within the first memory block BLK0 is $R_{L0}R_{S0}+R_{C0}$, while the resistance of a path between the write circuit 310 and the phase-change memory cell 109 within the eighth memory block BLK7 is $R_{Li}$ (i is 0 through 7)+$R_{S1}$+$R_{C1}$. $R_{L0}$ through $R_{L7}$ are the resistances of the global bit line GBL0, $R_{S0}$ and $R_{S1}$ are the resistances of the column select transistors YSEL0 and YSEL4, and $R_{C0}$ and $R_{C1}$ are the resistances of phase change materials of the variable resistors 101a and 109a, respectively.

Thus, the amount of write current I-WRITE$_0$ (not shown) reaching the phase-change memory cell 101 within the first memory block BLK0 is different from that of write current I_WRITE$_1$ (not shown) reaching the phase-change memory cell 109 within the eighth memory block BLK7. The level of write current I_WRITE$_1$ provided to the memory cell 109 far away from the write circuit 310 is lower than the level of write current I_WRITE$_0$ provided to the memory cell 101 close to the write circuit 310.

As described above, data are written to the phase-change memory cell 101 or 109 using Joule heat generated by providing write current I_WRITE$_0$ or I_WRITE$_1$ to the variable resistors 101a or 109a. The Joule heat is proportional to the square of the write current I_WRITE$_0$ or I_WRITE$_1$. Thus, when the level of the write current I_WRITE$_1$ provided to the phase-change memory cell 109 farther away from the write circuit 310 is low, not enough Joule heat is generated to write data to the phase-change memory cell 109. Furthermore, because the temperature of the phase-change memory cell 101 or 109 is proportional to the quantity of Joule heat, the temperature of the phase-change memory cell 109 farther away from the write circuit 310 varies with time as shown in curves c and d of FIG. 4. As evident from FIG. 4, the phase-change material is not heated to a temperature required to induce a phase transition, which may cause the phase-change memory cell 109 farther away from the write circuit 310 to malfunction. That is, a logic level corresponding to input data DATA may not be stored in the phase-change memory cell 109. In particular, when the phase-change memory cell 109 is in a reset state, it is more difficult to write data than when it is in a set state because the resistance $R_{C1}$ is high.

Thus, embodiments of the present invention make the resistance $R_{S1}$ of the column select transistor YSEL4 farther away from the write circuit 310 lower than the resistance $R_{S0}$ of the column select transistor YSEL0 closer thereto. As described earlier, reducing the resistance may be achieved by increasing the size of the column select transistor YSEL4 or the concentration of impurities doped into a channel region for adjusting a threshold voltage.

In such a manner, the resistance of a path between the write circuit 310 and either the phase-change memory cell 101 or 109 within a different memory block BLK0 or BLK7 can be made substantially equal to each other, regardless of which of the phase-change memory cells 101 and 109 is selected. Thus, because the same amount of write current I_WRITE is applied to the phase-change memory cells 101 and 109 within the memory blocks BLK0 and BLK7, it is possible to reduce the risk of failure during a write operation.

Figure 5:
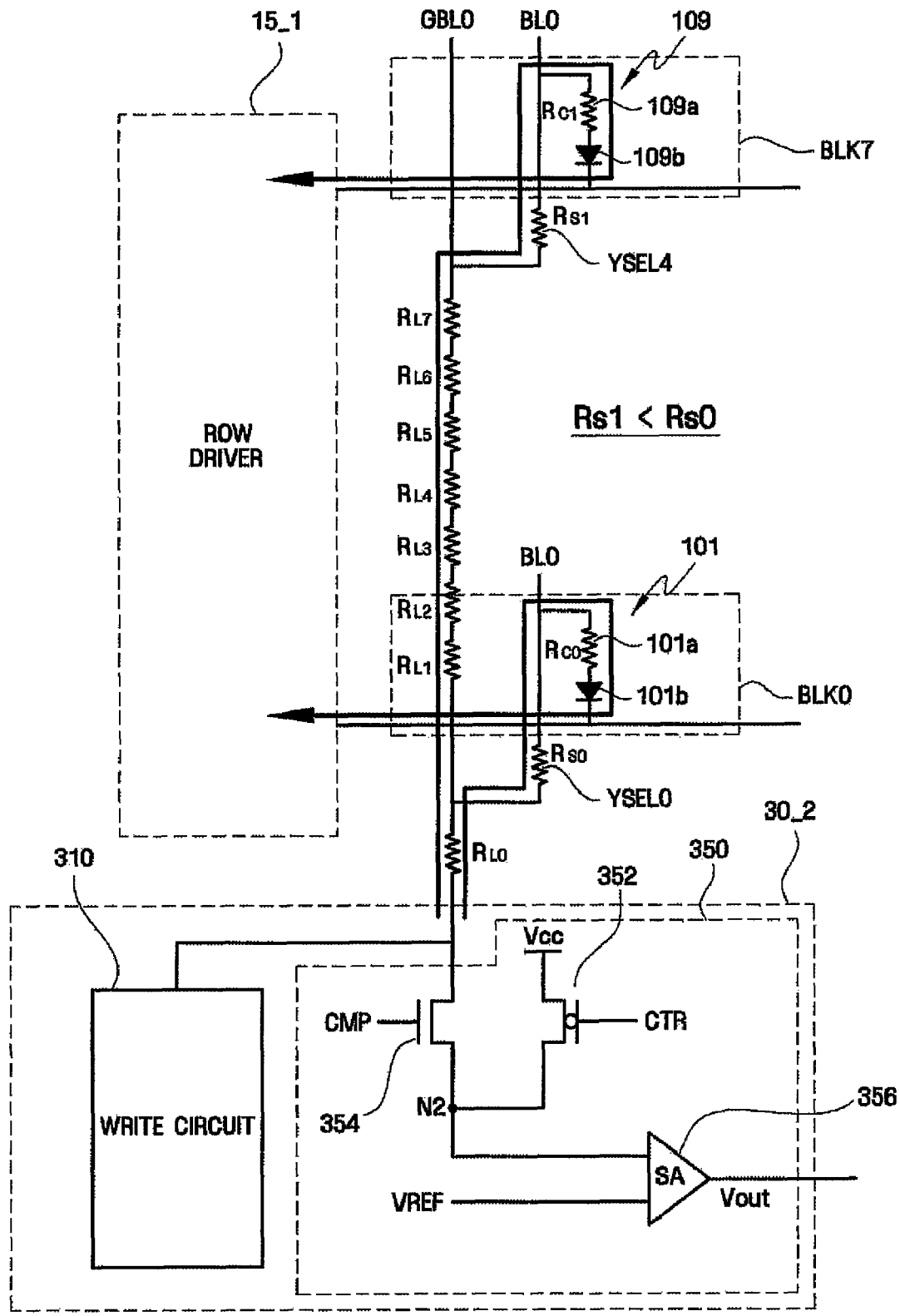
FIG. 5 is a circuit diagram for explaining a read operation of a phase-change random access memory device according to an embodiment of the present invention.
Figure 6:
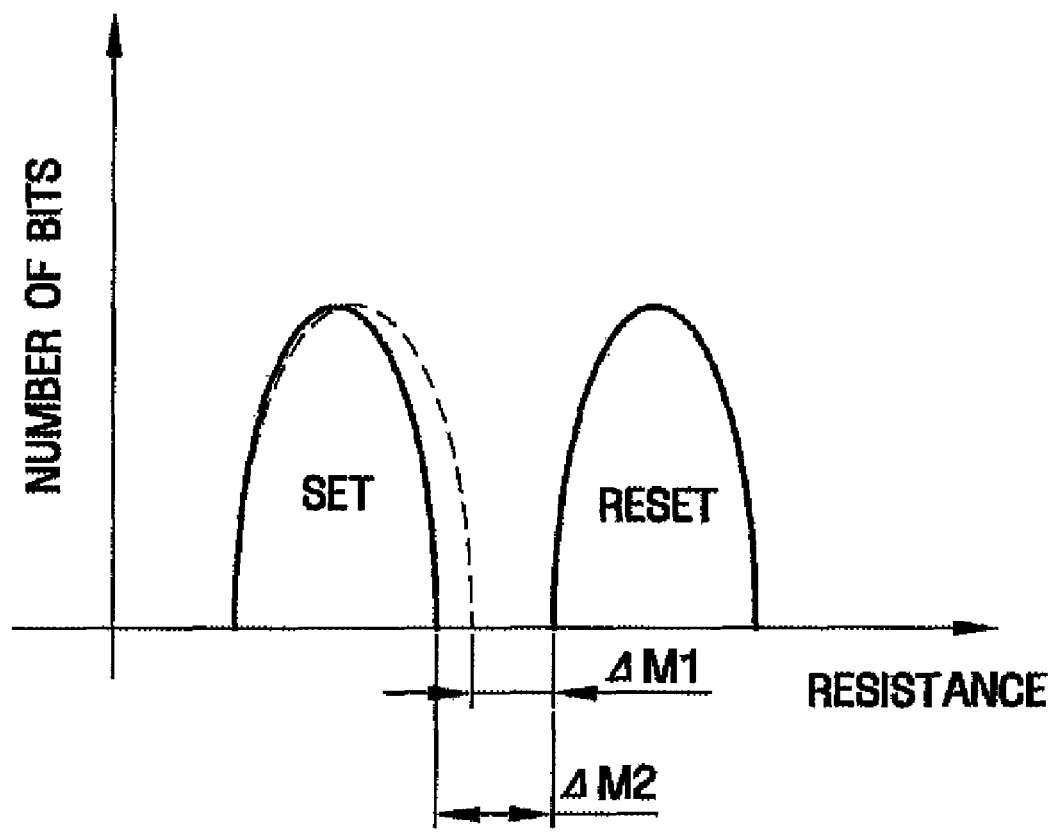
FIG. 6 is a graph illustrating distributions of set resistances and reset resistances of a phase-change memory cell.

FIG. 5 is a circuit diagram for explaining a read operation of a phase-change random access memory device according to an embodiment of the present invention, and FIG. 6 is a graph illustrating distributions of set resistances and reset resistances of a phase-change memory cell.

An operation of reading data from a phase-change memory cell will now be described with reference to FIGS. 5 and 6.

Before the read operation begins, a precharge transistor 352 is turned on to precharge a sensing node N2 to a supply voltage level.

Then, a word line WL0 or WLm is selected by a row driver 15_1 and a local bit line BL0 is selected by a column decoder (not shown) to select a phase-change memory cell 101 or 109 to be written to. When the read operation begins by issuing a read command, the precharge transistor 352 is turned off and ceases to precharge the sensing node N2. Also, a read current I_READ is supplied to the sensing node N2 by a read current supply circuit (not shown).

At the same time, clamp control signal CMP of a predetermined voltage level is applied to a gate of a clamp transistor 354 and clamps the global bit line GBL0 to a predetermined voltage level below threshold voltage Vth. This is because a phase transition of the phase-change material in the variable resistor 101a or 109a occurs when a voltage exceeding the threshold voltage Vth is applied.

Thus, read current I_READ is provided to a selected phase-change memory cell by a clamped voltage level and a shoot-through current is generated according to the resistance of the phase-change material.

Upon generating the shoot-through current, the voltage level of the sensing node N2 is also changed. Then, a sense amplifier SA 356 compares the voltage level of the sensing node N2 with the voltage level of reference voltage VREF, and reads out the logic level of the phase-change memory cell 101 or 109.

Even if a read circuit 350 performs a read operation using the above-mentioned process, a failure may occur during the operation of reading stored data as a distance between the read circuit 350 and the selected phase-change memory cell 101 or 109 increases, because there is a difference in physical length between the phase-change memory cell 101 within the first memory block BLK0 located closer to the read circuit 350, and the phase change memory cell 109 within the eighth memory block BLK7 located farther therefrom.

As described above, because parasitic resistance is present in the global bit line GBL0, the resistance of a path extending from the read circuit 350 to the selected memory cell 101 or 109 varies depending on the position of the selected phase-change memory cell 101 or 109. That is, the phase-change memory cells 101 and 109 have a resistance difference corresponding to the difference in physical distance from the read circuit 350. The resistance of a path between the read circuit 350 and the phase-change memory cell 101 within the first memory block BLK0 is $R_{L0}+R_{S0}+R_{L0}$, while the resistance of a path between the read circuit 350 and the phase-change memory cell 109 within the eighth memory block BLK7 is $R_{Li}$ (i is 0 through 7)+$R_{S1}$+$R_{C1}$·$R_{L0}$ through $R_{L7}$ are the resistances of the global bit line GBL0,$R_{S0}$ and $R_{S1}$ are the resistances of the column select transistors YSEL0 and YSEL4, and $R_{C0}$ and $R_{C1}$ are the resistances of phase change materials of the variable resistors 101a and 109a, respectively.

In this case, when the phase-change memory cell 109 within the eighth memory block BLK7 is in a set state, it may possibly be misunderstood as being in a reset state. That is, when the phase-change memory cell 109 is in a reset state, it may not be significantly affected by a voltage consumed $R_{Li}$ (i is 0 through 7) because the resistance $R_{C1}$ has a sufficiently high value. However, when the phase-change memory cell 109 is in a set state, it may be easily affected by $R_{Li}$ (i is 0 through 7) because the resistance $R_{C1}$ has a low value.

Further, the sense amplifier SA 356 may not distinguish a set state from a reset state because margin ΔM1 between set resistance and reset resistance is very small, as evident from the distributions of set resistance and reset resistance for a path between the read circuit 350 and either of the phase-change memory cells 101 and 109 illustrated in FIG. 6.

Thus, the present invention makes the resistance $R_{S1}$ of the column select transistor YSEL4 farther away from the read circuit lower than the resistance $R_{S0}$ of the column select transistor YSEL0 closer thereto. As described earlier, reducing the resistance may be achieved by increasing the size of the column select transistor YSEL4 or the concentration of impurities doped into a channel region for adjusting a threshold voltage. By adjusting the amount of resistance in this way, the resistance of a path between the read circuit 310 and either the phase-change memory cell 101 or 109 within a different memory block BLK0 or BLK7 can be made substantially equal to each other, thereby providing a sufficient margin between set resistance and reset resistance of a path between the read circuit 350 and either of the phase-change memory cells 101 and 109 with different memory blocks BLK0 and BLK7, while reducing the risk of failure during read operation. It should be understood that for this embodiment in general, the resistances of the column select transistors at positions progressively further away from the read circuit are made to be progressively lower, respectively.

Figure 7:
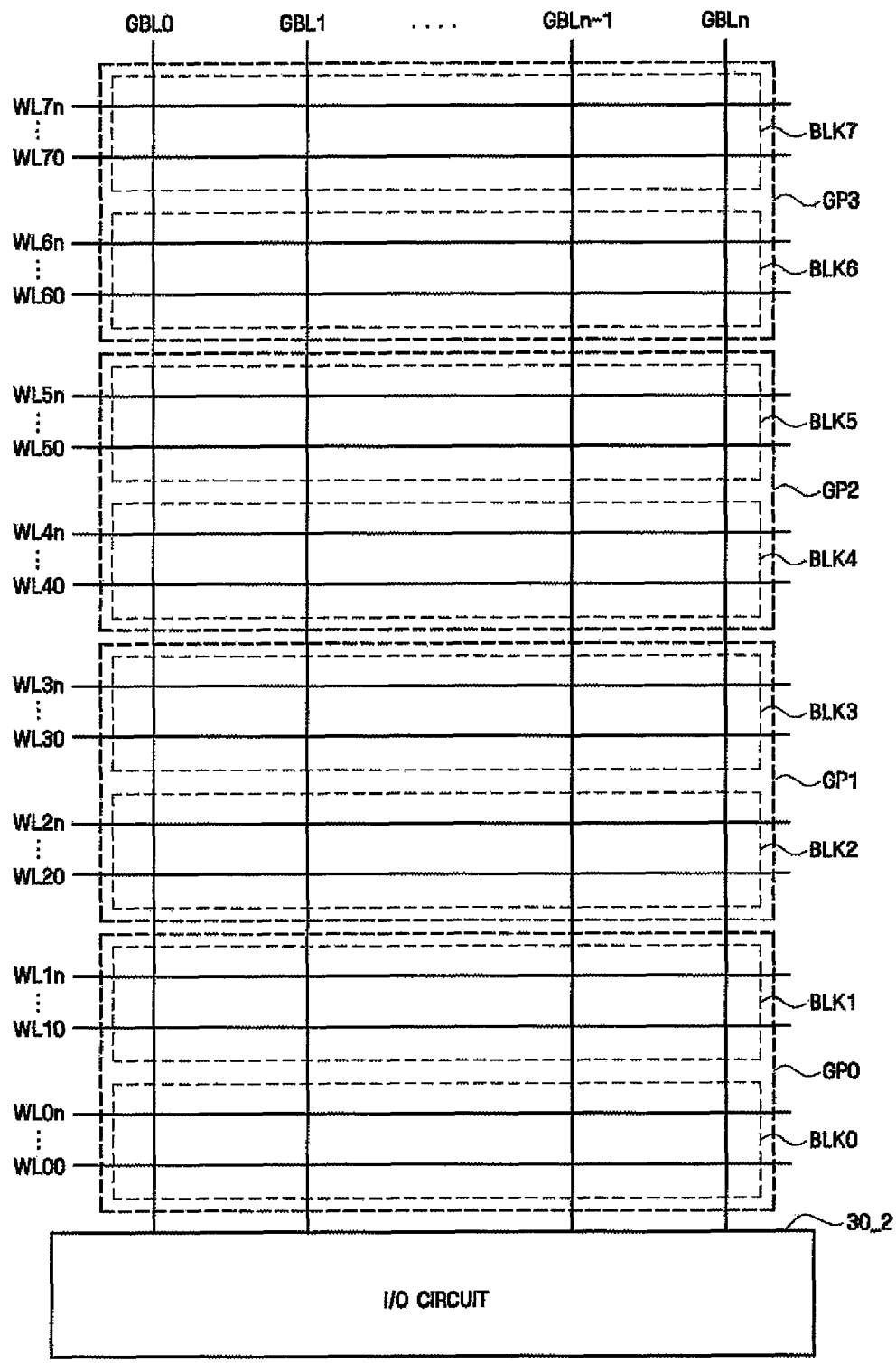
FIG. 7 is a block diagram of a phase-change random access memory device according to a second embodiment of the present invention.

FIG. 7 is a block diagram of a phase-change random access memory device according to a second embodiment of the present invention. Components each having the same function for describing the embodiment shown in FIG. 2 are respectively identified by the same reference numerals, and their repetitive description will be omitted.

Referring to FIG. 7, the feature of the phase-change random access memory device according to the second embodiment of the present invention is that a plurality of memory blocks BLKi (i=0~7) are clustered into two or more memory groups GP0, GP1, GP2, and GP3, and the size of the column select transistors corresponding to the respective memory groups GP0, GP1, GP2, and GP3 varies depending on the distance between an I/O circuit 30_2 and each of the memory groups GP0, GP1, GP2, and GP3. That is, the resistance of column select transistors corresponding to a memory group GP0, GP1, GP2, or GP3 located farther from the I/O circuit 30_2 is less than that of column select transistors corresponding to a memory group GP0, GP1, GP2, or GP3 located closer thereto. For example, the resistances of the plurality of column select transistors corresponding to the fourth memory group GP3 is less than those of the plurality of column select transistors corresponding to the first memory group GP0.

Although in the above description two memory blocks BLKi each are clustered into single memory groups GP0, GP1, GP2, or GP3, one memory group may include three or more memory blocks (e.g., four).

Figure 8A:
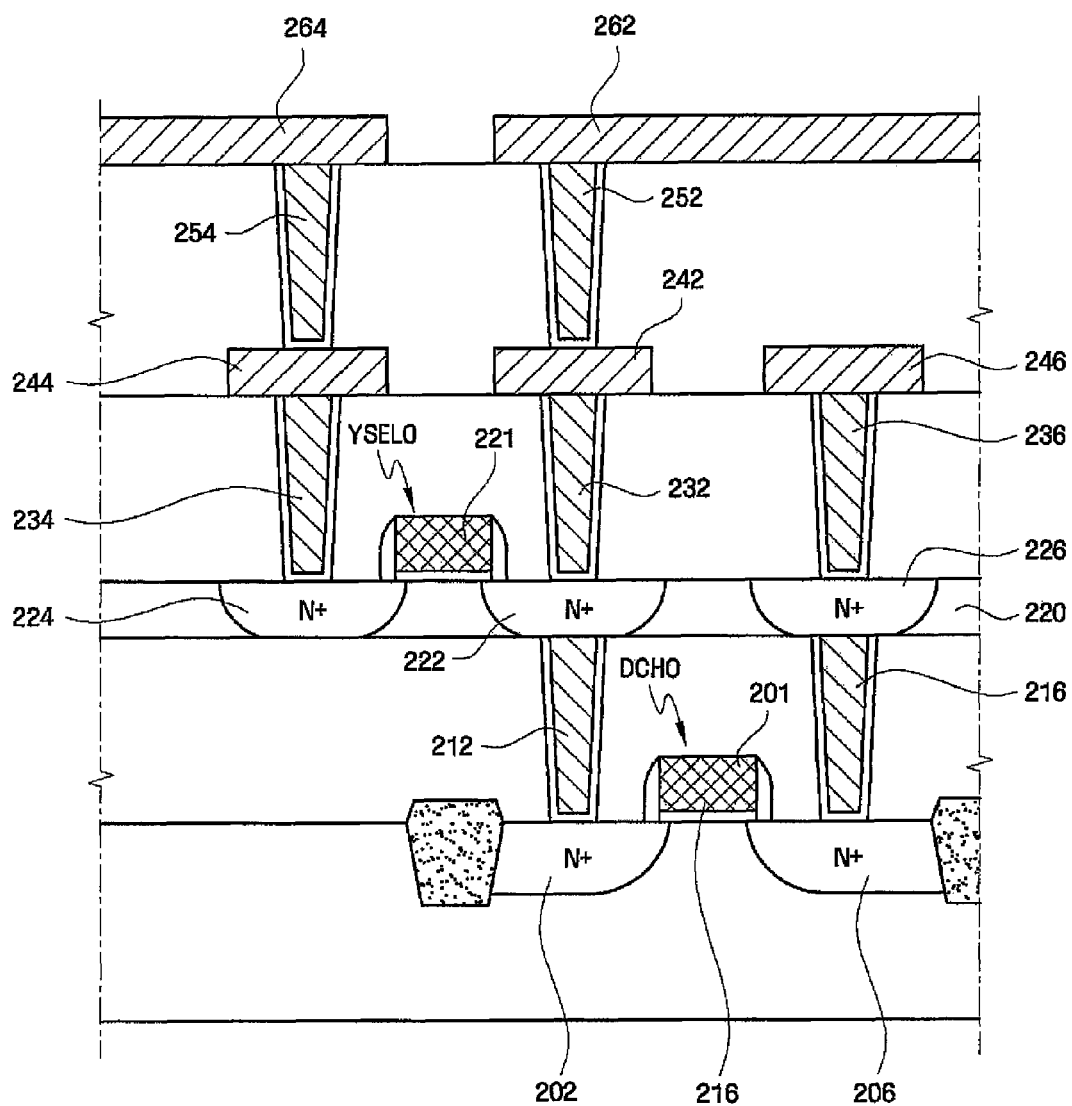
FIG. 8A is a cross-sectional view of a column select transistor and a discharge transistor of a phase-change random access memory device according to a third embodiment of the present invention.

FIG. 8A is a cross-sectional view of a column select transistor and a discharge transistor for a phase-change random access memory device according to a third embodiment of the present invention.

Referring to FIG. 8A, a column select transistor YSEL0 is disposed in a different layer than the discharge transistor DCH0. A transistor disposed in the upper layer may be a thin film transistor, while a transistor in the lower layer may be a bulk transistor. The thin film transistor may be formed in a silicon epitaxial layer 220. For convenience of explanation, it is assumed that the discharge transistor DCH0 is disposed in the lower layer and the column select transistor YSEL0 is disposed in the upper layer, although the position of the two transistors DCH0 and YSEL0 may vary according to a design. Although not shown in FIG. 8A, a gate 201 of the discharge transistor DCH0 is connected to a complementary column select signal YSB0, while a gate 221 of the column select transistor YSEL0 is connected to a column select signal YS0.

A drain 202 of the discharge transistor DCH0 and a source 222 of the column select transistor YSEL0 are respectively connected to a landing pad 242 through contact plugs 212 and 232. The landing pad 242 is connected to a local bit line 262 through a via plug 252. Although not shown in FIG. 8A, the local bit line 262 is coupled to a phase-change material of a phase-change memory cell. A drain 224 of the column select transistor YSEL0 is connected to a landing pad 244 via a contact plug 234. The landing pad 244 is coupled to a global bit line 264 through a via plug 254. A source 206 of the discharge transistor DCH0 is connected to a landing plug 246 through a contact plug 216, an impurity region 226 of the epitaxial layer 220, and a contact plug 236, and the landing plug 246 is coupled to a ground voltage.

FIG. 8B is a circuit diagram of a phase-change memory cell 301 in the phase-change random access memory device according to the fourth embodiment of the present invention. Components each having the same function for describing the embodiment shown in FIG. 2 are respectively identified by the same reference numerals, and their repetitive description will be omitted.

Referring to FIG. 8B, the phase-change memory cell 301 uses a transistor that is disposed between a variable resistor 301a and a ground voltage, and has a gate connected to a word line WL as a control element 301b controlling current flowing through the variable resistor 301a. Unlike a case in which a diode is used as the control element 301b, the word line WL is driven to high level to turn on a transistor when the phase-change memory cell 301 is selected.

Figure 9A:
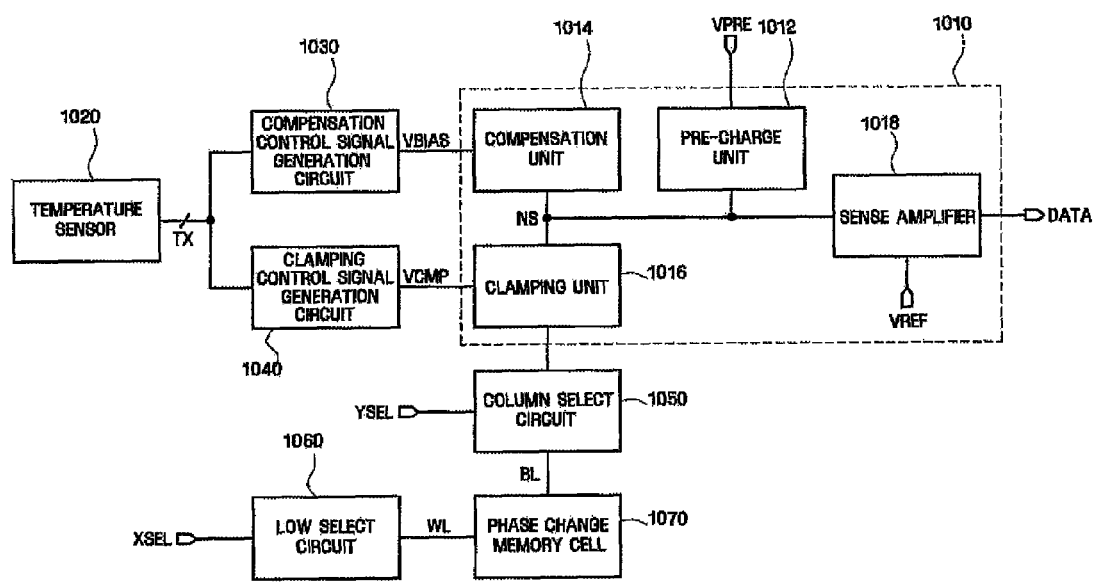
Figure 9B:
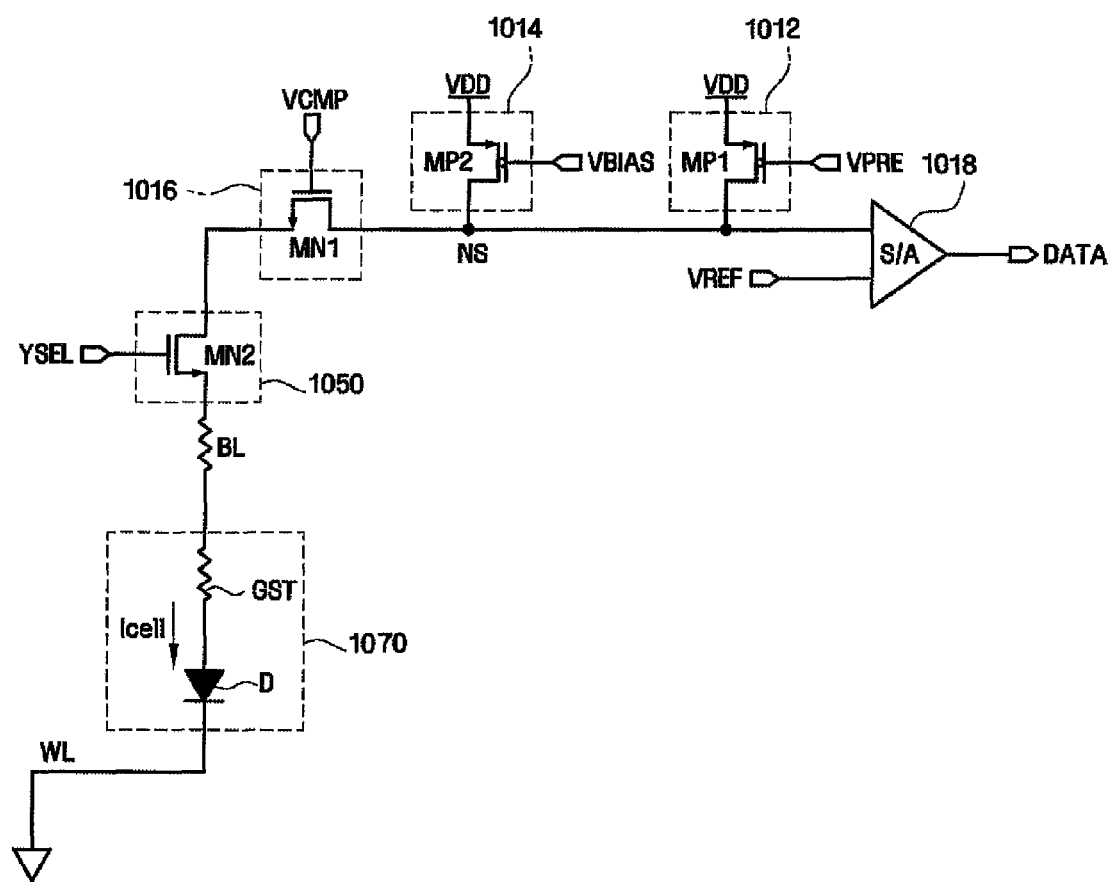
Figure 9C:
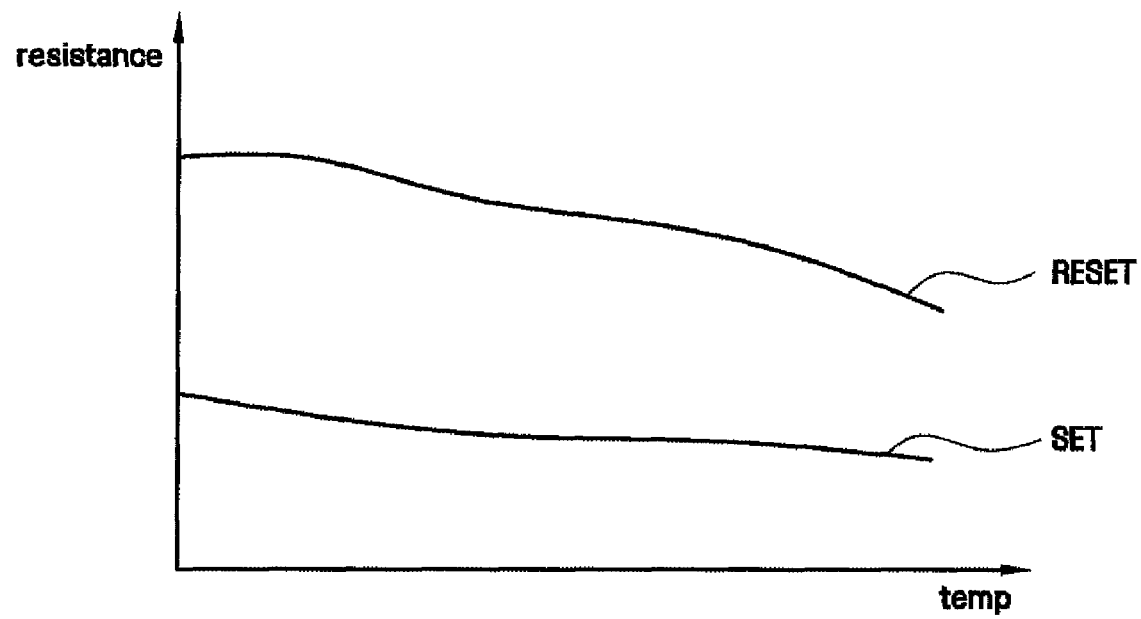
Figure 9D:
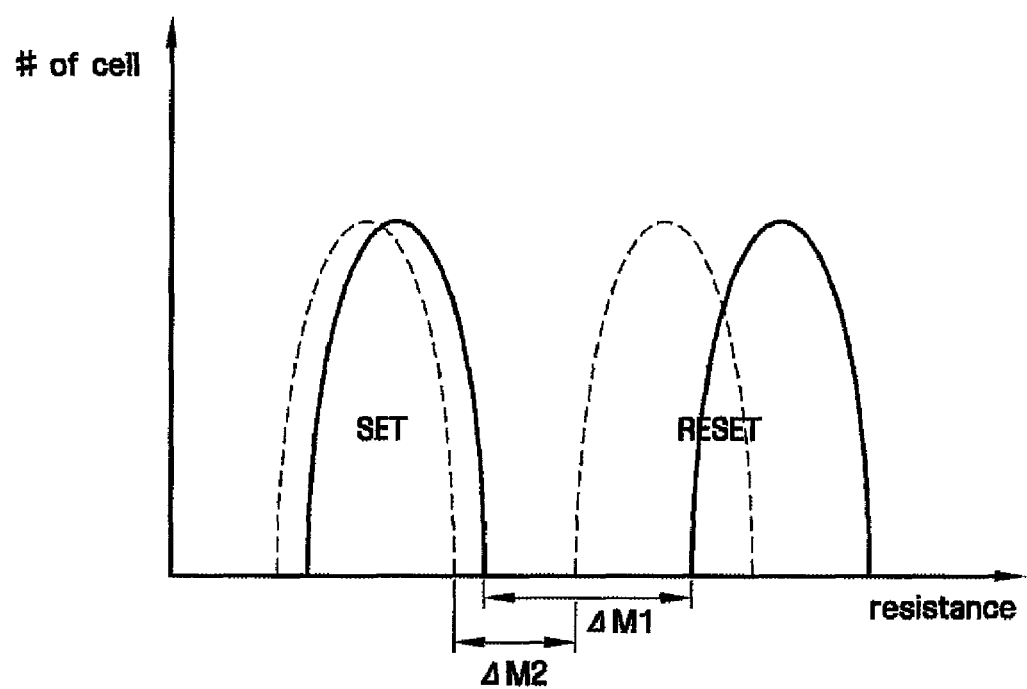
Figure 9E:
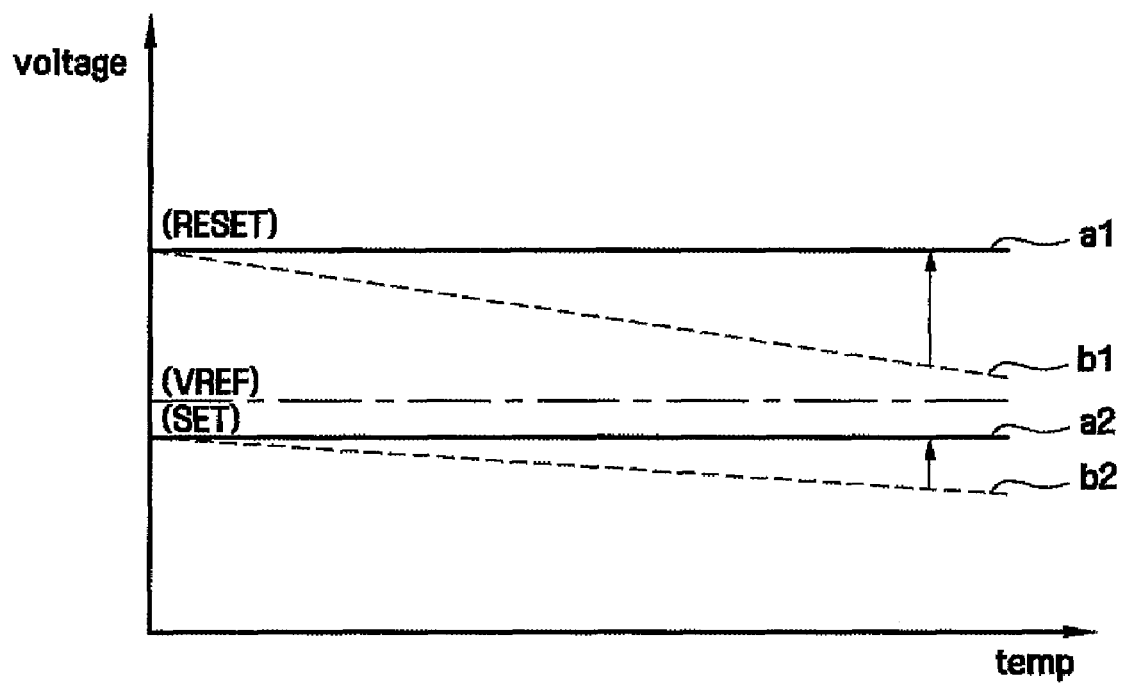

Referring to FIGS. 9A and 9B, a PRAM according to an example embodiment may include a temperature sensor 1020 that may react to ambient temperature and provide a temperature signal Tx. A compensation control signal generation circuit 1030 and a clamping control signal generation circuit 1040 may each receive the temperature signal Tx, and respectively generate a compensation control signal VBIAS and a clamping control signal VCMP, reflecting the temperature characteristics. In detail, when the temperature rises, the compensation control signal generation circuit 1030 and the clamping control signal generation circuit 1040 may decrease the voltage level of the compensation control signal VBIAS and the voltage level of the clamping control signal VCMP, respectively.

When the voltage level of the compensation control signal VBIAS decreases, the PMOS transistor of the compensation unit 1014 may decrease the amount of compensation current. In contrast, when the voltage level of the clamping control signal VCMP decreases, the NMOS transistor MN1 of the clamping unit 1016 may decrease the amount of clamping current.

Figure 9F:
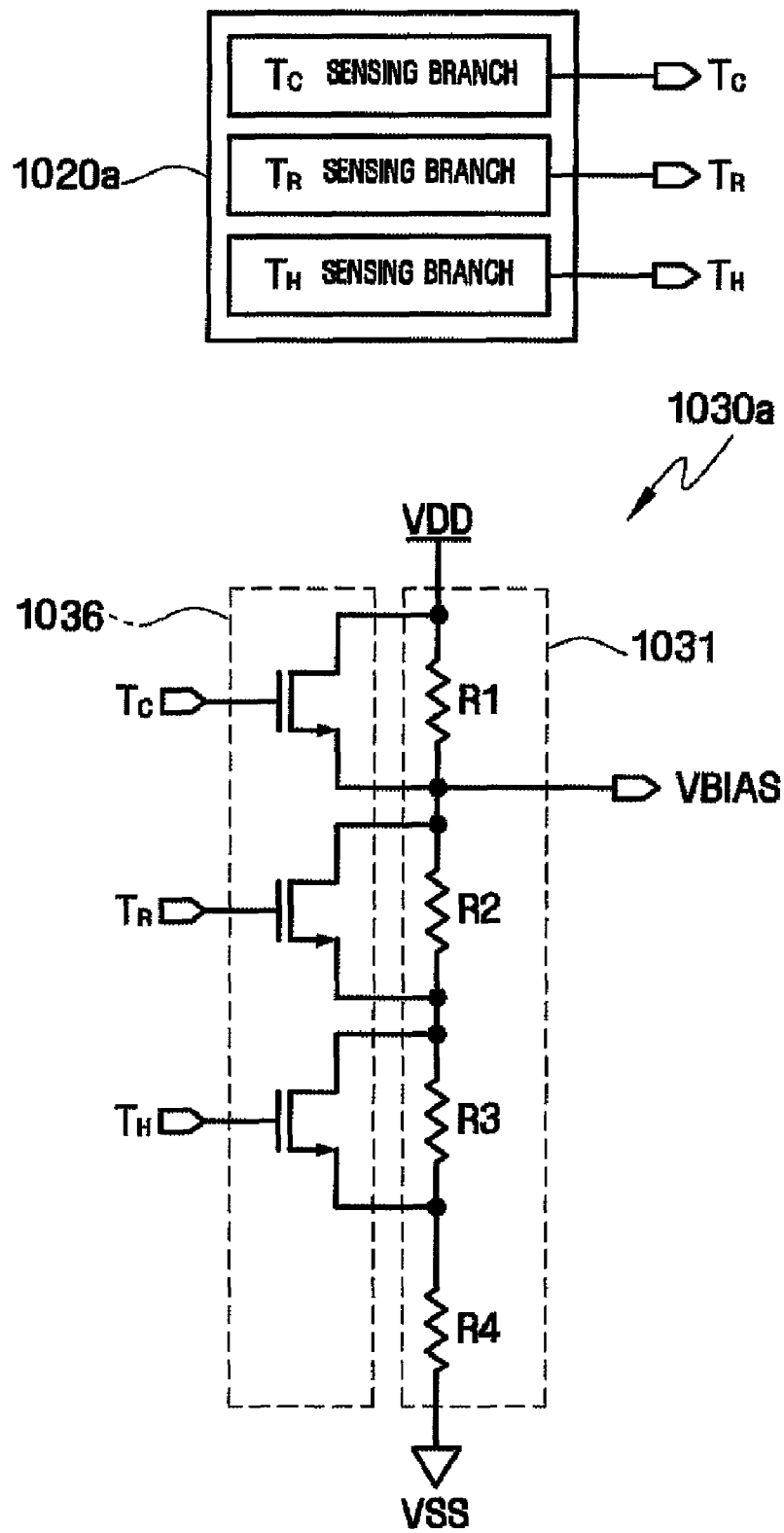
Figure 9G:
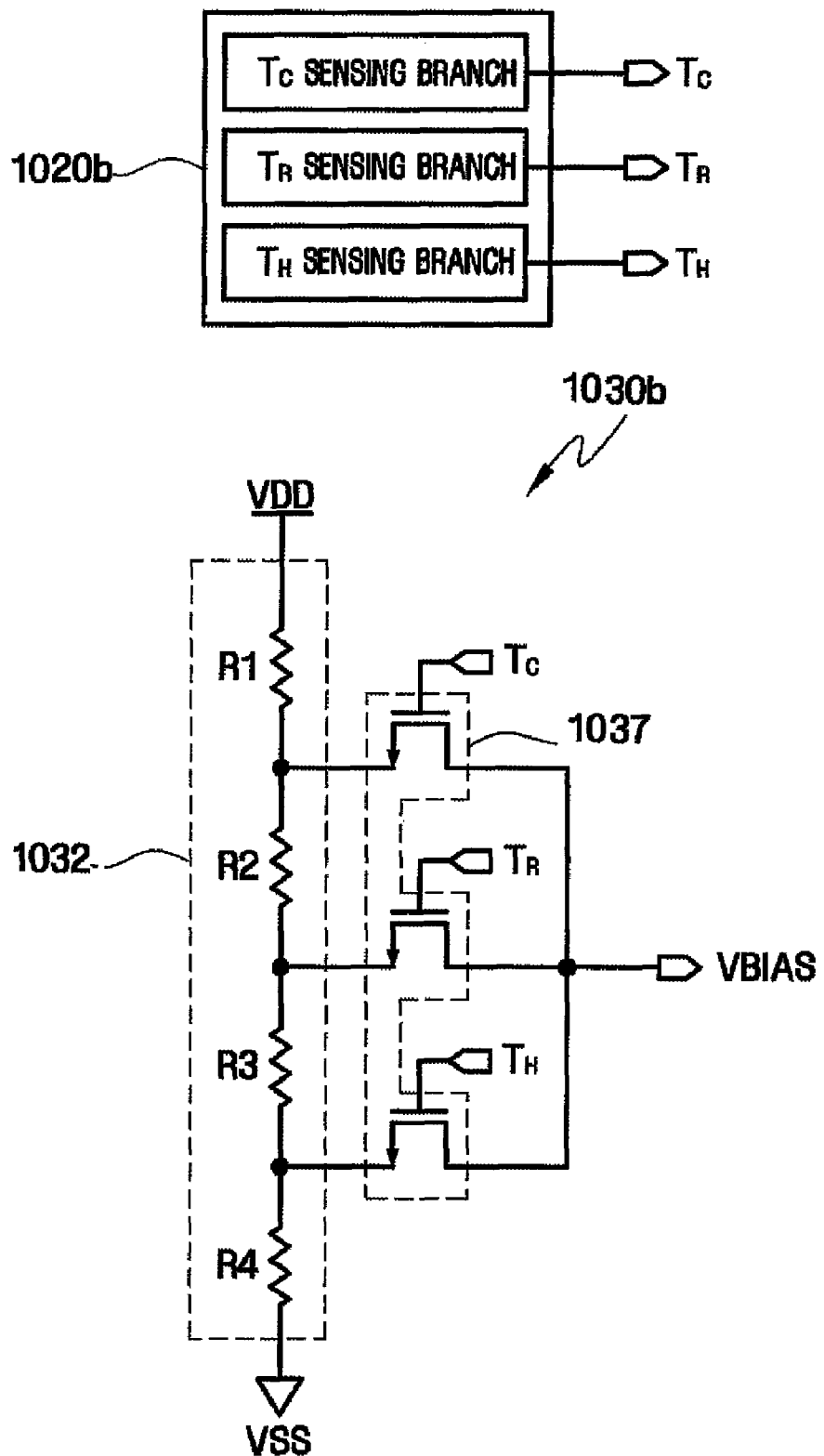

Examples of the temperature sensor 1020, the compensation control signal generation circuit 1030, and the clamping control signal generation circuit 1040 are illustrated in FIGS. 9F to 9H. Although FIGS. 9F to 9H only show the compensation control signal generation circuit 1030, the circuit illustrated in FIGS. 9F to 9H may also be applied to the clamping control signal generation circuit 1040. The circuits shown in FIGS. 9F to 9H are only for illustrative purposes.

Referring to FIG. 9F, the temperature sensor 1020a may include a plurality of temperature sensing branches which react to different temperatures and output temperature signals TR, TH and TC. For example, the temperature sensor 1020a may include a sensing branch TR for sensing ambient temperature, a sensing branch TH for sensing a temperature higher than ambient temperature, and a sensing branch TC for sensing a temperature lower than ambient temperature. When temperature of the PRAM becomes higher than ambient temperature, the temperature signal TH also becomes high, and the temperature signal TC becomes low.

The compensation control signal generation circuit 1030a may include a resistor array 1031 configured to have a plurality of resistors R1 to R4, and a plurality of NMOS transistors 1036 connected between a plurality of nodes of the resistor array 1031, and configured to be turned on in response to the temperature signals, TR, TH and TC. Values of the plurality of resistors R1 to R4 may be, for example, R1<R2<R3<R4. The level of the compensation control signal VBIAS output in response to the temperature signal TH may be lower than that of compensation control signals VBIAS output in response to the other temperature signals TR and TC.

Referring to FIG. 9G, the temperature sensor 1020b may include a plurality of temperature sensing branches TR, TH and TC, which may output temperature signals TR, TH and TC, respectively, in response to different temperatures.

The compensation control signal generation circuit 1030b may include a resistor array 1032 configured to include a plurality of resistors R1 to R4, and a plurality of NMOS transistors 1037 may be connected between a plurality of nodes of the resistor array 1032 and a voltage output node and configured to be turned on in response to the temperature signals TR, TH and TC.

Referring to FIG. 9H, the temperature sensor 1020c may include a diode, and the compensation control signal generation circuit 1030c may include a resistor array in which a plurality of resistors R1 to R4 may be connected in a series. The diode and the plurality of resistors may be connected in a series with respect to each other. Since the resistance of the diode may become high when temperature rises, the level of the compensation control signal VBIAS may decrease when temperature rises.

FIG. 9I is a timing diagram illustrating a read operation of a PRAM according to an example embodiment.

A read operation may be performed when temperature of the PRAM is higher than ambient temperature.

First, a read operation may start in response to an input of a read command, a column select signal YSEL may become high in synchronization with an input address XAi, and a bit line BL may be selected.

Subsequently, a pre-charge control signal VPRE may become low in synchronization with the column select signal YSEL. Accordingly, the transistor MP1 of the pre-charge unit 1012 may pre-charge the sensing node SN to the level of the power supply voltage VDD.

Thereafter, when the pre-charge control signal VPRE becomes high, the low select signal XSEL may become high in synchronization with the pre-charge control signal so that a word line WL may be selected.

Further, when the pre-charge operation is terminated and a sensing operation starts, the clamping unit 1016 may clamp the level of the bit line BL within a region appropriate for reading data. In detail, the clamping unit 1016 may clamp the level of the bit line BL to a desired level below the threshold voltage Vth of the phase change material. For example, when the threshold voltage of the phase change material is about 1.2 V, the level of the bit line BL may be clamped at about 0.5 V to 1.0 V. The clamping unit 1016 may provide a clamping current lower than that provided at ambient temperature. Although a clamping control signal VCMP may have the form of a constant voltage, as illustrated in FIG. 9I, the clamping control signal VCMP may have the form of a pulse which may be activated only during a read operation.

Furthermore, the compensation unit 1014 may provide the sensing node SN with a compensation current in order to compensate for a decrease in the level of the sensing node SN caused by the pass through current Icell flowing through the selected phase change memory cell 1070. In particular, the compensation unit 1014 may provide an amount of compensation current which may be larger than that provided at ambient temperature. Although the compensation control signal VBIAS may have the form of a constant voltage, as illustrated in FIG. 9I, the compensation control signal VBIAS may have the form of a pulse type which may be activated only during the read operation.

In such a state, a pass through current Icell depending on the resistance of the selected phase change memory cell 1070 may be generated. When the phase change memory cell 1070 is in a set state, the amount of pass through current Icell may be large because the resistance of the phase change material is low. In contrast, when the phase change memory cell 1070 is in a reset state, the amount of the pass through current Icell may be small because the resistance of the phase change material is high. However, since the compensation unit 1014 may uniformly provide the compensation current, the level of the sensing node SN may be uniformly maintained in a reset state, and may decrease in a set state. Accordingly, the sense amplifier 1018 may sense the difference ΔH between the level of the sensing node SN in a reset state and a reference level VREF, or the difference ΔL between the level of the sensing node SN in a set state and the reference level VREF.

According to an example embodiment, it may be noted that as temperature rises, the compensation unit 1014 may increase the amount of compensation current and the clamping unit 1016 may decrease the amount of clamping current so that the level of the sensing node SN in a reset state may be uniformly maintained.

Figure 9J:
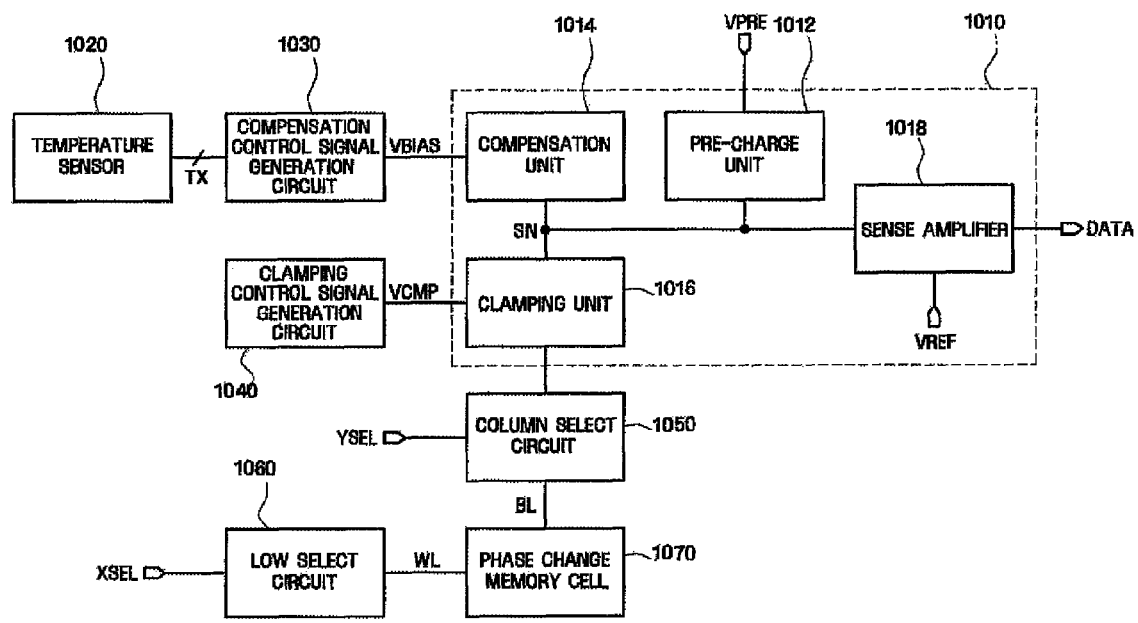
Figure 9K:
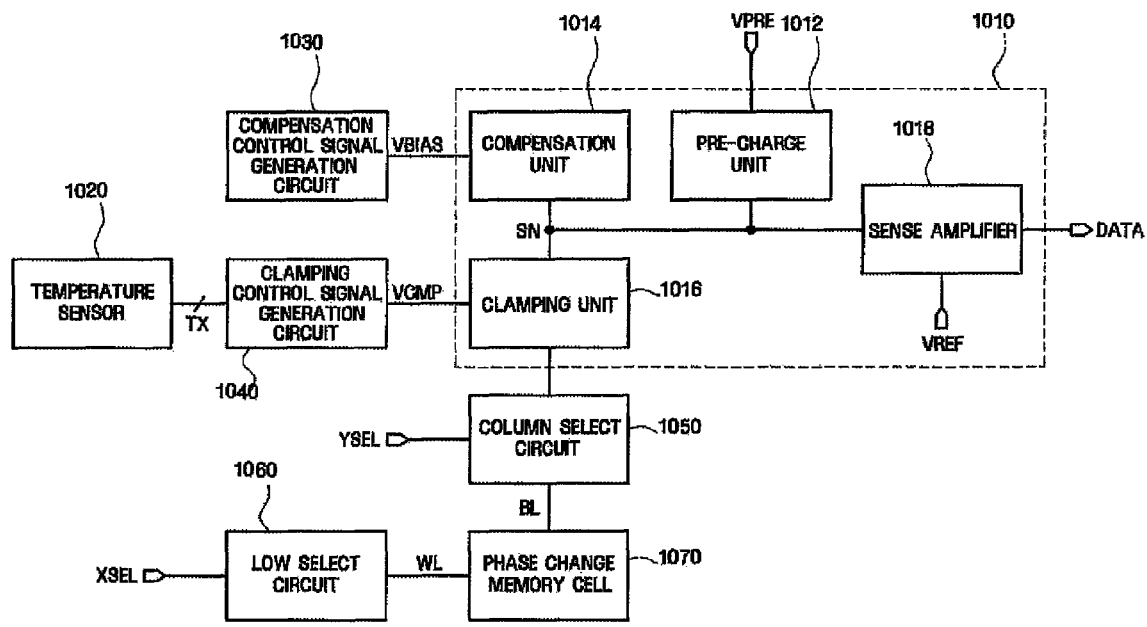

FIG. 9J is a block diagram illustrating a PRAM according to another example embodiment. FIG. 9K is a block diagram illustrating a PRAM according to yet another example embodiment.

In the PRAM according to example embodiment illustrated in FIG. 9J, because only the compensation control signal generation circuit 1030 may be provided with the temperature signal Tx of the temperature sensor 1020, only the compensation unit 1014 may control the amount of compensation current according to the change in temperature. On the hand, in the PRAM according to yet another example illustrated in FIG. 9K, because only the clamping control signal generation circuit 1040 may be provided with the temperature signal Tx of the temperature sensor, only the clamping unit 1016 may control the amount of clamping current according to the change in temperature.

Example embodiments relate to a PRAM having a more reliable read operation. If the temperature of the PRAM increases, a set resistance and reset resistance may change. Accordingly, the resistance margin between the set resistance and reset resistance may be small. In some example embodiments, the PRAM may include a compensation unit, a clamping unit, a compensation-control-signal-generation circuit, a clamping-control-signal-generation circuit, a temperature sensor, and/or a sense amplifier.

The compensation unit may control the amount of compensation current according to the temperature of the PRAM in response to a compensation-control signal. The compensation-control-signal-generation circuit controls the voltage level of the compensation-control signal by receiving the temperature signal from the temperature sensor.

The clamping unit may control the amount of clamping current according to the temperature of the PRAM in response to a clamping-control signal. The clamping-control-signal-generation circuit may control the voltage level of the clamping control signal by receiving the temperature signal from the temperature sensor.

Figure 10A:
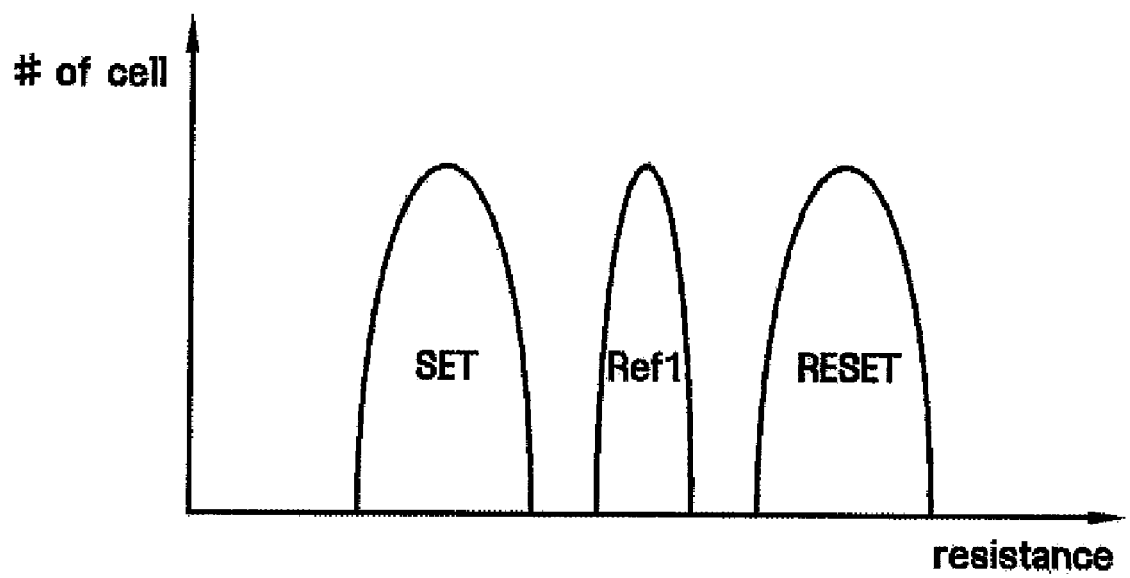
FIGS. 10A through 12 are diagrams for explaining a nonvolatile memory device according to a fifth embodiment of the present invention.
Figure 10B:
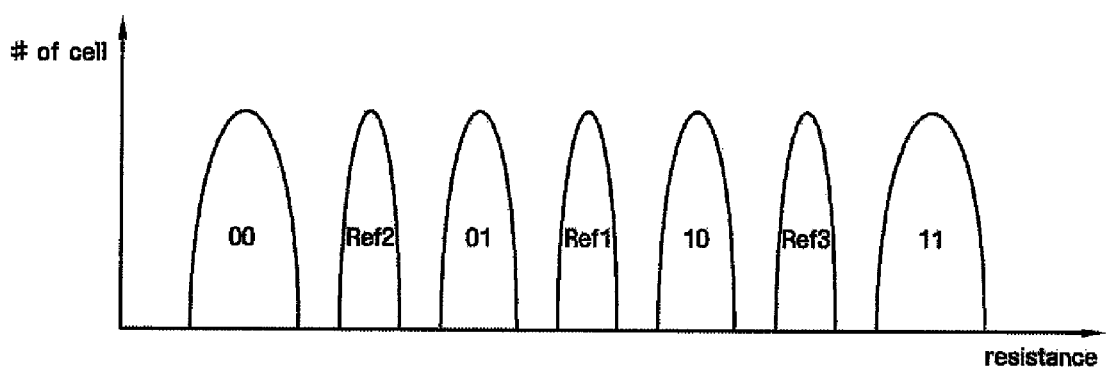
Figure 11:
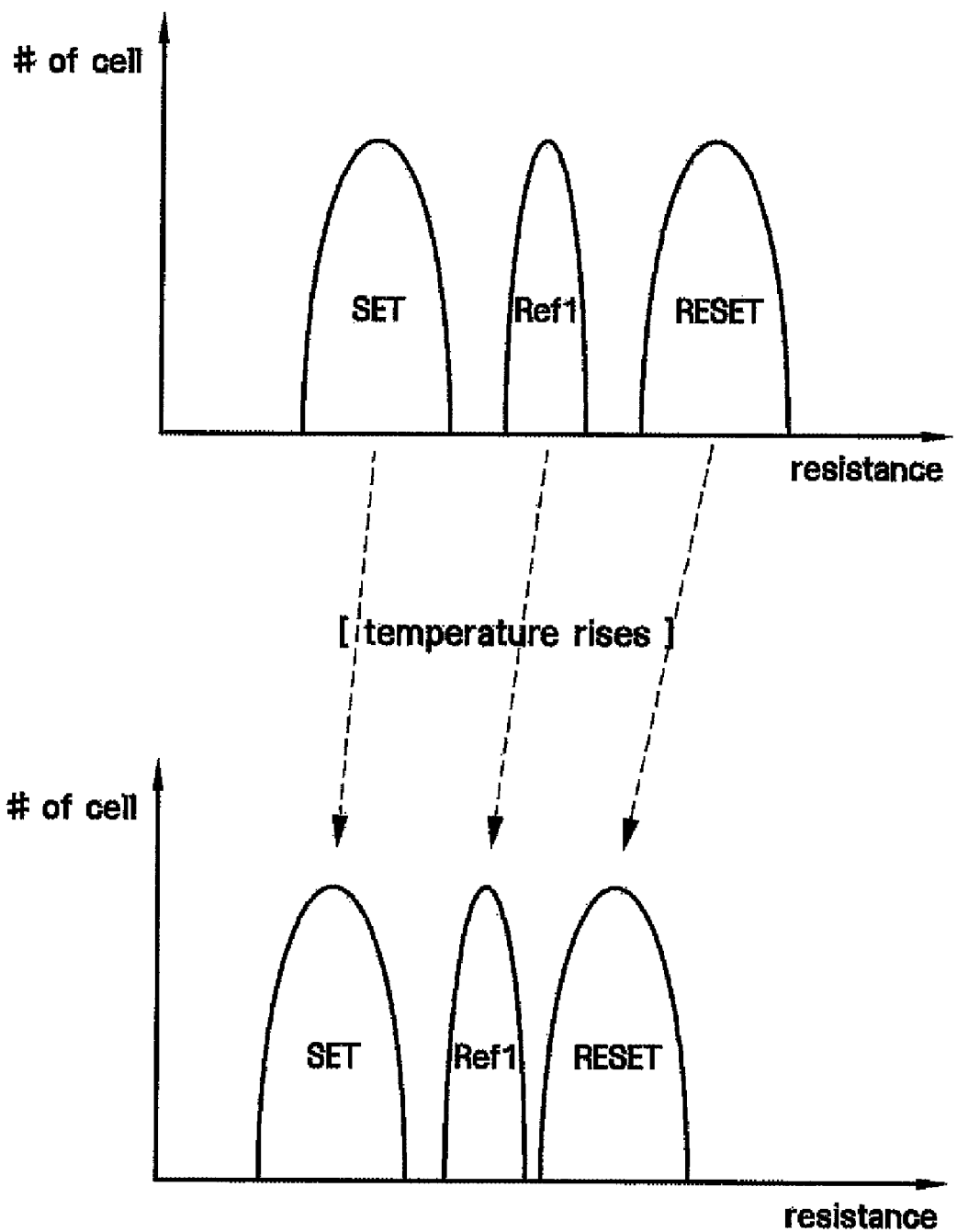
Figure 12:
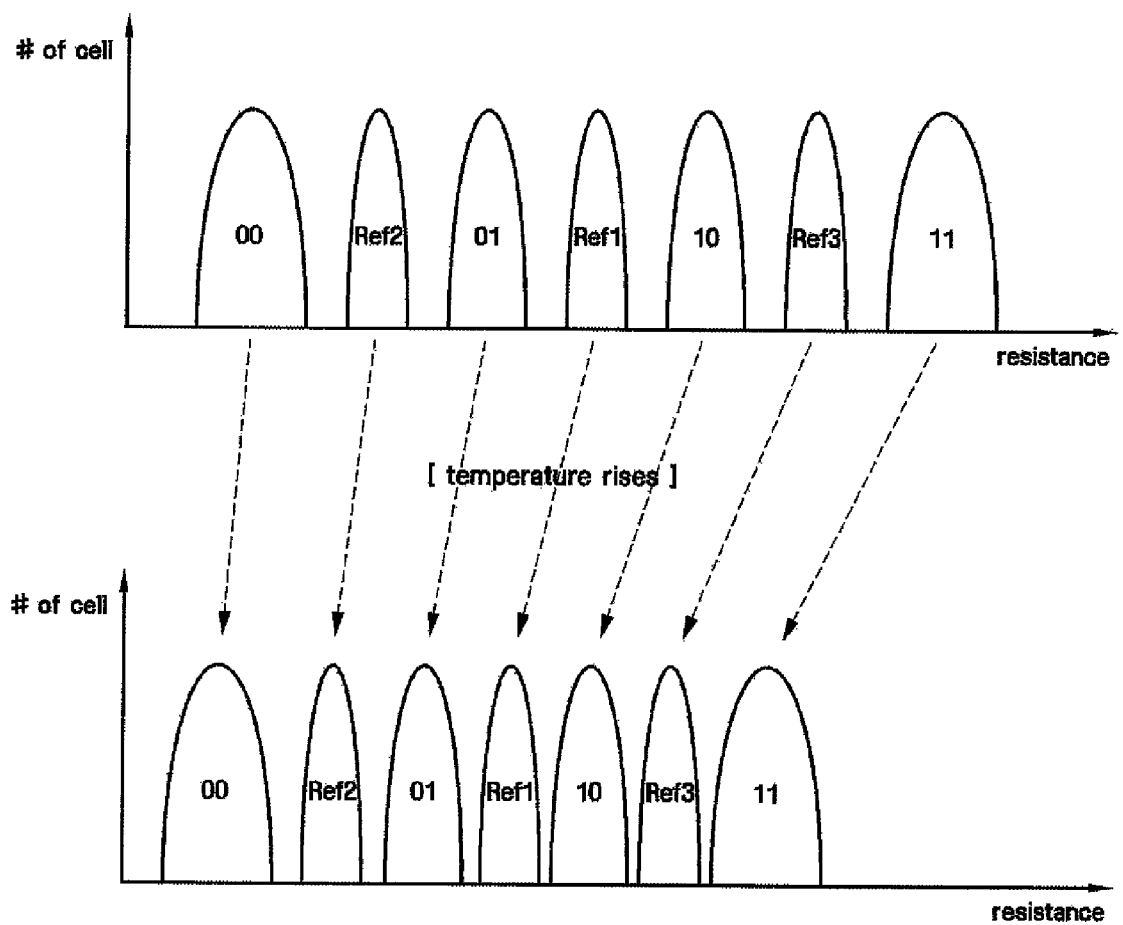

FIGS. 10A through 12 are diagrams for explaining a nonvolatile memory device according to a fifth embodiment of the present invention. Specifically, FIGS. 10A and 11 are diagrams related to single-level cells (i.e., 1 bit-level cells), and FIGS. 10B and 12 are diagrams related to multi-level cells (i.e., n bit-level cells where "n" is a natural number equal to or greater than two).

In the nonvolatile memory device according to the fifth embodiment of the present invention, each nonvolatile memory cell has any one of a plurality of first resistance distributions. Here, the first resistance distributions do not overlap each other, that is, are separated from each other to secure a margin.

For example, when the nonvolatile memory cells are single-level cells, the first resistance distributions may include two ($=2^1$) kinds of resistance distributions, i.e., a set resistance distribution SET and a reset resistance distribution RESET, as illustrated in FIG. 10A. Here, each of the nonvolatile memory cells may have resistance corresponding to any one of the first resistance distributions.

When the nonvolatile memory cells are multi-level cells, each of the nonvolatile memory cells may have any one of $2^n$ different kinds of resistance distributions. For example, when the nonvolatile memory cells are 2 bit multi-level cells, the first resistance distributions may include four ($=2^2$) kinds of resistance distributions, i.e., 00, 01, 10, and 11, as illustrated in FIG. 10B. Here, each of the nonvolatile memory cells may have resistance corresponding to any one of the first resistance distributions. In addition, each of the resistance distributions 00, 01, 10, and 11 may be determined by the amount of amorphous material contained in a phase-change material. For example, the resistance distribution 00 may be determined when the phase-change material is crystalline, and the amount of amorphous material contained in the phase-change material may increase in the order of the resistance distributions 01, 10, and 11.

The nonvolatile memory device according to the fifth embodiment of the present invention may also include one or more reference cells for adjusting the amount of compensation current or clamping current to enhance the reliability of a read operation. The reference cells may be identical to the nonvolatile memory cells. That is, like the nonvolatile memory cells, the reference cells each may include a variable resistance element and an access element, and the variable resistance element may be a phase-change material.

Each of the reference cells has any one of a plurality of second resistance distributions. The second resistance distributions may not overlap the first resistance distributions of the nonvolatile memory cells.

When the nonvolatile memory cells are single-level cells, the reference cells have one resistance distribution Ref1, as illustrated in FIG. 10A. On the other hand, when the nonvolatile memory cells are multi-level cells (i.e., n bit-level cells), the reference cells have $2^n-1$ resistance distributions. For example, when the nonvolatile memory cells are 2 bit multi-level cells, three different resistance distributions Ref1, Ref2, and Ref3 may be generated as illustrated in FIG. 10B. Consequentially, when the nonvolatile memory cells are m bit-level cells ("m" is a natural number), the reference cells have $2^m-1$ resistance distributions.

Referring to FIGS. 10A and 10B, any one of the second resistance distributions may be located between two adjacent ones of the first resistance distributions. For example, referring to FIG. 10B, the resistance distribution Ref2 is located between the resistance distributions 00 and 01, the resistance distribution Ref1 is located between the resistance distributions 01 and 10, and the resistance distribution Ref3 is located between the resistance distributions 10 and 11.

Referring to FIG. 11, the resistance distributions of the nonvolatile memory cells and the resistance distributions of the reference cells change as temperature rises. That is, as temperature rises, the reset resistance distribution RESET is reduced more significantly than the set resistance distribution SET. Therefore, as temperature rises, a margin between the set resistance distribution SET and the reset resistance distribution RESET is reduced.

However, the arrangement of the set resistance distribution SET, the resistance distribution Ref1 of the reference cells, and the reset resistance distribution RESET remains unchanged before and after temperature rises. In addition, the set resistance distribution SET, the resistance distribution Ref1 of the reference cells, and the reset resistance distribution RESET still do not overlap each other. Therefore, the resistance of the reference cells may be used to clearly discriminate between set resistance and reset resistance.

Referring to FIG. 12, the resistance distributions of the nonvolatile memory cells and the resistance distributions of the reference cells change as temperature rises. That is, as temperature rises, the degree by which the resistance distribution is reduced increases in the order of the resistance distributions 00, 01, 10, and 11. Therefore, as temperature rises, margins between the resistance distributions 00, 01, 10, and 11 are reduced.

However, the arrangement of the resistance distributions 00, 01, 10, and 11, and the resistance distributions Ref1, Ref2, and Ref3 of the reference cells remains unchanged before and after temperature rises. In addition, the resistance distributions 00, 01, 10, and 11, and the resistance distributions Ref1, Ref2, and Ref3 of the reference cells still do not overlap each other. Therefore, the resistances of the reference cells may be used to clearly discriminate among resistances corresponding to the resistance distributions 00, 01, 10, and 11.

In some embodiments of the present invention, the resistances of the reference cells are used to adjust the amount of compensation current or clamping current. As described above with reference to FIGS. 11 and 12, the resistance change of the reference cells according to temperature may fully reflect the resistance change of the nonvolatile memory cells according to temperature. That is, a change in the resistance of the reference cells according to temperature may be equal to a change in the resistance of the nonvolatile memory cells according to temperature. Therefore, the amount of compensation current or clamping current may fully reflect temperature changes.

The amount of compensation current or clamping current can be adjusted more accurately by using the resistance change of the reference cells. This is because the resistance change of the reference cells can accurately reflect the resistance change of the nonvolatile memory cells since the reference cells and the nonvolatile memory cells are the same type of memory cells.

A specific configuration (block or circuit) for adjusting the amount of compensation current or clamping current using the reference cells will now be described.

Figure 13:
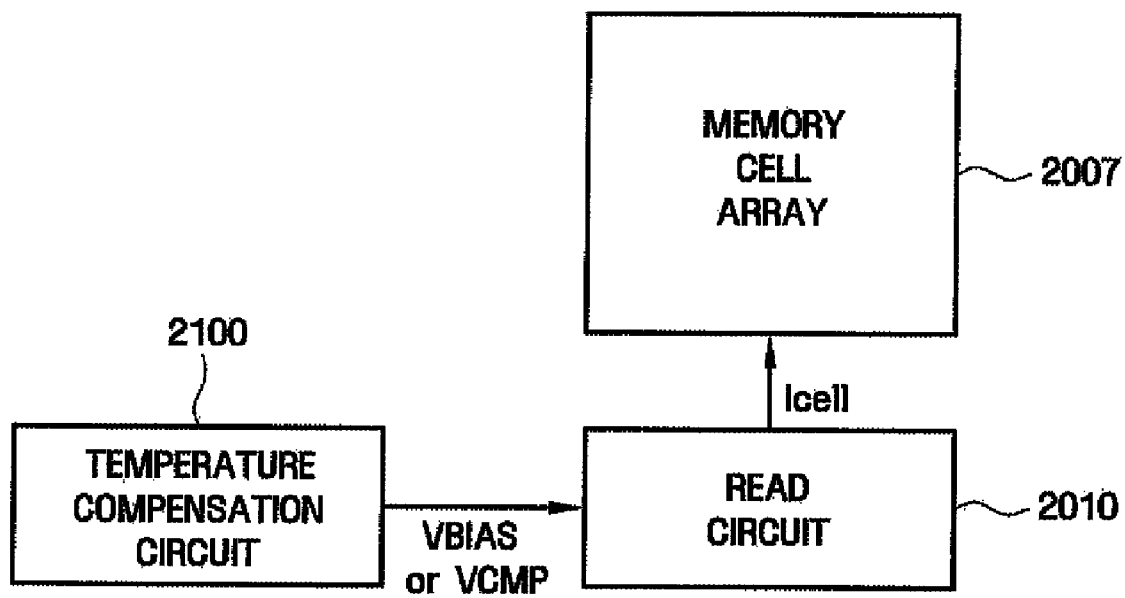
FIG. 13 is a block diagram of the nonvolatile memory device according to the fifth embodiment of the present invention.

FIG. 13 is a block diagram of the nonvolatile memory device according to the fifth embodiment of the present invention. In FIG. 13, a case where a read operation is performed using the resistance of the reference cells will be described based on the description made with reference to FIGS. 10A through 12.

Referring to FIG. 13, the nonvolatile memory device according to the fifth embodiment of the present invention includes a memory cell array 2007, a read circuit 2010, and a temperature compensation circuit 2100.

The memory cell array 2007 includes a plurality of nonvolatile memory cells. Each of the nonvolatile memory cells has resistance corresponding to any one of the first resistance distributions. That is, when the nonvolatile memory cells are single-level cells, each of the nonvolatile memory cells has the set resistance or the reset resistance. When the nonvolatile memory cells are multi-level cells, each of the nonvolatile memory cells has resistance corresponding to any one of the resistance distributions 00, 01, 10, and 11.

The temperature compensation circuit 2100 includes one or more reference cells. Each of the reference cells has resistance corresponding to any one of the second resistance distributions. That is, each of the reference cells may have the resistance distribution Ref1 as illustrated in FIG. 10A or may have any one of the resistance distributions Ref1 through Ref3 as illustrated in FIG. 10B.

Meanwhile, one or more reference cells may form a reference set. For example, the number of resistance distributions that the reference cells can have may be equal to the number of reference cells included in a reference set. When the nonvolatile memory cells are single-level cells, the reference cells may have one reference level Ref1. When the nonvolatile memory cells are multi-level cells (n bit-level cells), the reference cells may have $2^n-1$ resistance levels. Therefore, when the nonvolatile memory cells are single-level cells, one reference cell is included in a reference set. When the nonvolatile memory cells are multi-level cells (n bit-level cells), $2^n-1$ reference cells are included in the reference set. For example, referring to FIG. 10B, three ($=2^2-1$) reference cells may be included in a reference set. Consequently, when the nonvolatile memory cells are m bit-level cells ("m" is a natural number), $2^m-1$ reference cells are included in the same reference set.

The $2^m-1$ reference cells included in the same reference set may respectively have resistances corresponding to different resistance distributions. For example, when the nonvolatile memory cells are 2 bit-level cells, three reference cells may be included in the same reference set. Here, the three reference cells may respectively have resistances corresponding to different resistance distributions, i.e., Ref1 through Ref3.

The temperature compensation circuit 2100 may generate a compensation control signal VBIAS or a clamp control signal VCMP that changes according to the resistance of the reference cells. As described above with reference to FIGS. 11 and 12, the resistance of the reference cells changes according to temperature. Accordingly, the compensation control signal VBIAS or the clamp control signal VCMP also changes according to temperature. The detailed configuration and operation of the temperature compensation circuit 2100 will be described later with reference to FIGS. 14 through 18.

Figure 14:
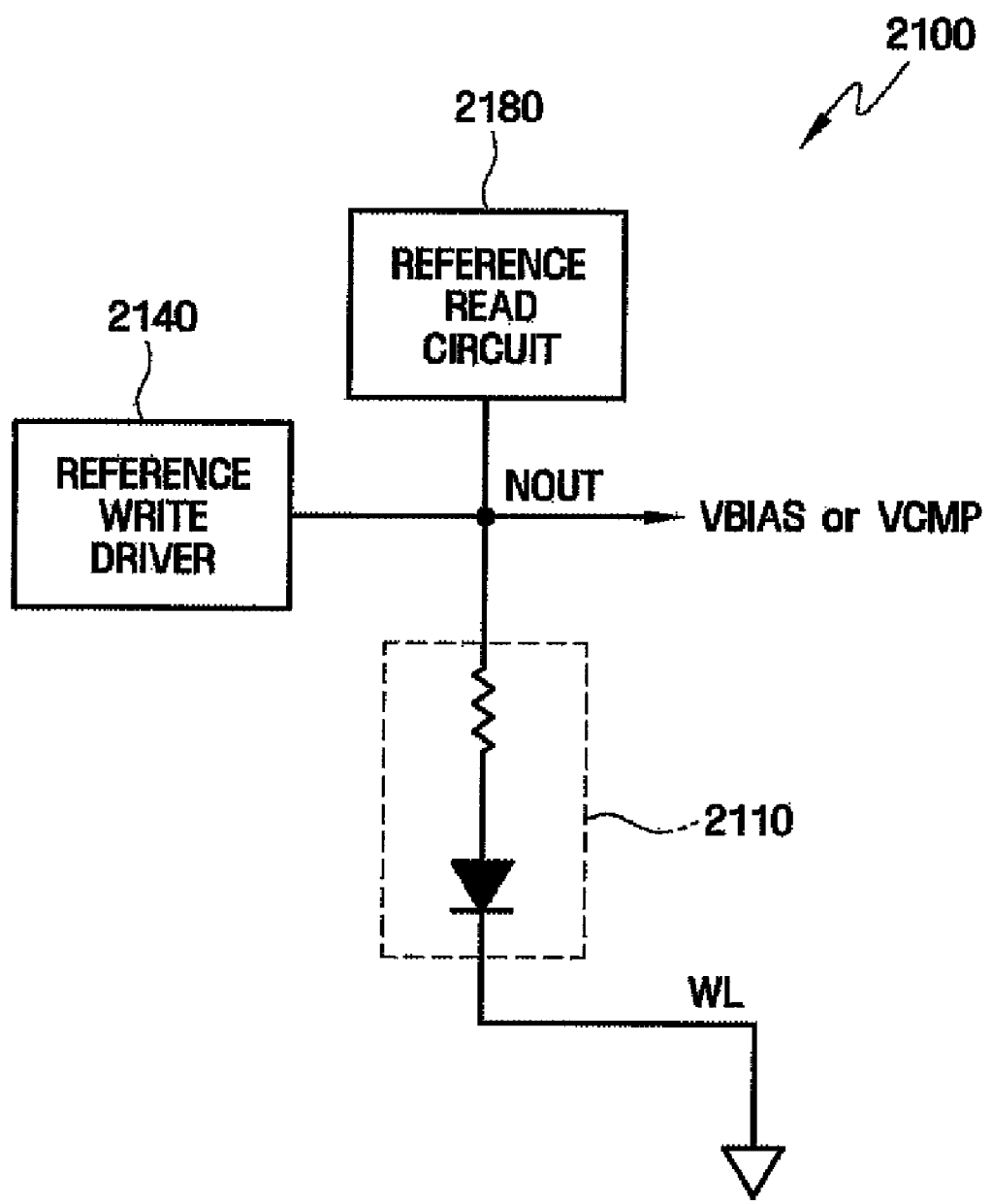
FIG. 14 is an exemplary block diagram of the temperature compensation circuit 2100 illustrated in FIG. 13.

FIG. 14 is an exemplary block diagram of the temperature compensation circuit 2100 illustrated in FIG. 13.

Referring to FIG. 14, the temperature compensation circuit 2100 includes a reference cell 2110, a reference write driver 2140, a reference read circuit 2180, and an output node NOUT.

The reference write driver 2140 is connected to the output node NOUT, supplies a write current to the reference cell 2110, and determines the resistance distribution of the reference cell 2110. The detailed structure of the reference write driver 2140 will be described later with reference to FIG. 15.

The reference read circuit 180 is connected to the output node NOUT, supplies a read current to the reference cell 2110, and reads the resistance distribution of the reference cell 2110. That is, the reference read circuit 2180 identifies whether the resistance (i.e., resistance distribution) of the reference cell 2110 is located at a desired position.

When the resistance distribution of the reference cell 2110 is not located at the desired position, the reference write driver 2140 supplies a write current again to the reference cell 2110 and determines the resistance distribution of the reference cell 2110. When the resistance distribution of the reference cell 2110 is located at the desired position, the compensation control signal VBIAS or the clamp control signal VCMP, which changes according to the resistance level of the reference cell 2110, is output through the output node NOUT.

The detailed structure of the reference read circuit 2180 will be described later with reference to FIGS. 16 through 18.

The reference write driver 2140 may be a replica circuit of a write driver which determines resistance distributions of the nonvolatile memory cells by supplying a write current to the nonvolatile memory cells. The reference read circuit 2180 may be a replica circuit of a read circuit (see FIG. 3) which reads the resistance distributions of the nonvolatile memory cells by supplying a read current to the nonvolatile memory cells. Since the reference cell 2110 is identical to each nonvolatile memory cell as described above, a change in the resistance of the reference cell 2110 according to temperature can fully reflect a change in the resistance of each nonvolatile memory cell according to temperature. Here, if the reference write driver 2140 and the reference read circuit 2180 are replica circuits, the resistance change of the reference cell 2110 according to temperature can more accurately reflect the resistance change of each nonvolatile memory cell according to temperature. However, the reference write driver 2140 and the reference read circuit 2180 are not limited to the replica circuits.

Figure 15:
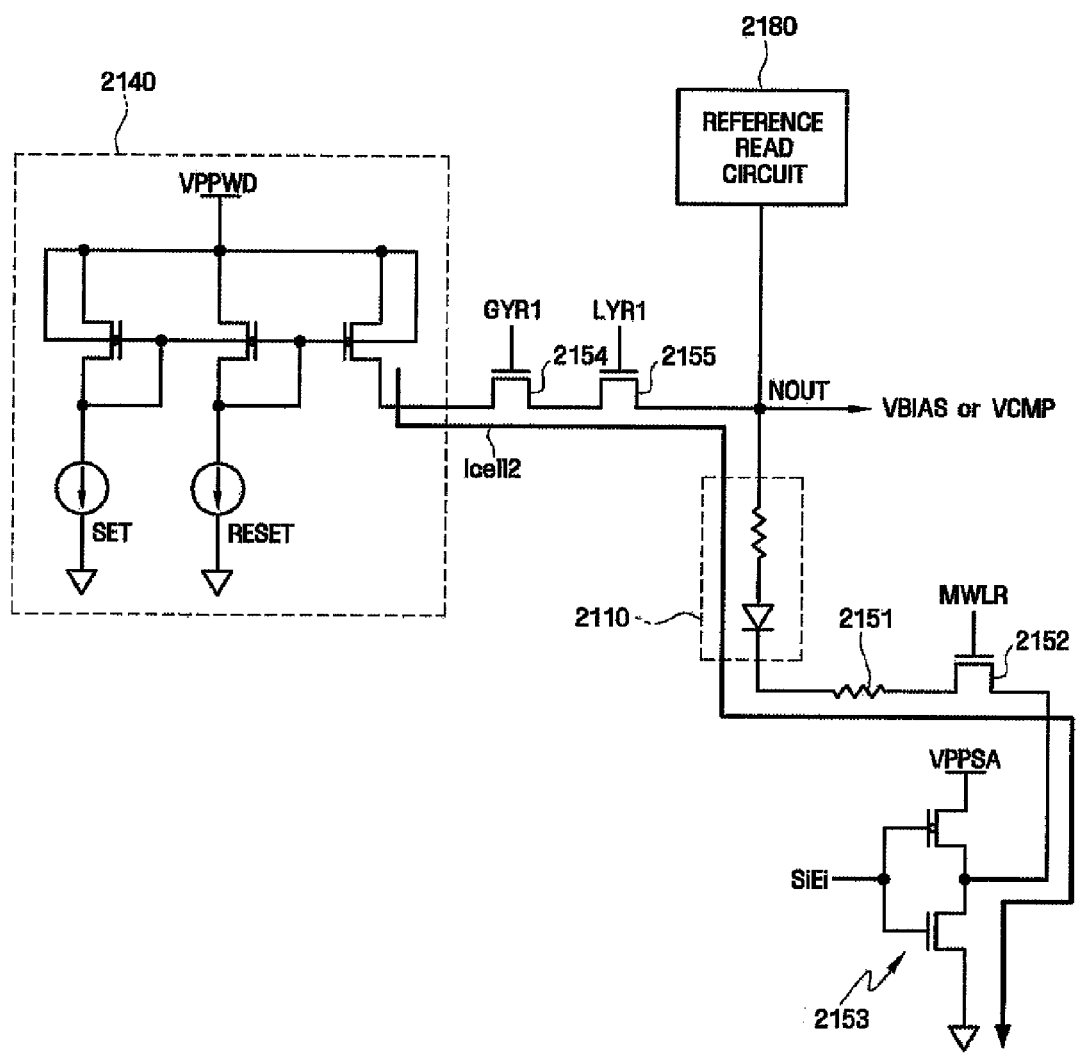
FIG. 15 is an exemplary circuit diagram of the reference write driver 2140 illustrated in FIG. 14 and a portion related to a write operation.

FIG. 15 is an exemplary circuit diagram of the reference write driver 2140 illustrated in FIG. 14 and a portion related to a write operation.

Referring to FIG. 15, the reference write driver 2140 supplies a write current Icell2 to write set data or reset data.

As illustrated in FIG. 15, the write current Icell2 is output to a ground source via a first transistor 2154, a second transistor 2155, the reference cell 2110, a first resistor 2151, a third transistor 2152, and then an inverter 2153.

Here, a global column select replica signal GYR1 is transmitted to the first transistor 2154, a row column select replica signal LYR1 is transmitted to the second transistor 2155, and a main word line replica signal MWLR is transmitted to the third transistor 2152. That is, the first transistor 2154 is a replica of a global column select circuit, the second transistor 2155 is a replica of a row column select circuit, and the third transistor 2152 is a replica of a main word line select circuit. In addition, the first resistor 2151 is a replica of a resistor in an active region of a substrate. A path of the write current Icell2 used to write the reference cell 2110 may be made identical to a path of a write current used to write a nonvolatile memory cell by configuring the first transistor 2154, the second transistor 2155, the first resistor 2151, the third transistor 2152, and the inverter 2153 as described above.

Figure 16:
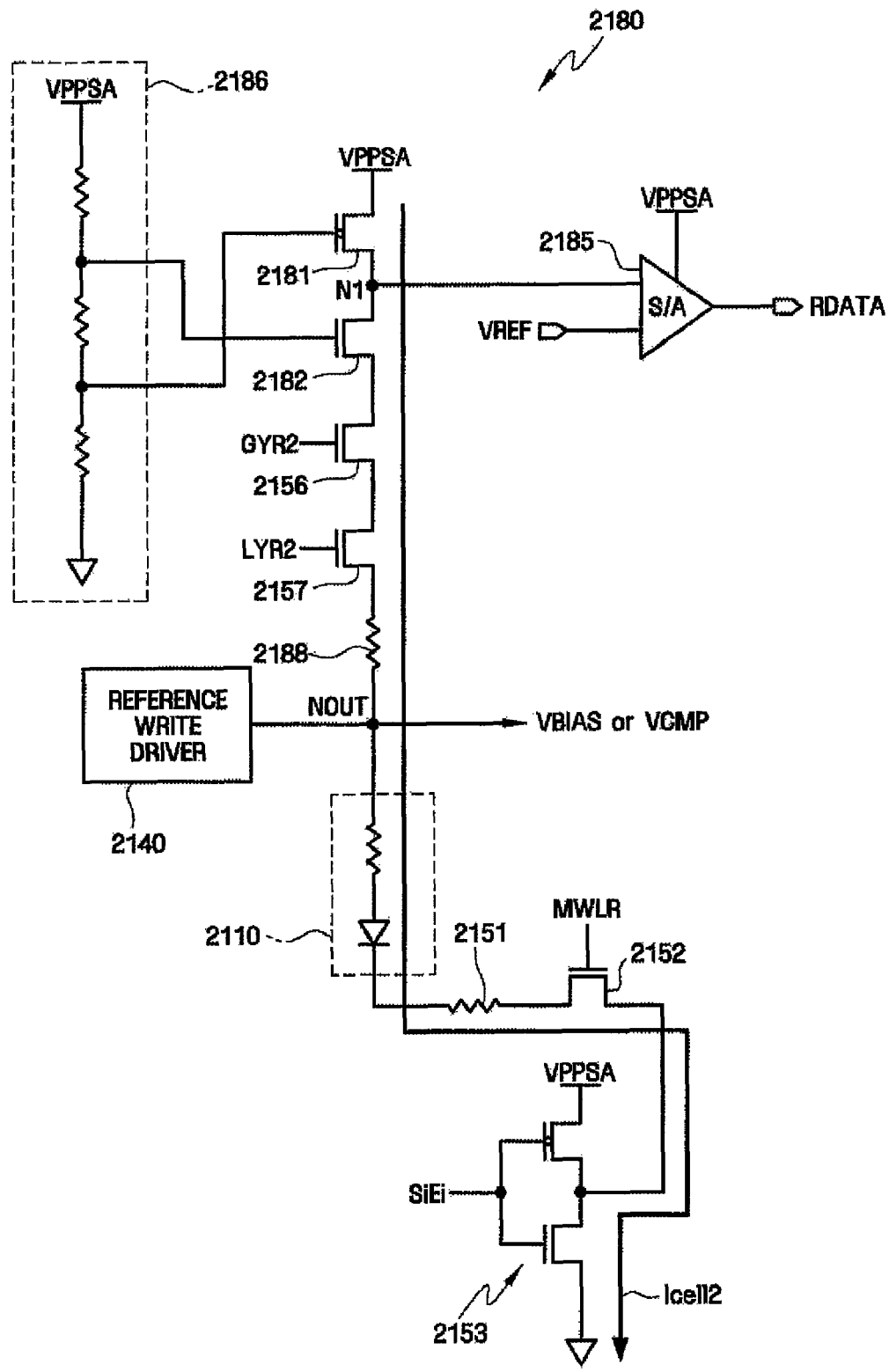
FIG. 16 is an exemplary circuit diagram of the reference read circuit 2180 illustrated in FIG. 14 and a portion related to a read operation.

FIG. 16 is an exemplary circuit diagram of the reference read circuit 2180 illustrated in FIG. 14 and a portion related to a read operation.

Referring to FIG. 16, the reference read circuit 2180 includes a fourth transistor 2181, a fifth transistor 2182, a sense amplifier 2185, a resistor string 2186, and a second resistor 2188.

The fourth transistor 2181 and the fifth transistor 2182 are connected in series between a step-up voltage source VPPSA and an output node NOUT. A plurality of resistors in the resistance string 2186 are connected in series between the step-up voltage source VPPSA and a ground source and provides a first voltage and a second voltage. The first voltage is applied to a gate of the fourth transistor 2181, and the second voltage is applied to a gate of the fifth transistor 2182. Here, the fourth transistor 2181 is a replica of the compensation unit 1014 (see FIG. 9B), and the fifth transistor 2182 is a replica of the clamping unit 1016 (see FIG. 9B). The second resistor 2188 is, but not limited to, a replica of a bit line.

As illustrated in FIG. 16, a read current Icell3 is output to the ground voltage source via the step-up voltage source VPPSA, the fourth transistor 2181, the fifth transistor 2182, a sixth transistor 2156, a seventh transistor 2157, the second resistor 2188, the reference cell 2110, the first resistor 2151, the third transistor 2152, and then the inverter 2153.

Here, a global column select replica signal GYR2 is transmitted to the sixth transistor 2156, and a local column select replica signal LYR2 is transmitted to the seventh transistor 2157. That is, the sixth transistor 2156 is a replica of a global column select circuit, and the seventh transistor 2157 is a replica of a local column select circuit. A path of the read current Icell3 used to read the reference cell 2110 may be made identical to a path of a read current used to read a nonvolatile memory cell by configuring the fourth transistor 2181, the fifth transistor 2182, the sixth transistor 2156, the seventh transistor 2157, the first resistor 2151, the third transistor 2152, and the inverter 2153 as described above.

The sense amplifier 2185 outputs reference data RDATA by comparing a node N1 and a reference voltage VREF. The reference data RDATA is read to determine whether the resistance of the reference cell 2110 has a desired value.

When the resistance of the reference cell 2110 does not have the desired value, a write operation is performed again.

When the resistance of the reference cell 2110 has the desired value, the compensation control signal VBIAS or the clamp control signal VCMP may be output through the output node NOUT. For example, the voltage of the output node NOUT may also be output as the compensation control signal VBIAS or the clamp control signal VCMP.

Alternatively, as will be described with reference to FIG. 18, the voltage of the output node NOUT may be adjusted through trimming, and the adjusted voltage of the output node NOUT may be output as the compensation control signal VBIAS or the clamp control signal VCMP.

Alternatively, the resistance of the second resistor 2188 may be controlled to adjust a voltage that is output to the output node NOUT. This is because the voltage output to the output node NOUT may be a voltage divided by the resistance of the second resistor 2188 and that of the reference cell 2110. Here, it is assumed that the resistances of the fourth transistor 2181, the fifth transistor 2182, the sixth transistor 2156, the seventh transistor 2157, and the third transistor 2152 are significantly small. Since the resistance of the reference cell 2110 will be determined by a write operation, if the resistance of the second resistor 2188 is adjusted in a manufacturing process, the voltage output to the output node NOUT can be easily adjusted.

Figure 17:
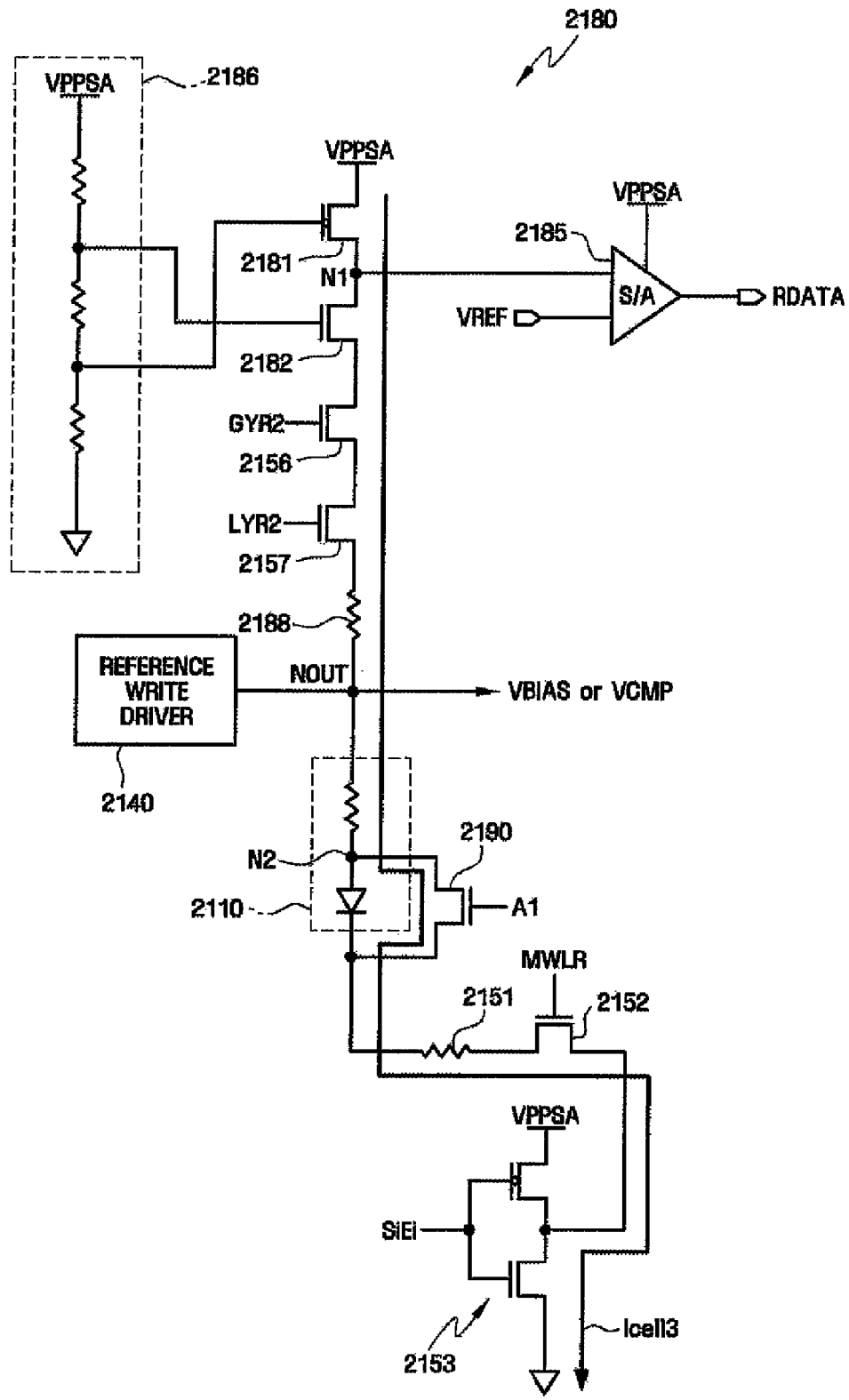
FIG. 17 is another exemplary circuit diagram of the reference read circuit 2180 illustrated in FIG. 14 and a portion related to a read operation.

FIG. 17 is another exemplary circuit diagram of the reference read circuit 2180 illustrated in FIG. 14 and a portion related to a read operation.

Referring to FIG. 17, the circuit of FIG. 17 is different from that of FIG. 16 in that it further includes a bypass circuit 2190. When a reference cell 2110 is read, the bypass circuit 2190 is turned on in response to a control signal A1. Therefore, while a read current Icell3 passes through a variable resistance element, it bypasses an access element (that is, a diode).

After the reference cell 2110 is read, if it is found out that the resistance of the reference cell 2110 does not have a desired value, the reference cell 2110 must be re-programmed. Thus, it is desirable to minimize the time required to read the reference cell 2110. The bypass circuit 2190 is implemented to reduce a period of time required by the read current Icell3 to pass through an n-type semiconductor of the diode, thereby reducing the total read time.

On the other hand, when a write operation is performed, the bypass circuit 2190 is turned off so that a current flows toward the access element (the diode).

Figure 18:
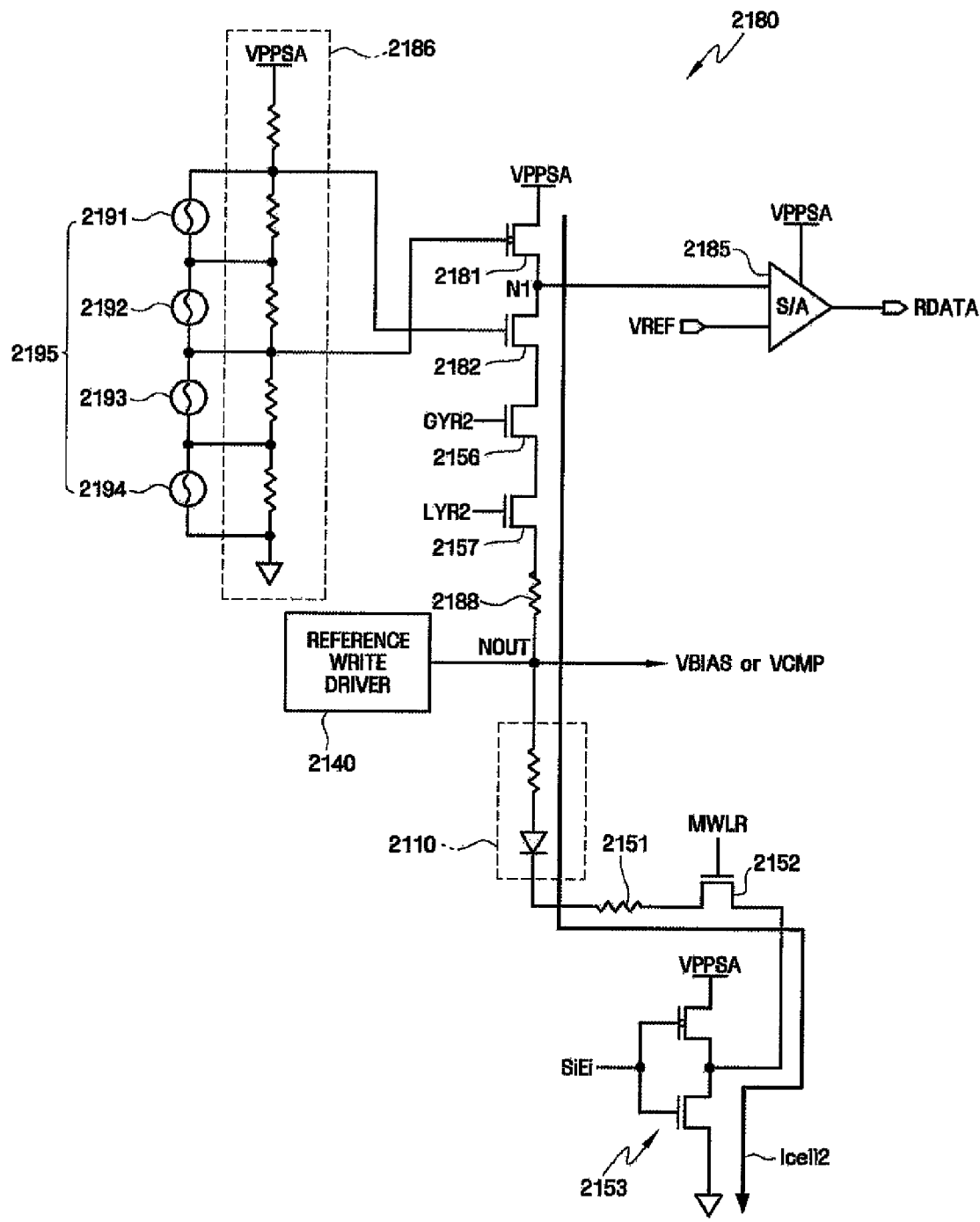
FIG. 18 is another exemplary circuit diagram of the reference read circuit 2180 illustrated in FIG. 14 and a portion related to a read operation.

FIG. 18 is another exemplary circuit diagram of the reference read circuit 2180 illustrated in FIG. 14 and a portion related to a read operation.

Referring to FIG. 18, the circuit of FIG. 18 is different from that of FIG. 16 in that it further includes a trimming circuit 2195. The trimming circuit 2195 may include a plurality of fuses 2191 through 2194.

At least one of the fuses 2191 through 2194 may be cut using a mode resister set (MRS) to adjust the level of voltage applied to a fourth transistor 2181 and a fifth transistor 2182.

A voltage value of a compensation control signal VBIAS or a clamp control signal VCMP output through an output node NOUT may be adjusted using the trimming circuit 2195. That is, even when the resistance of a reference cell 2110 has a desired value, if the voltage value of the compensation control signal VBIAS or the clamp control signal VCMP needs to be precisely adjusted, the trimming circuit 2195 can be used.

Figure 19:
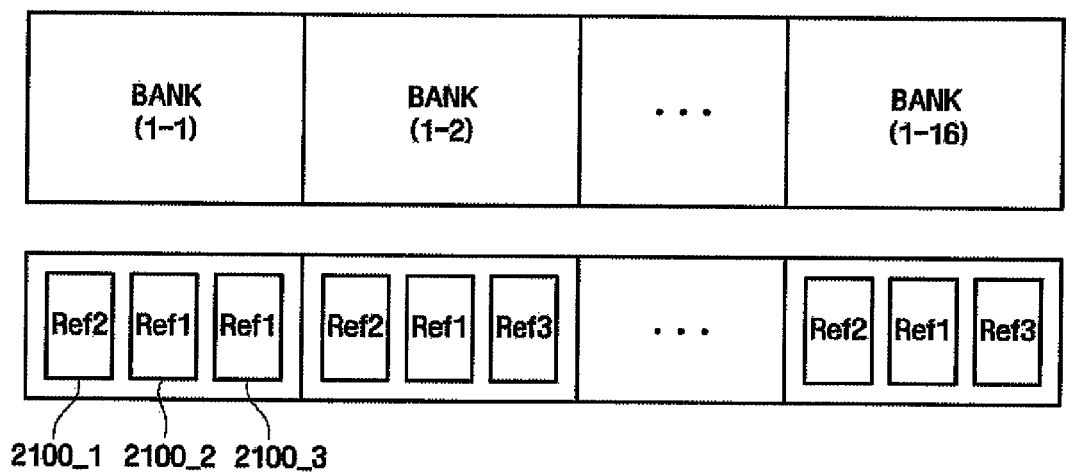
FIG. 19 is a diagram for explaining a nonvolatile memory device according to a sixth embodiment of the present invention.

FIG. 19 is a diagram for explaining a nonvolatile memory device according to a sixth embodiment of the present invention.

Referring to FIG. 19, a circuit of FIG. 19 is different from the circuit of FIG. 16 in that a plurality of reference sets are respectively disposed corresponding to a plurality of memory banks. As described above, when nonvolatile memory cells are 2 bit-level cells, there may be three ($=2^2-1$) reference cells, and each of the three reference cells may store a resistance value corresponding to one of resistance distributions Ref1 through Ref3. Therefore, as illustrated in FIG. 19, three temperature compensation circuits 2100_1 through 2100_3 may corresponds to each of the memory banks. Each of the three temperature compensation circuits 2100_1 through 2100_3 includes a corresponding one of the three reference cells.

Figure 20:
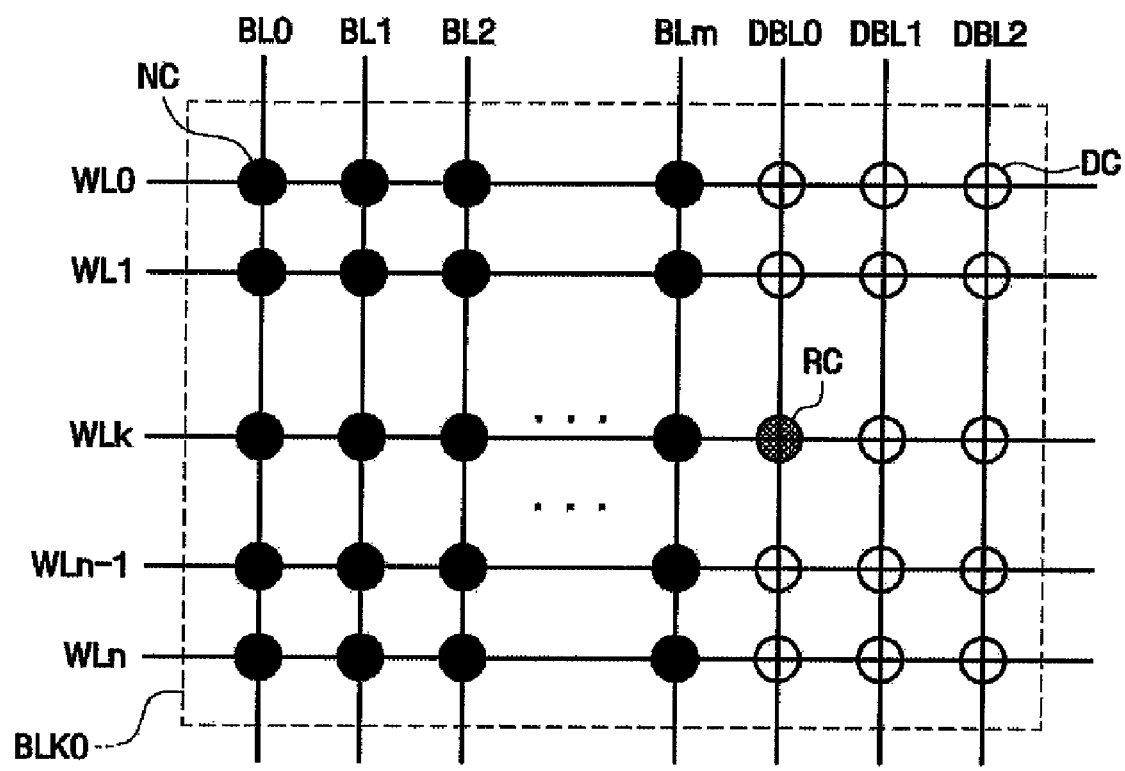
FIGS. 20 and 21 are diagrams for explaining nonvolatile memory devices according to sixth through eighth embodiments of the present invention.
Figure 21:
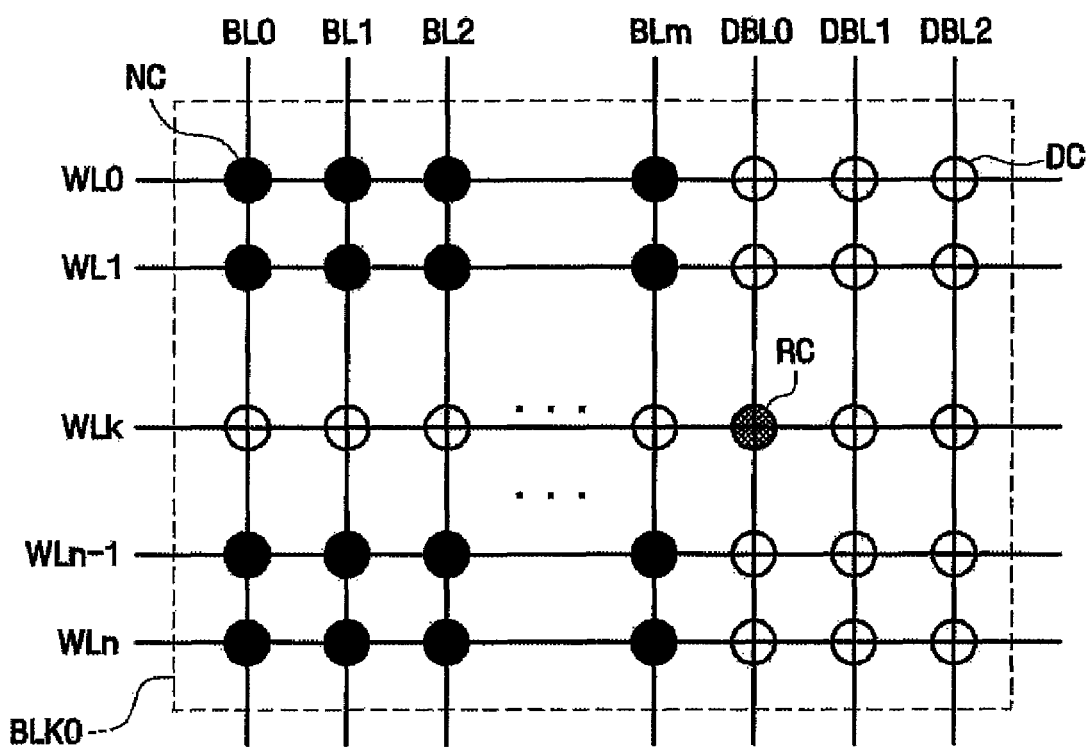

FIGS. 20 and 21 are diagrams for explaining nonvolatile memory devices according to sixth through eighth embodiments of the present invention. In FIGS. 20 and 21, a memory block BLK0 (see FIG. 1) is illustrated as an example, and the above-described reference cell is included in the memory block BLK0.

Referring to FIG. 20, normal memory cells NC are connected between word lines WL0 through WLn and bit lines BL0 through BLm. In addition, dummy memory cells DC are connected between dummy bit lines DBL0 through DBL2 and the word lines WL0 through WLn. A reference cell RC may be connected between the dummy bit line DBL0 and the word line WLk.

The normal memory cells NC are cells in which data is stored. The shape of the dummy memory cells DC may be identical to that of the normal memory cells NC. However, the dummy memory cells DC are cells in which no data is stored. As described above, the reference cell RC is a cell used to adjust the amount of compensation current or clamping current by reflecting temperature changes.

As illustrated in FIG. 20, the reference cell RC may be located approximately in the middle of the dummy bit line DBL0 to prevent edge loading.

Referring to FIG. 21, the normal memory cells NC may not be connected to the word line WLk that is connected to the reference cell RC. That is, only the dummy memory cells DC in addition to the reference cell RC may be connected to the word line WLk.

Whenever data stored in all normal memory cells NC in the memory block BLK0 is read, the reference cell RC may also be read. Accordingly, the word line WLk connected to the reference cell RC is often connected to a ground source. Thus, if the normal memory cells NC were connected to the word line WLk, they may be adversely affected. For this reason, the normal memory cells NC in FIG. 21 may not be connected to the word line WLk that is connected to the reference cell RC.

Figure 22:
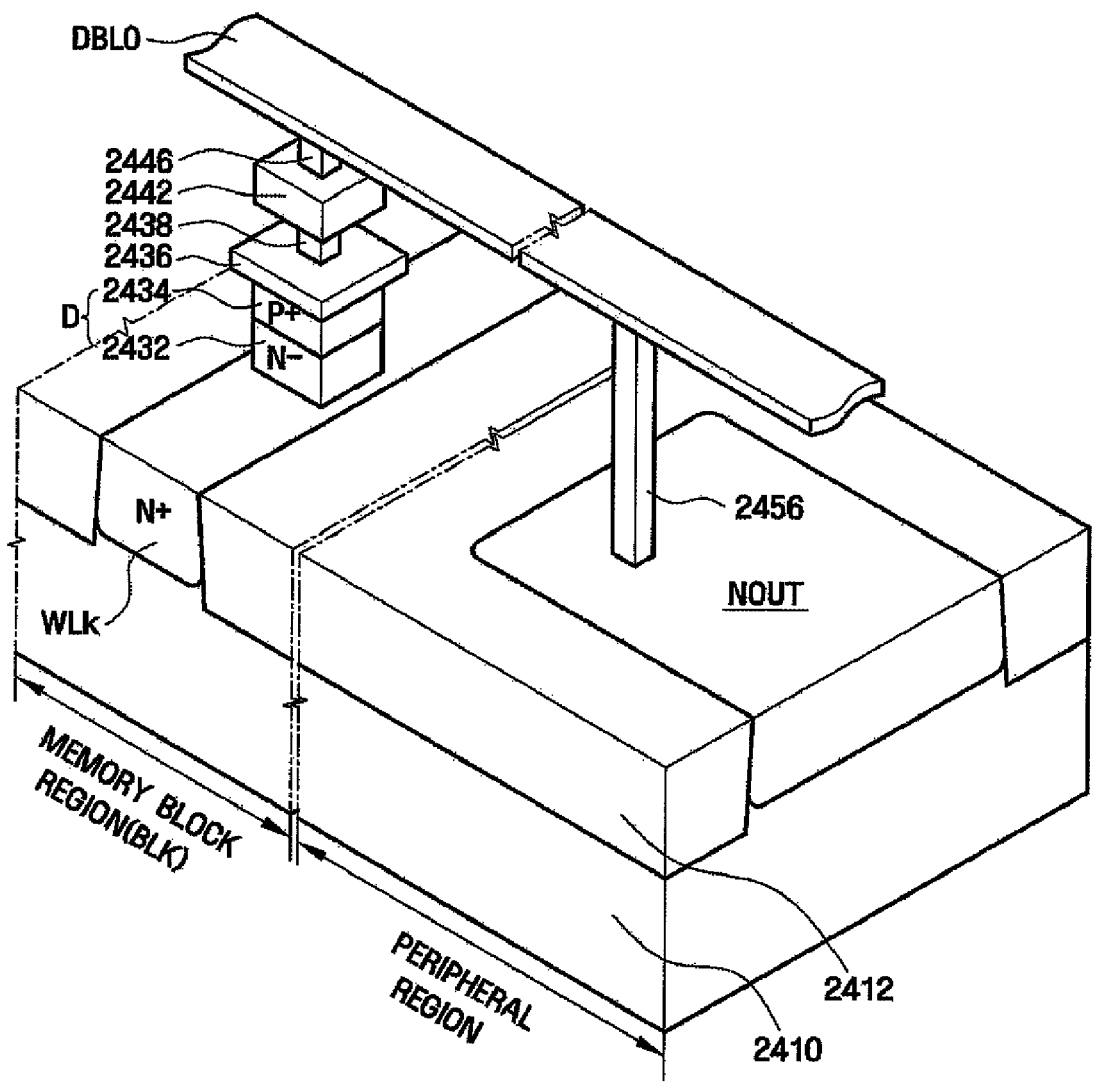
FIG. 22 is a perspective view of a nonvolatile memory device according to a ninth embodiment of the present invention.
Figure 23:
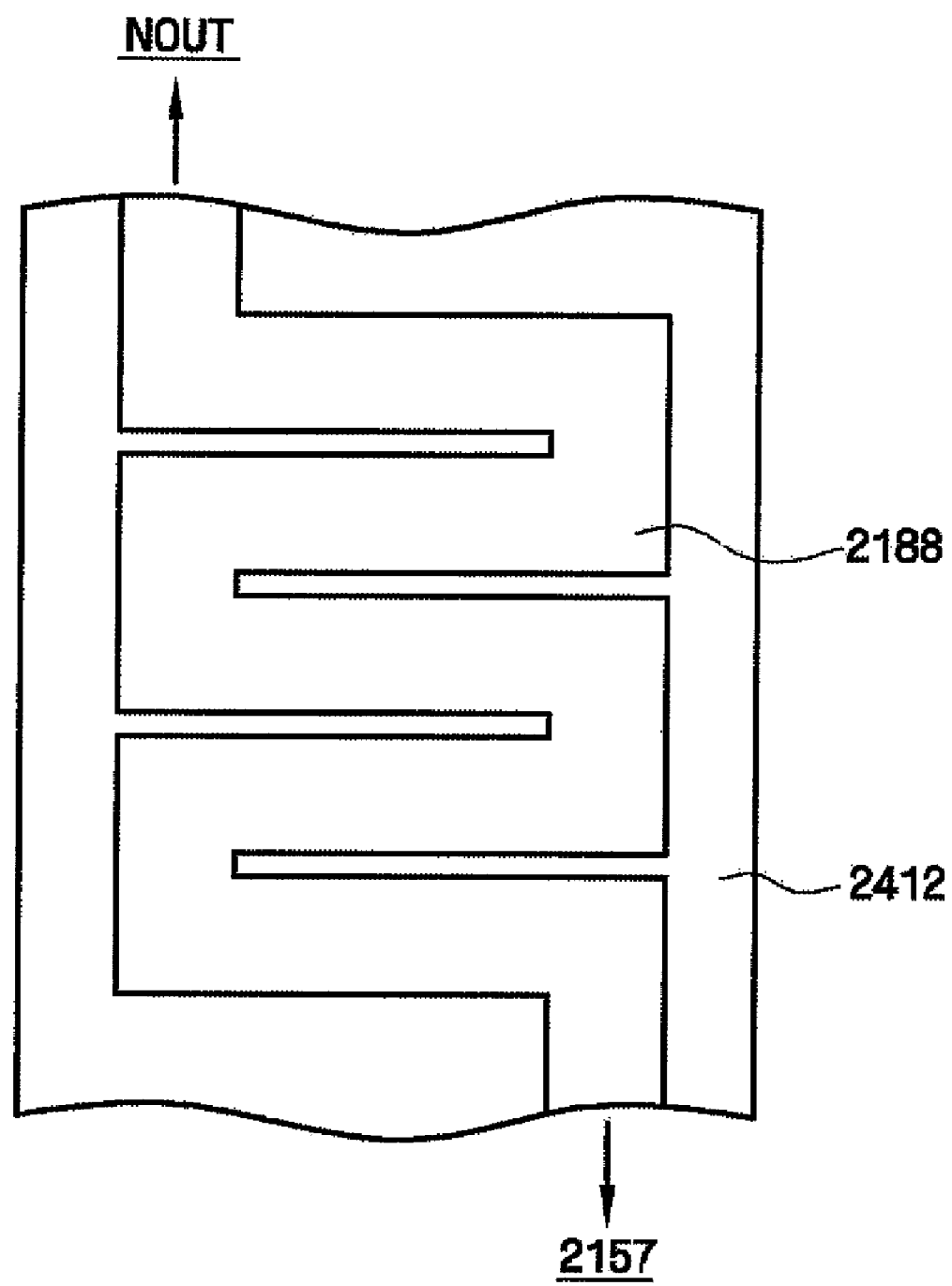
FIG. 23 is a layout diagram of a second resistor 2188 included in the nonvolatile memory device according to the ninth embodiment of the present invention.

FIG. 22 is a perspective view of a nonvolatile memory device according to a ninth embodiment of the present invention. FIG. 23 is a layout diagram of a second resistor 2188 included in the nonvolatile memory device according to the ninth embodiment of the present invention.

Referring to FIG. 22, when a reference cell RC is disposed within a memory block BLK0 as described above with reference to FIGS. 20 and 21, a reference write driver 2140 and a reference read circuit 2180 may be disposed in a peripheral region.

Specifically, an element isolation region 2412 is formed on a substrate 2410 of a first conductivity type (e.g., a P type) to define a plurality of active regions. For example, an active region formed in the memory block BLK0 may extend in a first direction. The active region formed in the memory block BLK0 may be implanted with impurities of a second conductivity type (e.g., an N type) to form a word line WLk. The substrate 2410 may be a silicon substrate, a silicon-on-insulator (SOI) substrate, a gallium arsenic substrate, a silicon germanium substrate, or the like.

A method of forming the word line WLk by implanting the substrate 2410 of the first conductivity type with the impurities of the second conductivity type has been described above. However, the present invention is not limited to this method. For example, the word line WLk may also be formed by epitaxial growth on the substrate 2410.

A first semiconductor pattern 2432 and a second semiconductor pattern 2434 are formed on the word line WLk to form a diode D. To form the first and second semiconductor patterns 2432 and 2434, for example, a mold pattern may be formed on the substrate 2410, and then a semiconductor pattern may be formed along the mold pattern using selective epitaxial growth or solid phase epitaxial (SPE) growth. Then, an ion implantation process may be performed.

An ohmic contact layer 2436 is formed on the diode D. The ohmic contact layer 2436 may be made of metal such as tungsten. In addition, the ohmic contact layer 2436 may be formed by physical vapor deposition (PVD), chemical vapor deposition (CVD), atomic layer deposition (ALD), or the like.

A bottom electrode contact 2438 is formed on the ohmic contact layer 2436. The bottom electrode contact 2438 may be made of a material selected from TiN, TiAlN, TaN, WN, MoN, NbN, TiSiN, TiBN, ZrSiN, WSiN, WBN, ZrAlN, MoAlN, TaSiN, TaAlN, TiW, TiAl, TiON, TiAlON, WON, and TaON.

A phase-change material 2442 is formed on the bottom electrode contact 2438.

A top electrode contact 2446 is formed on the phase-change material 2442. The top electrode contact 2446 may be omitted when necessary.

A dummy bit line DBL0 is formed on the top electrode contact 2446 and extends in a second direction which is different from the first direction. That is, the word line WLk and the dummy bit line DBL0 may intersect each other. The dummy bit line DBL0 may extend up to the peripheral region. The dummy bit line DBL0 may contain aluminum, copper, or the like. For example, the dummy bit line DBL0 may be a lowest metal wiring layer.

A specified active region (a region corresponding to an output node NOUT) in the peripheral region may be connected to the dummy bit line DBL0 by a contact 2456. Alternatively, the contact 2456 may include a plurality of contacts that are stacked in a vertical direction.

The second resistor 2188 may be implemented in various ways. For example, referring to FIG. 23, the second resistor 2188 may be implemented by forming an active region in a zigzag pattern in the substrate 2410. That is, the second resistor 2188 may be implemented in an active region between a region in which the output node NOUT is implemented and a region in which a seventh transistor 2157 is to be formed. When this zigzag pattern is repeated a number of times, a physical length of the active region can be increased. Thus, the resistance of the second resistor 2188 can be easily adjusted.

Figure 24:
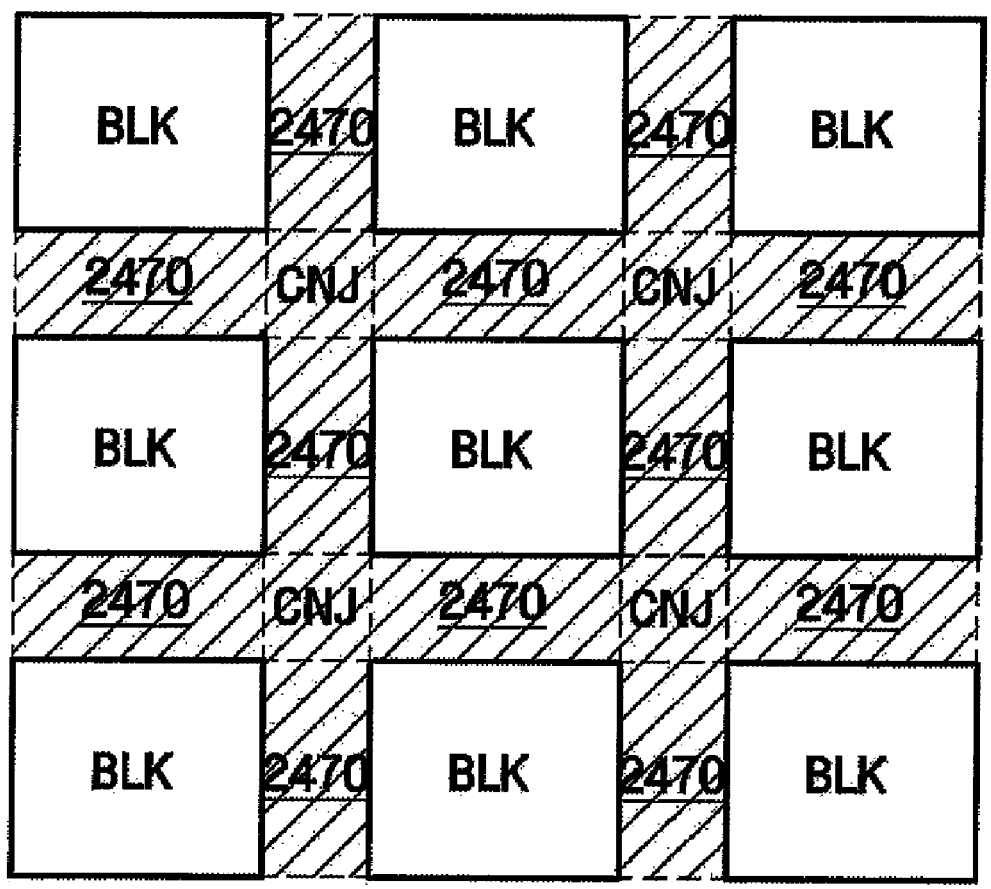
FIG. 24 is a layout diagram of a nonvolatile memory device according to a tenth embodiment of the present invention.
Figure 25:
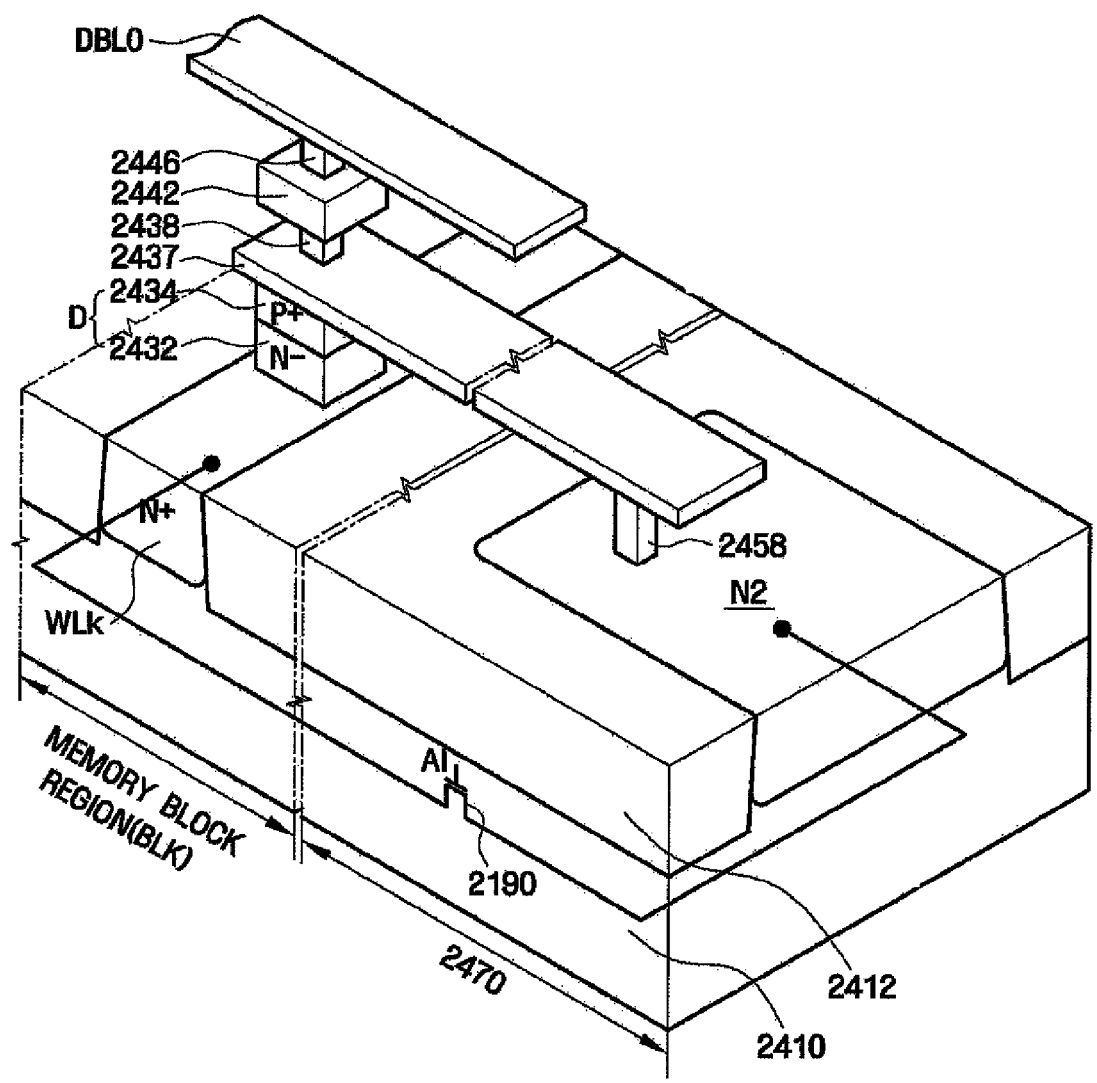
FIG. 25 is a perspective view of the nonvolatile memory device according to the tenth embodiment of the present invention.

FIG. 24 is a layout diagram of a nonvolatile memory device according to a tenth embodiment of the present invention. FIG. 25 is a perspective view of the nonvolatile memory device according to the tenth embodiment of the present invention. The illustrations in FIGS. 24 and 25 may be for implementing the circuit (which further includes the bypass circuit 2190) illustrated in FIG. 14.

Referring to FIG. 24, a plurality of memory blocks BLK are arranged in a 3×3 matrix. Regions 2470, in each of which a local column select circuit is disposed, may be located between the memory blocks BLK, and a conjunction region CNJ may be located between neighboring ones of the regions 2470.

In the tenth embodiment of the present invention, a reference cell RC may be disposed in each memory block BLK, and a bypass circuit 2190 may be disposed in each region 2470 in which the local column select circuit is located or in the conjunction region CNJ.

In FIG. 25, the bypass circuit 2190 is implemented in each region 2470. Referring to FIG. 25, an ohmic contact layer 2437 connected to the reference cell RC may extend from a memory block region to each of the regions 2470. A node N2 implemented in an active region, which is defined in each region 2470, and the ohmic contact layer 2437 are connected to each other by a contact 2458.

The bypass circuit 2190 is formed in each region 2470 and connected between the node N2 and the word line WLk.

Figure 26A:
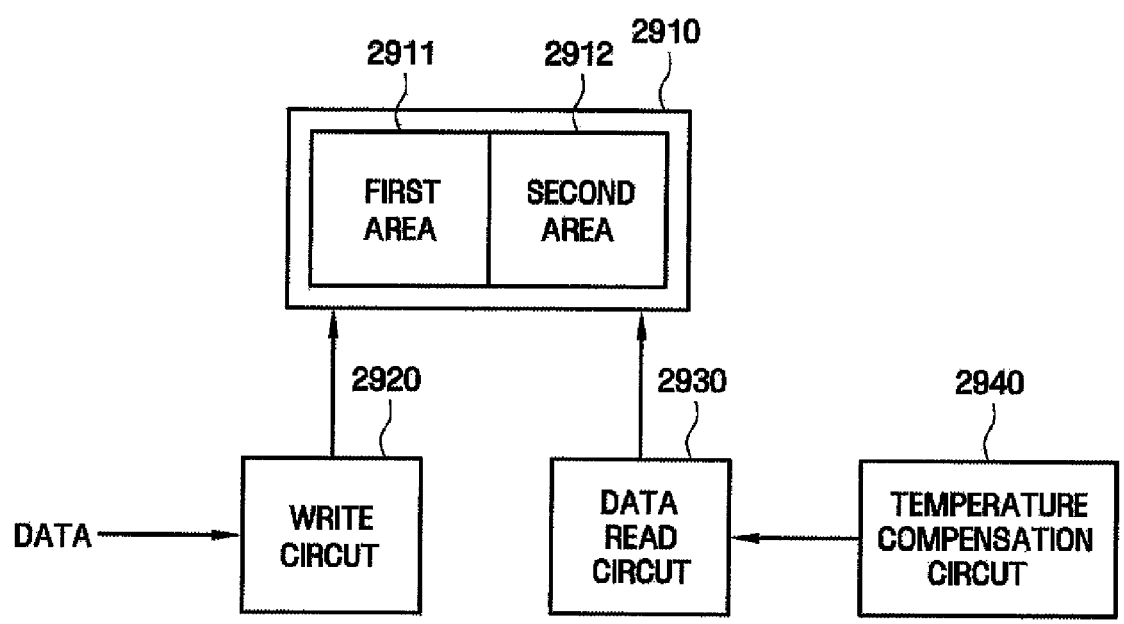
FIG. 26A is a diagram for explaining a variable resistance memory device according to an eleventh embodiment of the present invention.

FIG. 26A is a diagram for explaining a variable resistance memory device according to an eleventh embodiment of the present invention.

Referring to FIG. 26A, the variable resistance memory device may include a cell array 2910, a temperature compensation circuit 2940, a data read circuit 2930, and a write circuit 2920.

The memory cell array 2910 includes a plurality of resistance memory cells and is divided into a first area 2911 and a second area 2912 which are different from each other. That is, the memory cell array 2910 may be divided into a plurality of areas, depending on what it is used for. For example, the first area 2911 may have a shorter response time and a faster access time than the second area 2912. In addition, the first area 2911 may replace a main memory, and the second area 2912 may replace a hard disk drive (HDD).

As described above, the temperature compensation circuit 2940 may include one or more reference cells.

As described above, the data read circuit 2930 may perform a read operation by supplying a current, which changes according to the resistance of the reference cells, to one or more of the resistance memory cells.

The write circuit 2920 examines data provided by an external source and writes the data to the first area 2911 or the second area 2912 based on the examination result. The data provided by the external source may include a code, which indicates whether the data must be stored in the first area 2911 or the second area 2912, in a data header. Therefore, the write circuit 2920 may examine the code and determine whether to write the data to the first area 2911 or the second area 2912.

The second area 2912 may have a hierarchical structure described above in the first through fourth embodiments. The variable resistance memory device may include a global bit line, which is connected to a write circuit and a read circuit, one or more local bit lines, which are coupled to the resistance memory cells disposed in the second area 2912, and a plurality of column select transistors. Here, each of the column select transistors may selectively connect the global bit line to any one of the local bit lines.

The resistance of a column select transistor located farther from the write circuit 2920 and the read circuit 2930 may be smaller than that of a column select transistor located closer to the write circuit 2920 and the read circuit 2930. Alternatively, the column select transistor located farther from the write circuit 2920 and the read circuit 2930 may be larger than the column select transistor located closer to the write circuit 2920 and the read circuit 2930. The doping concentration of a channel region of the column select transistor located farther from the write circuit 2920 and the read circuit 2930 may be higher than that of a channel region of a column select transistor located closer to the write circuit 2920 and/or the read circuit 2930.

The first area 2911 or the second area 2912 may include a temperature compensation circuit which includes a reference cell and which has been described above in the fifth through tenth embodiments. Therefore, a read operation may be performed by supplying a current, which changes according to the resistance of one reference cell, to one or more of the resistance memory cells.

Figure 26B:
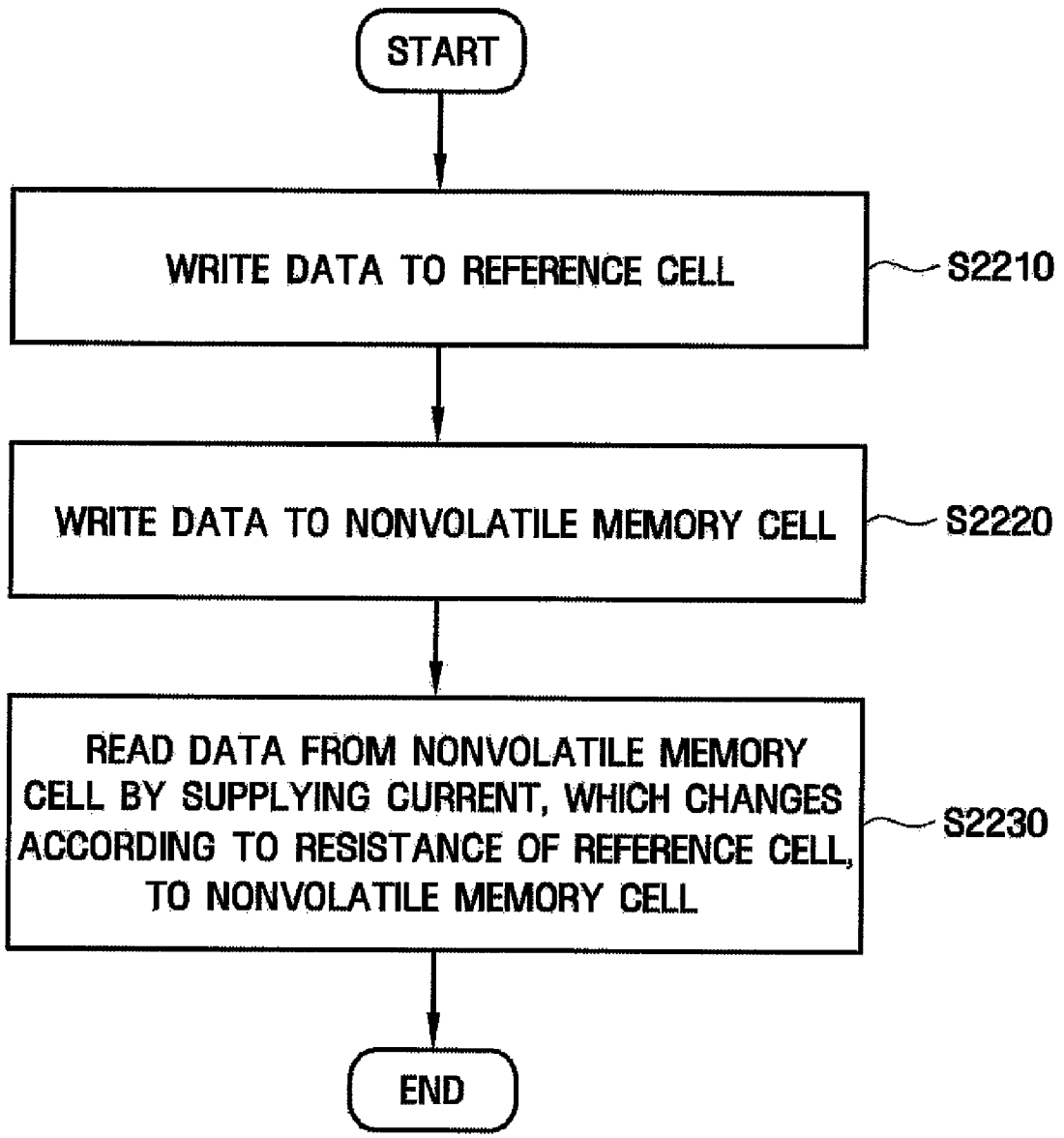
FIG. 26B is a flowchart illustrating a method of driving the nonvolatile memory devices according to the fifth and seventh embodiments of the present invention.

FIG. 26B is a flowchart illustrating a method of driving the nonvolatile memory devices according to the fifth and seventh embodiments of the present invention.

Referring to FIGS. 14 and 26B, a memory cell array, which includes m bit-level cells ("m" is a natural number), and a reference set, which includes $2^m-1$ reference cells, are provided.

The $2^m-1$ reference cells included in one reference set are written such that the $2^m-1$ reference cells respectively have different resistance distributions (operation S2210).

For example, when the m bit-level cells are 2 bit-level cells, there may be three ($=2^2-1$) reference cells, and the three reference cells may respectively store resistance values corresponding to resistance distributions Ref1 through Ref3.

Data is written to the m bit-level cells (operation S2220).

Then, a current, which changes according to the resistance of the $2^m-1$ reference cells, is supplied to the m bit-level cells to read data from the m bit-level cells (operation S2230).

For example, a compensation current, which changes according to a resistance value corresponding to each of the resistance distributions Ref1 through Ref3 sequentially, is supplied to the m bit-level cells in order to read data.

Application Embodiments

FIGS. 27 through 31 are diagrams for explaining storage systems according to first through fifth embodiments of the present invention. Specifically, FIGS. 27 through 31 illustrate storage systems using the nonvolatile memory devices according to the fifth through tenth embodiments of the present invention.

Figure 27:
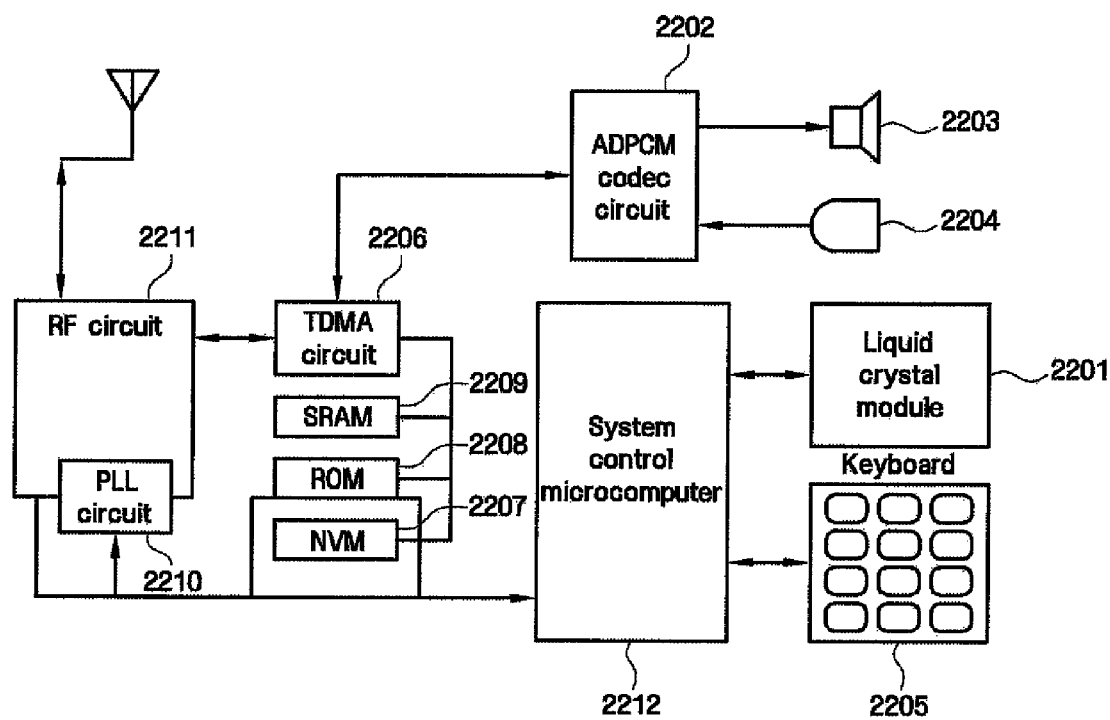
FIGS. 27 through 31 are examples of storage systems according to first through fifth embodiments of the present invention.

FIG. 27 is a diagram illustrating a cellular phone system that uses nonvolatile memory devices according to embodiments of the present invention.

Referring to FIG. 27, the cellular phone system may include an adaptive differential pulse code modulation (ADPCM) codec circuit 2202 which compresses sound or decompresses compressed sound, a speaker 203, a microphone 2204, a time division multiplex access (TDMA) circuit 2206 which time-division multiplexes digital data, a phase-locked loop (PLL) circuit 2210 which sets a carrier frequency of a wireless signal, and a radio frequency (RF) circuit 2211 which transmits or receives a wireless signal.

In addition, the cellular phone system may include various types of memory devices. For example, the cellular phone system may include a nonvolatile memory device 2207, a read only memory (ROM) 2208, and a static random access memory (SRAM) 2209. The nonvolatile memory device 2207 may be any one of the nonvolatile memory devices according to the embodiments of the present invention and may store, for example, an identification (ID) number. The ROM 2208 may store programs, and the SRAM 2209 may serve as a work area for a system control microcomputer 2212 or temporarily store data. The system control microcomputer 2212 is a processor and may control a write operation and a read operation of the nonvolatile memory device 2207.

Figure 28:
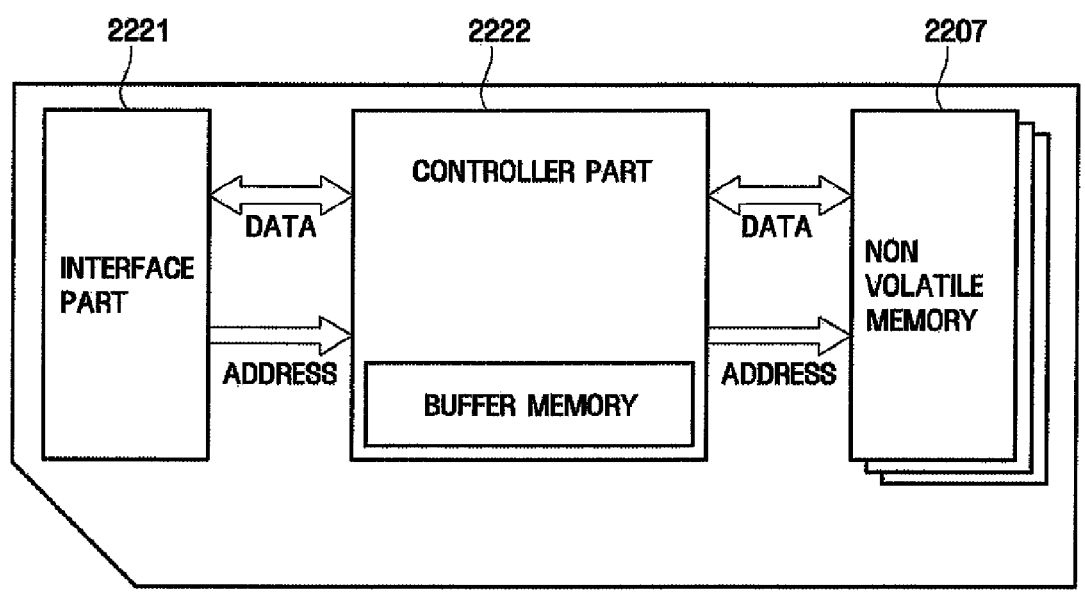

FIG. 28 is a diagram illustrating a memory card which uses nonvolatile memory devices according to embodiments of the present invention. The memory card may be, for example, a multimedia card (MMC), a secure digital (SD) card, a multi-use card, a micro SD card, a memory stick, a compact SD card, an ID card, a personal computer memory card international association (PCMCIA) card, a solid-state drive (SSD) card, a chip card, a smart card, or a universal serial bus (USB) card.

Referring to FIG. 28, the memory card may include an interface part 2221 which interfaces with an external device, a controller part 2222 which includes a buffer memory and controls the operation of the memory card, and one or more nonvolatile memories 2207 according to embodiments of the present invention. The controller part 2222 is a processor and may control the write and read operations of the nonvolatile memories 2207. Specifically, the controller part 2222 is coupled to each of the interface part 2221 and the nonvolatile memory devices 2207 by a data bus DATA and an address bus ADDRESS.

Figure 29:
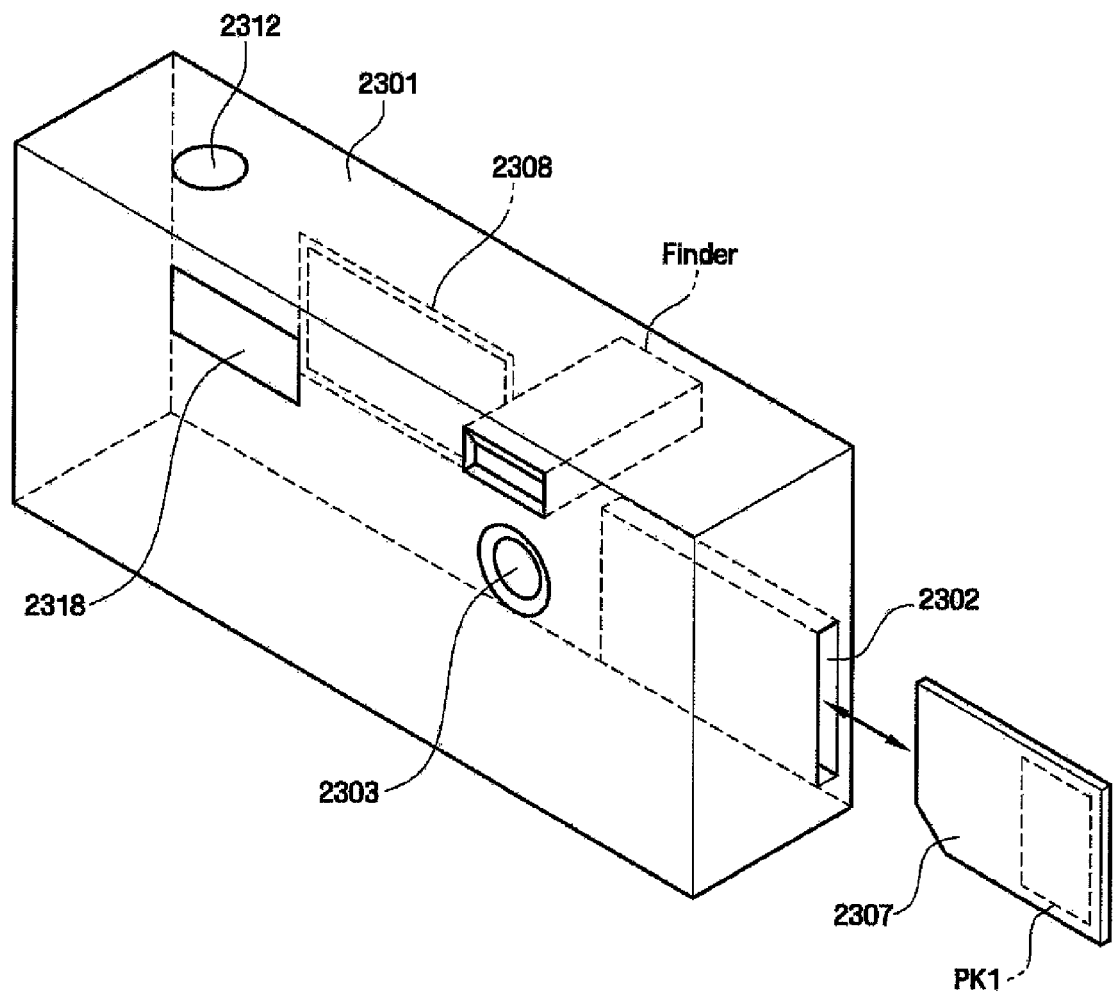

FIG. 29 is a diagram illustrating a digital still camera that uses nonvolatile memory devices according to embodiments of the present invention.

Referring to FIG. 29, the digital still camera includes a body 2301, a slot 2302, a lens 2303, a display 2308, a shutter button 2312, and a strobe 2318. In particular, a memory card 2307 may be inserted into the slot 2302 and include one or more nonvolatile memory devices PK1 according to embodiments of the present invention.

If the memory card 2307 is of a contact type, it electrically contacts a specified electrical circuit on a circuit board when it is inserted into the slot 2302. When the memory card 2331 is of a non-contact type, it communicates with the memory card 2307 using a wireless signal.

Figure 30:
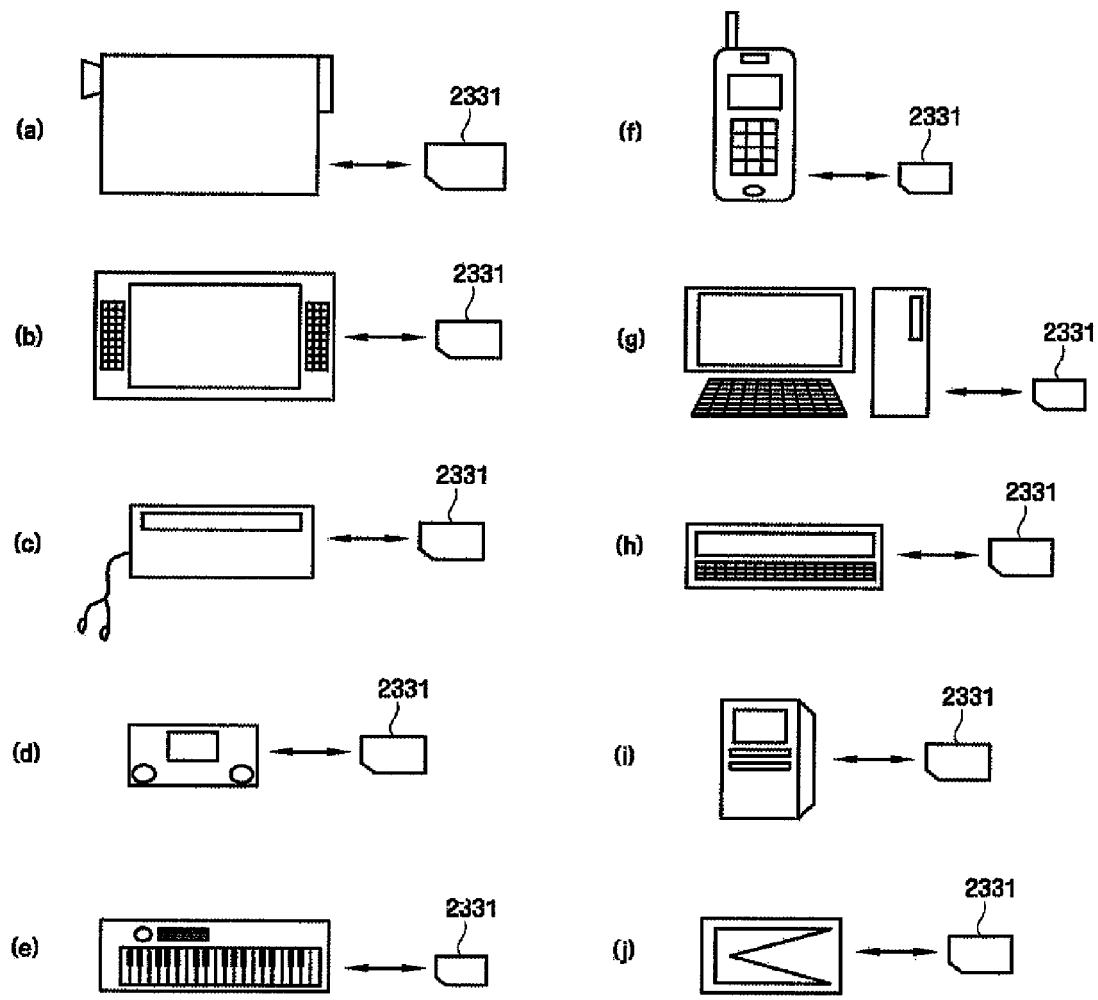

FIG. 30 is a diagram illustrating various systems that use the memory card of FIG. 28.

Referring to FIG. 30, a memory card 2331 may be used in (a) a video camera, (b) a television, (c) an audio device, (d) a game device, (e) an electronic music device, (f) a mobile phone, (g) a computer, (h) a personal digital assistant (PDA), (i) a voice recorder, and (j) a personal computer (PC) card.

Figure 31:
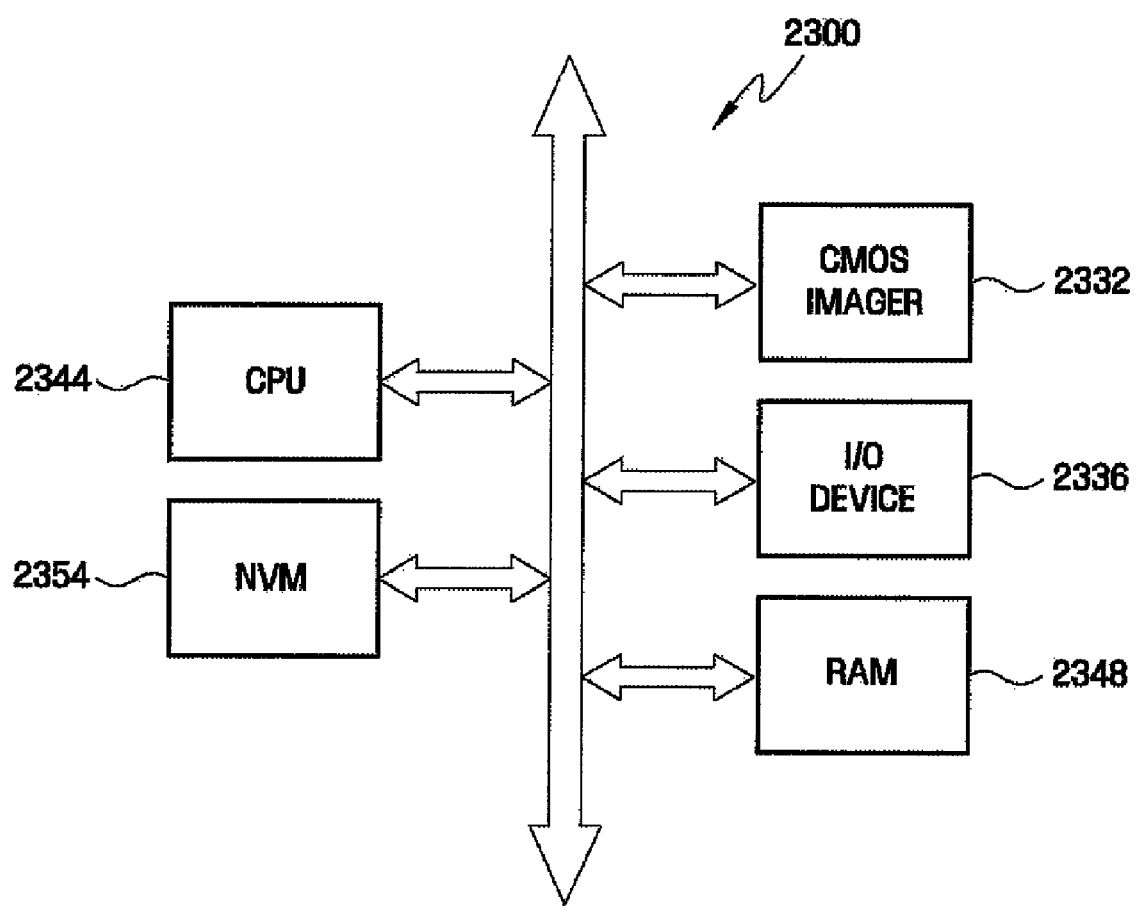

FIG. 31 is a diagram illustrating an image sensor system that uses nonvolatile memory devices according to embodiments of the present invention.

Referring to FIG. 31, the image sensor system may include an imager 2332, an input/output device 2336, a random access memory (RAM) 2348, a central processing unit (CPU) 2344, and a nonvolatile memory device 2354 according to embodiments of the present invention. These components, i.e., the imager 2332, the input/output device 2336, the RAM 2348, the CPU 2344, and the nonvolatile memory device 2354 communicate with each other using a bus 2352. The imager 2332 may include a photo sensing element such as a photogate or a photodiode. Each of the above components and a processor may be implemented as a single chip or separate chips.

Figure 32:
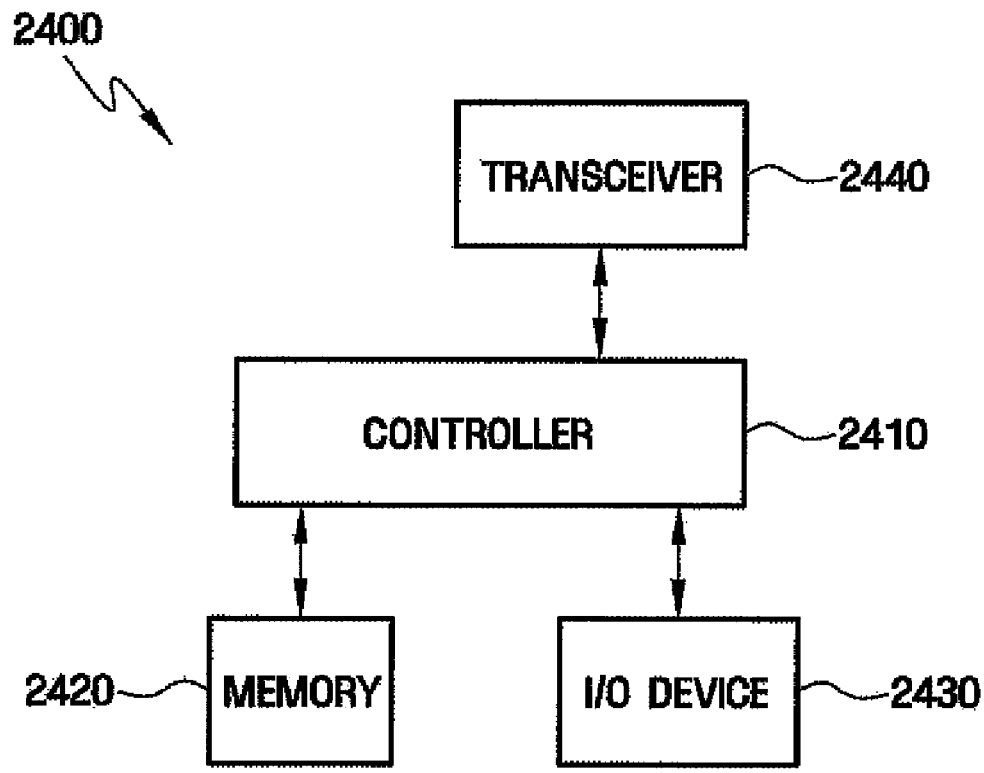
FIG. 32 is a schematic block diagram of a portable media system including phase-change random access memory device according to embodiments of the present invention.

FIG. 32 is a schematic block diagram of a portable media system including phase-change random access memory device according to embodiments of the present invention. In an embodiment of the present invention, a mobile phone as the portable media system is described by way of example, but the invention is not limited thereto. Rather, the invention may also be applied to a two-way communications system, a one-way pager, a two-way pager, a personal communications system, a portable computer, a personal data assistance (PDA), an MPEG audio layer-3 (MP3) player, a digital camera, and other electronic devices.

Referring to FIG. 32, the portable media system 2400 includes a controller 2410, a memory 2420, an I/O device 2430, and a transceiver 2440.

The controller 2410 may, for example, include microprocessors, digital signal processors, microcontrollers, and the like.

The memory 2420 stores messages transmitted to the portable media system 400 or an external device. That is, the memory 2420 stores data or instructions executed by the controller 2410 while the portable media system 2400 is operating. The memory 2420 is composed of one or more different kinds of memories. For example, the memory 2420 may be a volatile memory device, or a nonvolatile memory device such as a flash memory device and/or a phase-change memory device. Here, usable examples of the phase-change memory device include PRAMs according to embodiments of the present invention.

In particular, a challenge of the portable media system 2400 is to minimize the amount of current consumed. As described in the foregoing embodiments of the present invention, the current and power consumption can be minimized by decreasing resistance of a column select transistor in a phase-change memory cell farther away from a write and/or read circuit, thereby improving reliability during write and/or read operation.

The portable media system 2400 may transmit or receive messages in a wireless manner through the transceiver 2440 connected to an antenna (not shown). Here, the portable media system 2400 may transmit or receive messages using protocols such as CDMA (Code Division Multiple Access), GSM (Global System for Mobile communication), NADC (North American Digital Cellular), TDMA (Time Division Multiple Access), ETDMA (Extended TDMA), third-generation WCDMA (Wideband CDMA), CDMA-2000, etc.

The I/O device 2430 generates a message by user's manipulation. The I/O device 2430 may comprise a keypad, a monitor, and the like.

A phase-change random access memory device of the present invention provides at least one of the following advantages. First, the phase-change random access memory device is able to prevent failures during write and/or read operations. Second, the phase-change random access memory device provides a phase-change memory cell in which a reset state can be written reliably, and whereby the resistance margins of the phase-change memory cells increase by reducing a distribution of set resistance, which improves the reliability of phase-change memory cells. Third, the phase-change random access memory device can decrease the level of write current and/or read current, thereby reducing current consumption.

Figure 33:
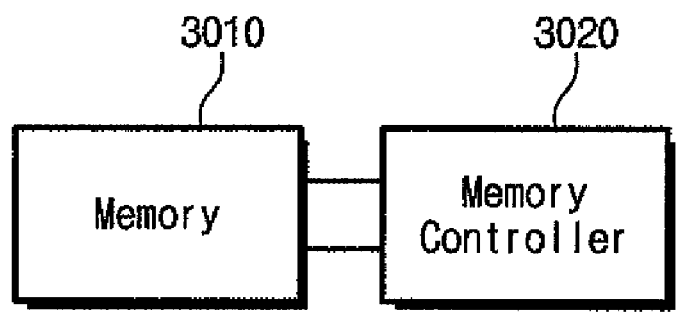
FIG. 33 through FIG. 40 illustrate examples of applications of the semiconductor device according to embodiments of the present invention.

FIG. 33 illustrates an example embodiment of an application of the semiconductor device. As shown, this embodiment includes a memory 3010 connected to a memory controller 3020. The memory 3010 may be any of the semiconductor device embodiments described above. The memory controller 3020 supplies the input signals for controlling operation of the memory 3010. For example, the memory controller 3020 supplies the command CMD and address signals. The memory controller 3020 may include a memory interface, a host interface, an ECC circuit, a central processing unit (CPU), and a buffer memory. The memory interface provides data transmitted from the buffer memory to the memory 3010 or transmits data read out of the memory 3010 to the buffer memory. Also the memory interface may provide a command or an address transmitted from an external host to the memory 3010.

The host interface may communicate with an external host through USB (Universal Serial Bus), SCSI (Small Computer System Interface), PCI express, ATA, PATA (Parallel ATA), SATA (Serial ATA), or SAS (Serial Attached SCSI), for example.

A memory system according to embodiments of the present invention may include an ECC circuit, which generates a parity bit using data transmitted to the memory 3010. The generated parity bit may be stored in a specific area of the memory 3010, together with data. The ECC circuit detects an error of data read out of the memory 3010. If the detected error is within a correction range, the ECC circuit corrects the detected error.

The CPU processes a signal input from the external host after analyzing the input signal. The CPU controls the external host or the memory 3010 through the host interface or the memory interface. The CPU may control write, read, and erase operations depending on firmware for driving a memory.

The buffer memory temporarily stores write data provided from the external host or data read out of the memory 3010. Also the buffer memory may store meta data or cache data to be stored in the memory 3010. During a sudden power-off operation, meta data or cache data stored in the buffer memory may be stored in the memory 3010. The buffer memory may include a DRAM and an SRAM.

Figure 34:
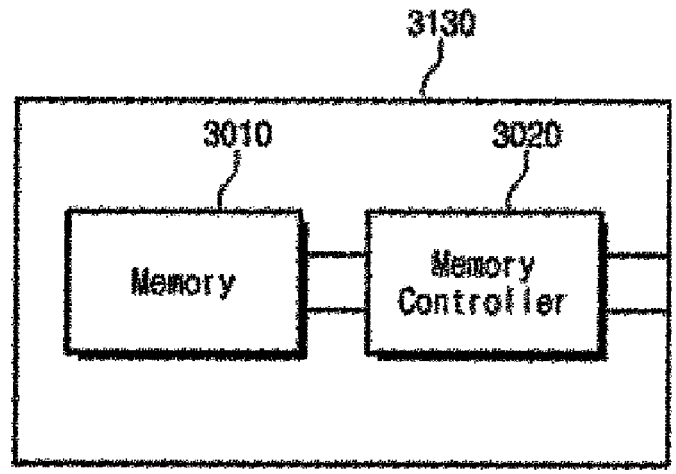

FIG. 34 illustrates yet another embodiment. This embodiment is the same as the embodiment of FIG. 33, except that the memory 3010 and memory controller 3020 have been embodied as a card 3130. For example, the card 3130 may be a memory card such as a flash memory card. Namely, the card 3130 may be a card meeting any industry standard for use with a consumer electronics device such as a digital camera, personal computer, etc. It will be appreciated that the memory controller 3020 may control the memory 3010 based on controls signals received by the card 3130 from another (e.g., external) device.

Figure 35:
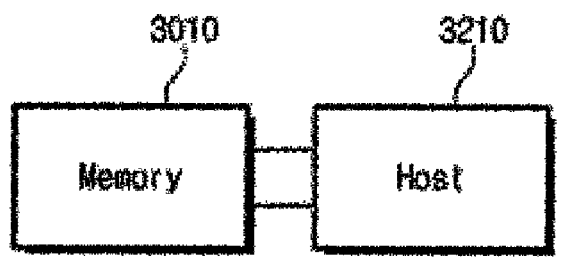

FIG. 35 illustrates a still further embodiment of the present invention. As shown, the memory 3010 may be connected with a host system 3210. The host system 3210 may be a processing system such as a personal computer, digital camera, etc. The host system 3210 may use the memory 3010 as a removable storage medium. As will be appreciated, the host system 3210 supplies the input signals for controlling operation of the memory 3010. For example, the host system 3210 supplies the command CMD and address signals.

Figure 36:
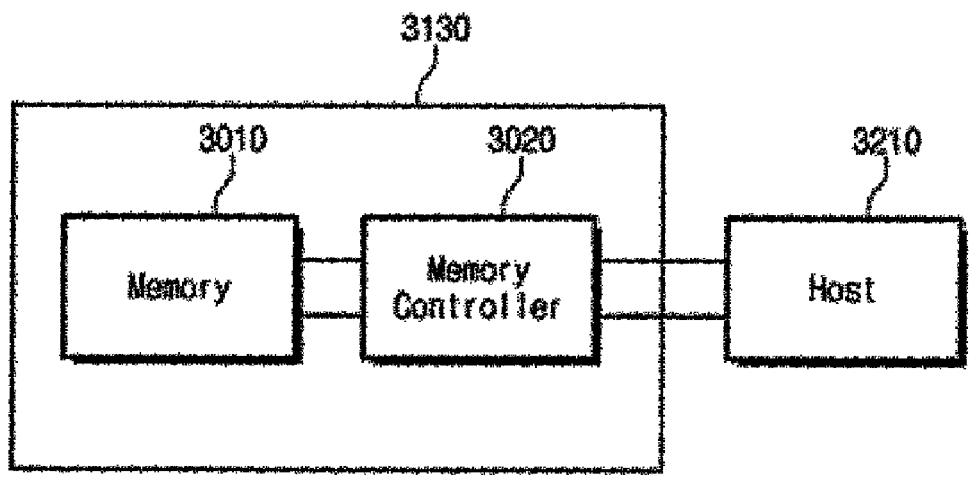

FIG. 36 illustrates an embodiment of the present invention in which the host system 3210 is connected to the card 3130. In this embodiment, the host system 3210 applies control signals to the card 3130 such that the memory controller 3020 controls operation of the memory 3010.

Figure 37:
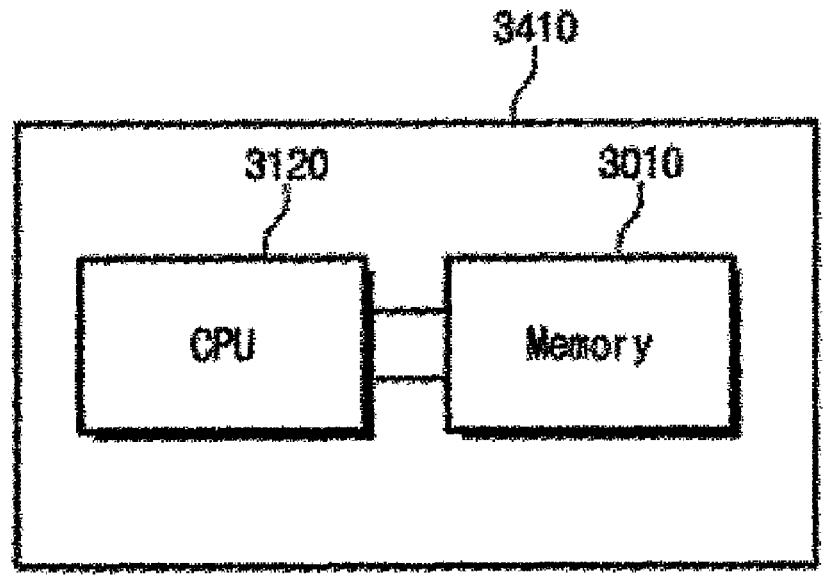

FIG. 37 illustrates a further embodiment of the present invention. As shown, the memory 3010 may be connected to a central processing unit (CPU) 3120 within a computer system 3410. For example, the computer system 3410 may be a personal computer, personal data assistant, etc. The memory 3010 may be directly connected with the CPU 3120, or connected via a bus, etc. It will be appreciated, that FIG. 37 does not illustrate the full complement of components that may be included within a computer system 3410 for the sake of clarity.

A semiconductor device according to some embodiments of the present invention may be used as a storage class memory (SCM), which is the general concept of memories capable of simultaneously providing nonvolatile characteristics and access characteristics. The storage class memory may be utilized as not only a data storage space but also a program performing space.

The above-described PRAM, FeRAM, and MRAM may be appropriate examples of a storage class memory. Such a storage class memory may be used as not only a data storage memory instead of a flash memory but also a main memory instead of an SRAM. Moreover, one storage class memory may be used instead of a flash memory and an SRAM.

Figure 38:
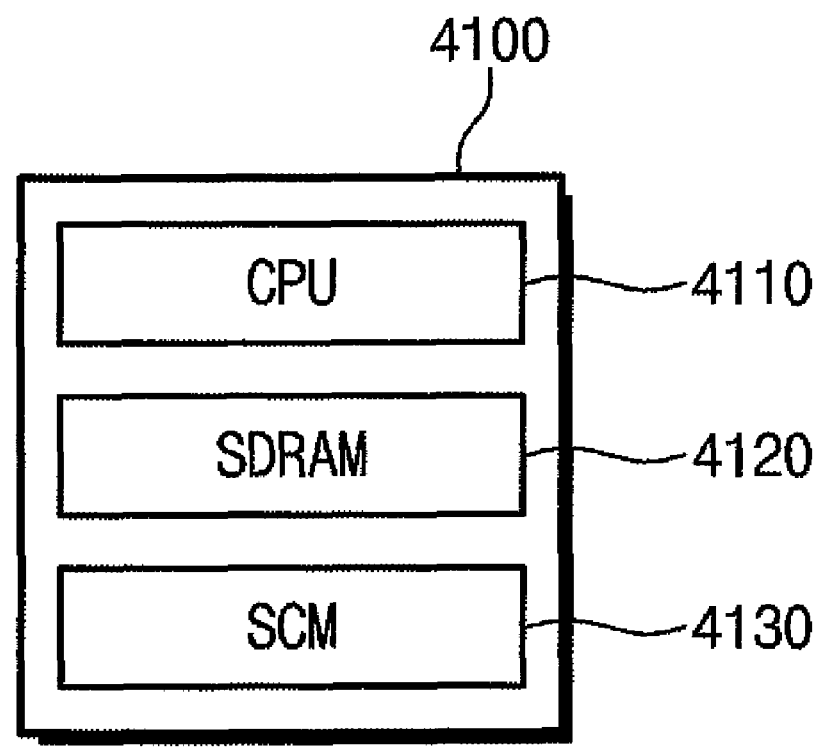

FIG. 38 illustrates an exemplary configuration of a memory system 4100 in which a storage class memory (SCM) is used instead of a flash memory. As illustrated, the memory system 4100 includes a CPU 4110, an SDRAM 4120, and an SCM 4130 used instead of a flash memory.

In the memory system 4100, data access speed of the SCM 4130 is higher than that of a flash memory. For example, under a PC environment where the CPU 4110 runs at 4 GHz, data access speed of a PRAM which is a kind of the SCM 4130 is about 32 times higher than that of a flash memory. Thus, the memory system 4100 equipped with the SCM 4130 may attain higher-speed access gain than a memory system equipped with a flash memory.

Figure 39:
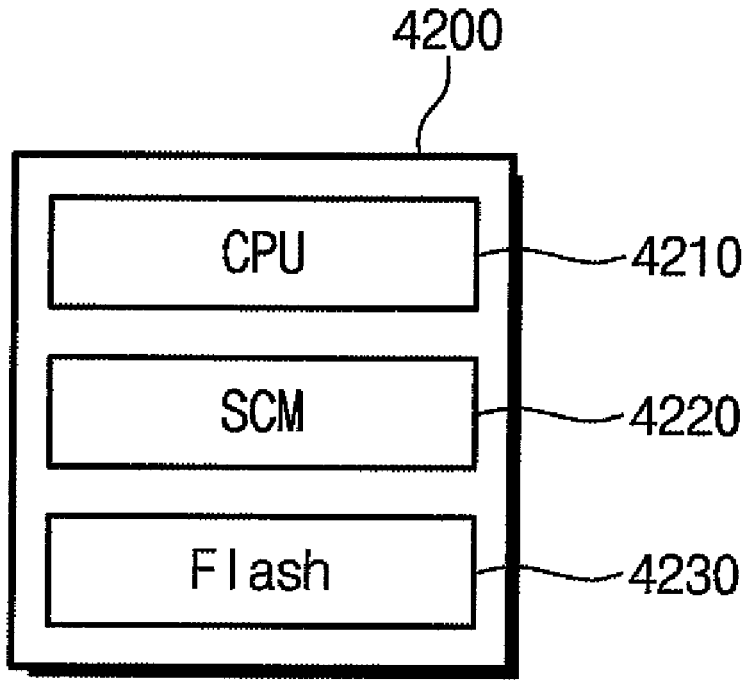

FIG. 39 illustrates an exemplary configuration of a memory system 4200 in which an SCM is used instead of an SDRAM. As illustrated, the memory system 4200 includes a CPU 4210, an SCM 4220, and a flash memory 4230. The SCM 4220 is used as a main memory instead of an SDRAM.

In the memory system 4200, power dissipation of the SCM 4220 is lower than that of an SDRAM. Energy dissipated by a main memory of a computer system amounts to about 40 percent of total energy. Therefore, many efforts have been intensively made to reduce power dissipation of a main memory. An SCM may reduce dynamic energy dissipation to an average of about 53 percent and reduce energy dissipation caused by power leakage to an average of about 73 percent. As a result, the memory system 4200 equipped with the SCM 4220 may allow power dissipation to be reduced more than a memory system equipped with an SDRAM.

Figure 40:
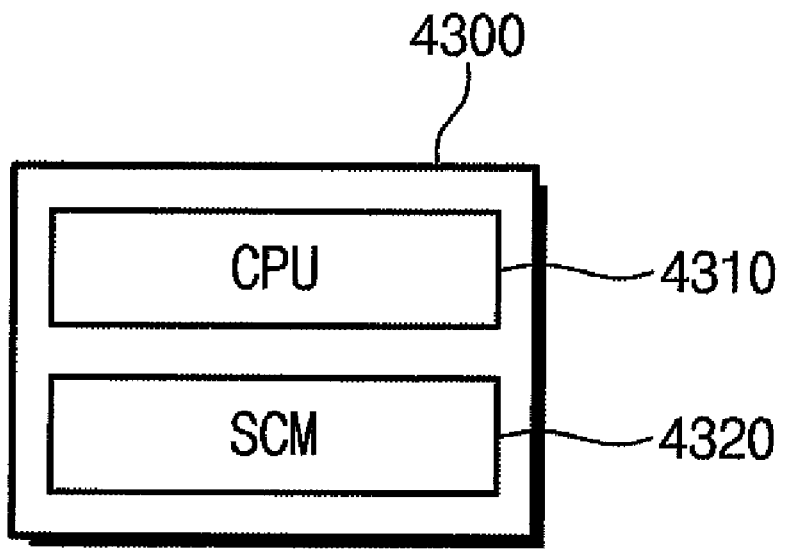

FIG. 40 illustrates an exemplary configuration of a memory system 4300 in which an SCM is substituted for an SDRAM as well as a flash memory. As illustrated, the memory system 4300 includes a CPU 4310 and an SCM 4320. The SCM 4320 is used as a main memory instated of an SDRAM and as a data storage memory instead of a flash memory. This memory system 4300 is advantageous in data access speed, low power, space utilization, and costs.

A variable resistance memory device according to an embodiment of the present invention can be applied to a server SSD. Examples of solid-state devices are disclosed in U.S Patent Application Publication Nos. 2008/0256292, 2008/0256183, and 2008/0168304, which are hereby incorporated by reference, and which disclose in FIG. 1A and the corresponding detailed description thereof a solid-state storage 110 including a PRAM, a flash, an MRAM, an NRAM, and a DRAM and a solid-state storage device 102 including a solid-state storage controller 104 and a solid-state storage 110. In addition, U.S Patent Application Publication Nos. 2008/0256292, 2008/0256183, and 2008/0168304, which are hereby incorporated by reference, further disclose a solid-state memory and a controller, which process the speed of a high-speed interface, and a redundant array of independent drives (RAIDs) in a solid-state device.

Meanwhile, U.S. Pat. No. 7,242,605, U.S Patent Application Publication Nos. 2007/0236987, 2008/0123389, and 2010/0027326, and U.S. patent application Ser. No. are hereby incorporated by reference and combined in the present specification.

While the present invention has been particularly shown and described with reference to exemplary embodiments thereof, it will be understood by those of ordinary skill in the art that various changes in form and detail may be made therein without departing from the spirit and scope of the present invention as defined by the following claims. Therefore, it is to be understood that the above-described embodiments have been provided only in a descriptive sense, and should not be construed as placing any limitation on the scope of the invention.

What is claimed is:

1. A variable resistance memory device comprising:
a memory cell array comprising a plurality of resistance memory cells, the memory cell array being divided into a first area and a second area which are different from each other;
a temperature compensation circuit comprising one or more reference cells;
a data read circuit performing a read operation by supplying a current, which changes according to the resistance of the reference cells, to one or more of the resistance memory cells; and
a write circuit examining data provided by an external source and writing the data to the first area or the second area based on the examination result,
wherein the first area has a shorter response time and a faster access time than the second area.

2. The variable resistance memory device of claim 1, wherein the data provided by the external source comprises a code, which indicates whether the data should be stored in the first area or the second area, in a data header.

3. A variable resistance memory device comprising:
a memory cell array comprising a plurality of resistance memory cells, the memory cell array being divided into a first area and a second area which are different from each other;
a temperature compensation circuit comprising one or more reference cells; and
a data read circuit performing a read operation by supplying a current, which changes according to the resistance of the reference cells, to one or more of the resistance memory cells,
wherein the first area has a shorter response time and a faster access time than the second area, and
wherein the memory cell array is divided into a plurality of memory banks, each being divided into a plurality of memory blocks, and wherein the reference cells are disposed in each memory bank or each memory block.

4. A variable resistance memory device comprising:
a memory cell array comprising a plurality of resistance memory cells, the memory cell array being divided into a first area and a second area which are different from each other;
a temperature compensation circuit comprising one or more reference cells;
a data read circuit performing a read operation by supplying a current, which changes according to the resistance of the reference cells, to one or more of the resistance memory cells;
a global bit line connected to a write circuit and a read circuit;
one or more local bit lines coupled to resistance memory cells which are disposed in the second area; and
a plurality of column select transistors, each selectively connecting the global bit line to any one of the local bit lines,
wherein the first area has a shorter response time and a faster access time than the second area.

5. The variable resistance memory device of claim 4, wherein the resistance of a column select transistor located farther from the write circuit and the read circuit is smaller than that of a column select transistor located closer to the write circuit and the read circuit.

6. The variable resistance memory device of claim 5, wherein the column select transistor located farther from the write circuit and the read circuit is larger than the column select transistor located closer to the write circuit and the read circuit.

7. The variable resistance memory device of claim 5, wherein a doping concentration of a channel region of the column select transistor located farther from the write circuit and the read circuit is higher than that of a channel region of a column select transistor located closer to the write circuit and/or the read circuit.

8. A memory system comprising:
a variable resistance memory device; and
a memory controller accessing the variable resistance memory device in response to an external command,
wherein the variable resistance memory device comprises:
a memory cell array comprising a plurality of resistance memory cells and being divided into a first area and a second area;
a temperature compensation circuit comprising one or more reference cells;
a data read circuit performing a read operation by supplying a current, which changes according to the resistance of the reference cells, to one or more of the resistance memory cells; and
a write circuit examining data provided by an external source and writing the data to the first area or the second area based on the examination result,
wherein the first area has a shorter response time and a faster access time than the second area.

* * * * *